US009853090B2

(12) United States Patent
Konevecki et al.

(10) Patent No.: US 9,853,090 B2
(45) Date of Patent: *Dec. 26, 2017

(54) VERTICAL BIT LINE NON-VOLATILE MEMORY SYSTEMS AND METHODS OF FABRICATION

(71) Applicant: SanDisk Technologies LLC, Plano, TX (US)

(72) Inventors: Michael Konevecki, San Jose, CA (US); Steve Radigan, Fremont, CA (US); Vance Dunton, San Jose, CA (US); Natalie Nguyen, Milpitas, CA (US); Luke Zhang, Milpitas, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/379,991

(22) Filed: Dec. 15, 2016

(65) Prior Publication Data

US 2017/0098685 A1    Apr. 6, 2017

Related U.S. Application Data

(60) Continuation of application No. 14/938,637, filed on Nov. 11, 2015, now Pat. No. 9,558,949, which is a
(Continued)

(51) Int. Cl.
  *H01L 27/24* (2006.01)
  *H01L 45/00* (2006.01)

(52) U.S. Cl.
  CPC ........ *H01L 27/2454* (2013.01); *H01L 27/249* (2013.01); *H01L 45/124* (2013.01); *H01L 45/141* (2013.01); *H01L 45/145* (2013.01)

(58) Field of Classification Search
  None
  See application file for complete search history.

(56) References Cited

U.S. PATENT DOCUMENTS

| 4,370,661 A | 1/1983 | Berkowitz |
| 5,313,432 A | 5/1994 | Liu |

(Continued)

FOREIGN PATENT DOCUMENTS

| WO | WO2008/118435 A1 | 10/2008 |
| WO | WO2010/117912 A1 | 10/2010 |

(Continued)

OTHER PUBLICATIONS

Hung et al., "A Highly Scalable Vertical Gate (VG) 3D NAND Flash with Robust Program Disturb Immunity Using a Novel PN Diode Decoding Structure," 2011 Symposium on VLSI Technology Digest of Technical Papers, Jun. 2011, pp. 68-69, 2 pages.

(Continued)

*Primary Examiner* — Khaja Ahmad
(74) *Attorney, Agent, or Firm* — Vierra Magen Marcus LLP

(57) ABSTRACT

Three-dimensional (3D) non-volatile memory arrays having a vertically-oriented thin film transistor (TFT) select device and methods of fabricating such a memory are described. The vertically-oriented TFT may be used as a vertical bit line selection device to couple a global bit line to a vertical bit line. A select device pillar includes a body and upper and lower source/drain regions. At least one gate is separated horizontally from the select device pillar by a gate dielectric. The gates overlie the global bit lines with one or more insulating layers therebetween to provide adequate isolation between the gates and the global bit lines. Processes for fabricating the vertical TFT select devices utilize a gate
(Continued)

dielectric and optional dielectric bases to provide isolation between the gates and bit lines.

17 Claims, 47 Drawing Sheets

Related U.S. Application Data division of application No. 14/196,904, filed on Mar. 4, 2014, now Pat. No. 9,202,694.

(60) Provisional application No. 61/772,256, filed on Mar. 4, 2013.

(56) References Cited

U.S. PATENT DOCUMENTS

| | | | |
|---|---|---|---|
| 5,442,215 A | 8/1995 | Chae | |
| 5,915,167 A | 6/1999 | Leedy | |
| 5,936,896 A | 8/1999 | Cho | |
| 6,049,106 A * | 4/2000 | Forbes | H01L 29/78642 |
| | | | 257/329 |
| 6,141,236 A | 10/2000 | Kengeri | |
| 6,222,762 B1 | 4/2001 | Guterman | |
| 6,310,793 B1 | 10/2001 | Brox | |
| 6,388,927 B1 | 5/2002 | Churchill | |
| 6,399,447 B1 | 6/2002 | Clevenger | |
| 6,459,123 B1 | 10/2002 | Enders | |
| 6,480,417 B2 | 11/2002 | Elmhurst | |
| 6,492,212 B1 | 12/2002 | Ieong | |
| 6,538,922 B1 | 3/2003 | Khalid et al. | |
| 6,542,431 B2 | 4/2003 | Nakagawa | |
| 6,569,715 B1 | 5/2003 | Forbes | |
| 6,610,576 B2 | 8/2003 | Nowak | |
| 6,617,180 B1 | 9/2003 | Wang | |
| 6,678,192 B2 | 1/2004 | Gongwer | |
| 6,750,487 B2 | 6/2004 | Fried | |
| 6,841,834 B2 | 1/2005 | Nowak | |
| 6,879,505 B2 | 4/2005 | Scheuerlein | |
| 6,930,324 B2 | 8/2005 | Kowalski | |
| 7,019,342 B2 | 3/2006 | Hackler, Sr. | |
| 7,101,741 B2 | 9/2006 | Fried | |
| 7,130,239 B2 | 10/2006 | Lakhani | |
| 7,132,685 B2 | 11/2006 | Chen | |
| 7,184,302 B2 | 2/2007 | Yang | |
| 7,233,024 B2 | 6/2007 | Scheuerlein | |
| 7,237,074 B2 | 6/2007 | Guterman | |
| 7,249,225 B1 | 7/2007 | Seidl | |
| 7,256,458 B2 | 8/2007 | Nowak | |
| 7,324,393 B2 | 1/2008 | Chan et al. | |
| 7,468,906 B2 | 12/2008 | Kuo | |
| 7,486,587 B2 | 2/2009 | Scheuerlein | |
| 7,489,002 B2 | 2/2009 | Forbes et al. | |
| 7,518,182 B2 | 4/2009 | Abbott et al. | |
| 7,558,141 B2 | 7/2009 | Katsumata et al. | |
| 7,588,971 B2 | 9/2009 | Wang et al. | |
| 7,613,868 B2 | 11/2009 | Yang | |
| 7,634,744 B2 | 12/2009 | Sumimoto | |
| 7,645,650 B2 | 1/2010 | Bryant | |
| 7,768,013 B2 | 8/2010 | Kim et al. | |
| 7,830,713 B2 | 11/2010 | Lee | |
| 7,869,258 B2 | 1/2011 | Scheuerlein | |
| 7,952,163 B2 | 5/2011 | Baek | |
| 7,983,065 B2 | 7/2011 | Samachisa | |
| 8,003,457 B2 | 8/2011 | Chen | |
| 8,027,209 B2 | 9/2011 | Yan | |
| 8,199,576 B2 | 6/2012 | Fasoli et al. | |
| 8,411,477 B2 | 4/2013 | Tang et al. | |
| 8,618,614 B2 | 12/2013 | Scheuerlein | |
| 8,885,389 B2 | 11/2014 | Scheuerlein | |
| 8,947,944 B2 | 2/2015 | Balakrishnan et al. | |
| 9,099,202 B2 | 8/2015 | Mihnea et al. | |
| 2003/0003611 A1 | 1/2003 | Weiner | |
| 2003/0206481 A1 | 11/2003 | Hsu | |
| 2004/0014278 A1 | 1/2004 | Lee | |
| 2004/0151024 A1 | 8/2004 | Fricke | |
| 2004/0159868 A1 | 8/2004 | Rimerson | |
| 2004/0178446 A1 | 9/2004 | Sundaresan | |
| 2005/0022264 A1 | 1/2005 | Fanger | |
| 2006/0145144 A1 | 7/2006 | Lee et al. | |
| 2006/0197153 A1 | 9/2006 | Huang et al. | |
| 2006/0250837 A1 | 11/2006 | Herner | |
| 2006/0273370 A1 | 12/2006 | Forbes | |
| 2007/0083679 A1 | 4/2007 | Kikuchi | |
| 2007/0133268 A1 | 6/2007 | Choi | |
| 2008/0002461 A1 | 1/2008 | Rimerson | |
| 2008/0089127 A1 | 4/2008 | Mokhlesi | |
| 2008/0175032 A1 | 4/2008 | Mokhlesi | |
| 2009/0141547 A1 | 6/2009 | Jin | |
| 2009/0168503 A1 | 7/2009 | Fackenthal | |
| 2009/0168523 A1 | 7/2009 | Shirakawa | |
| 2009/0273054 A1 | 11/2009 | Kim | |
| 2010/0027316 A1 | 2/2010 | Yoon | |
| 2010/0046267 A1 | 2/2010 | Yan | |
| 2010/0072445 A1 | 3/2010 | Schricker et al. | |
| 2010/0085098 A1 | 4/2010 | Ferguson | |
| 2010/0155858 A1 | 6/2010 | Chen | |
| 2010/0259961 A1 | 10/2010 | Fasoli | |
| 2010/0259962 A1 | 10/2010 | Yan | |
| 2011/0147806 A1 | 6/2011 | Wilson | |
| 2011/0297912 A1 | 12/2011 | Samachisa et al. | |
| 2011/0305074 A1 * | 12/2011 | Lung | H01L 27/2445 |
| | | | 365/163 |
| 2012/0147644 A1 | 6/2012 | Scheuerlein | |
| 2012/0147648 A1 | 6/2012 | Scheuerlein | |
| 2012/0147649 A1 | 6/2012 | Samachisa | |
| 2012/0147650 A1 | 6/2012 | Samachisa | |
| 2012/0182807 A1 | 7/2012 | Lue | |
| 2012/0228712 A1 | 9/2012 | Jeong et al. | |
| 2013/0126821 A1 | 5/2013 | Sekar et al. | |
| 2013/0148400 A1 * | 6/2013 | Murooka | G11O 5/06 |
| | | | 365/63 |
| 2013/0272069 A1 | 10/2013 | Rabkin et al. | |
| 2013/0308363 A1 | 11/2013 | Scheuerlein et al. | |
| 2013/0322174 A1 | 12/2013 | Li et al. | |
| 2014/0048791 A1 | 2/2014 | Nojiri et al. | |
| 2014/0248763 A1 | 9/2014 | Konevecki et al. | |
| 2014/0252454 A1 | 9/2014 | Rabkin et al. | |
| 2015/0249112 A1 | 9/2015 | Takeguchi et al. | |
| 2015/0255619 A1 | 9/2015 | Shimabukuro | |
| 2016/0064222 A1 | 3/2016 | Konevecki et al. | |

FOREIGN PATENT DOCUMENTS

| | | |
|---|---|---|
| WO | WO2012/082770 A1 | 6/2012 |
| WO | WO2012/082775 A1 | 6/2012 |

OTHER PUBLICATIONS

Kalkofen et al., "A simple two-step phosphorus doping process for shallow junctions by applying a controlled adsorption and diffusion in an oxidising ambient," Materials Science and Engineering, Symposium B, Dec. 2004, pp. 362-366, vols. 114-115, Elsevier B.V., 5 pages.

Mazzocchi et al., "Boron and Phosphorus dopant activation in germanium using Laser annealing with and without preamorphization implant," 17th IEEE International Conference on Advanced Thermal Processing of Semiconductors, RTP 2009, Sep. 29-Oct. 2, 2009, 5 pages.

Paviet-Salomon et al., "Experimental and analytical study of saturation current density of laser-doped phosphorus emitters for silicon solar cells," Solar Energy Materials & Solar Cells, Aug. 2011, pp. 2536-2539, vol. 95, Issue 8, Elsevier B.V., 4 pages.

International Search Report & the Written Opinion of the International Searching Authority dated Jun. 26, 2014, International Application No. PCT/US2014/020416.

Restriction Requirement dated Nov. 12, 2014, U.S. Appl. No. 14/196,904, filed Mar. 4, 2014.

Response to Restriction Requirement dated Jan. 9, 2015, U.S. Appl. No. 14/196,904, filed Mar. 4, 2014.

(56) References Cited

OTHER PUBLICATIONS

Non-final Office Action dated Feb. 3, 2015, U.S. Appl. No. 14/196,904, filed Mar. 4, 2014.
Response to Office Action dated May 4, 2015, U.S. Appl. No. 14/196,904, filed Mar. 4, 2014.
Notice of Allowance dated Jul. 17, 2015, U.S. Appl. No. 14/196,906, filed Mar. 4, 2014.
Non-final Office Action dated Apr. 22, 2016, U.S. Appl. No. 14/938,637, filed Nov. 11, 2015.
Response to Office Action dated Jul. 22, 2016, U.S. Appl. No. 14/938,637, filed Nov. 11, 2015.
Notice of Allowance dated Sep. 21, 2016, U.S. Appl. No. 14/938,637, filed Nov. 11, 2015.

* cited by examiner

Programming

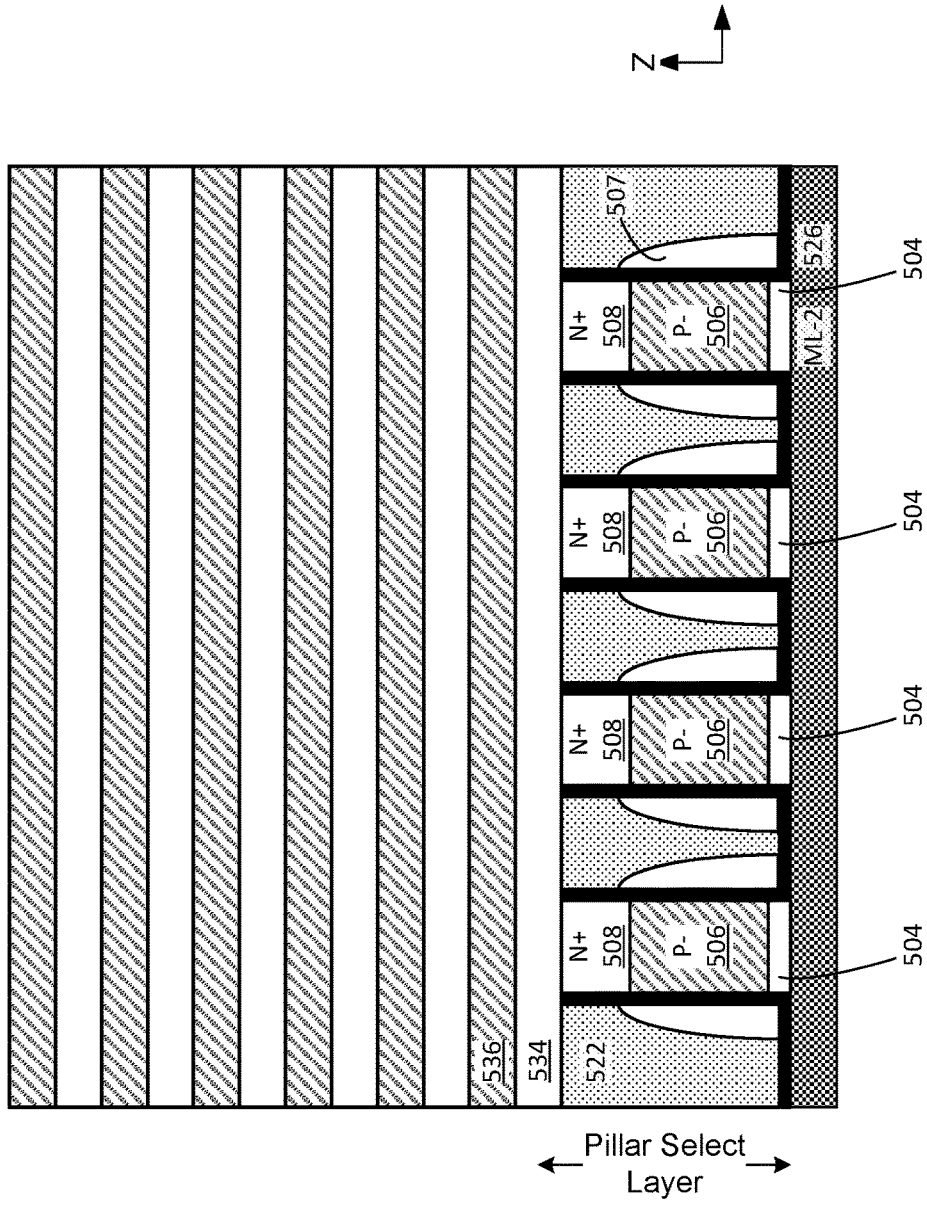

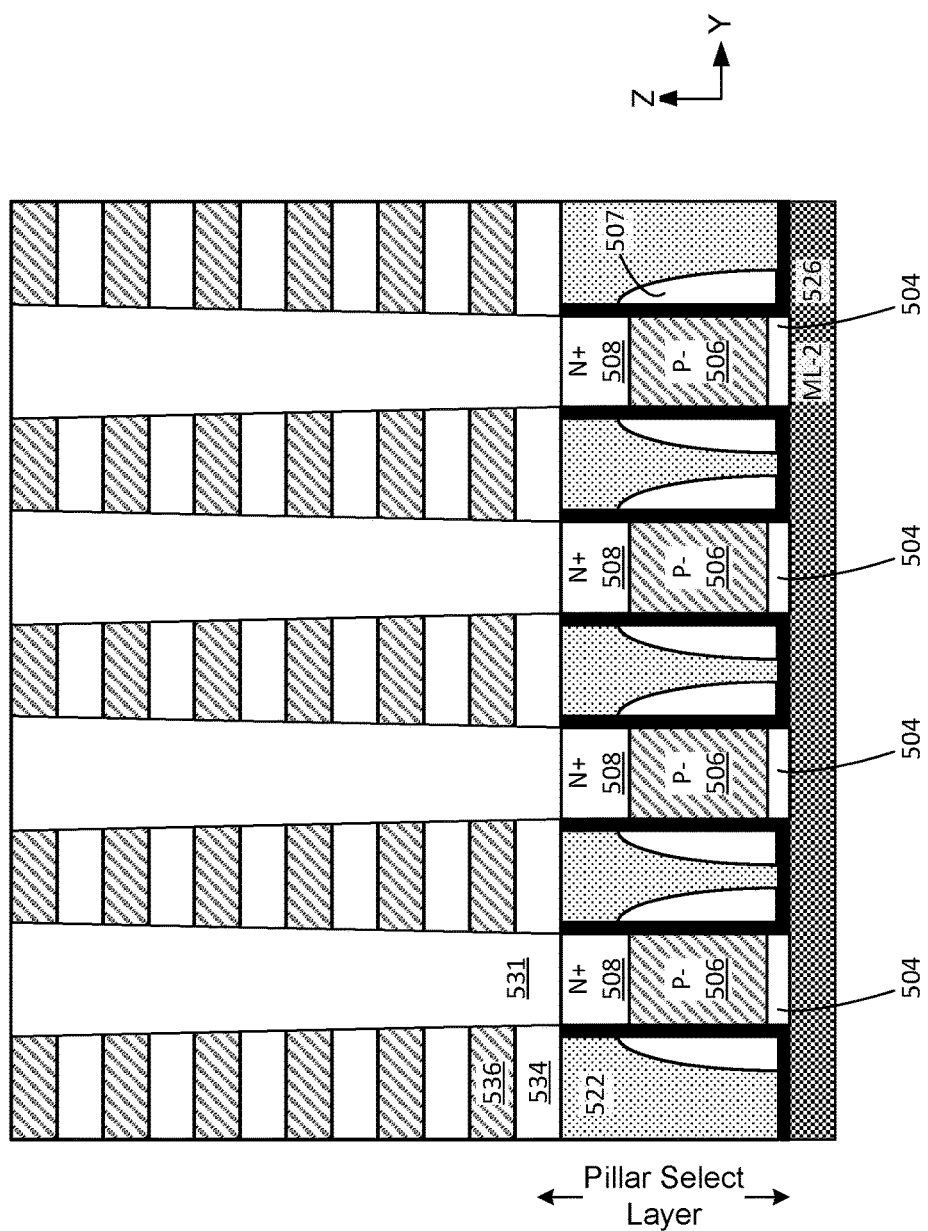

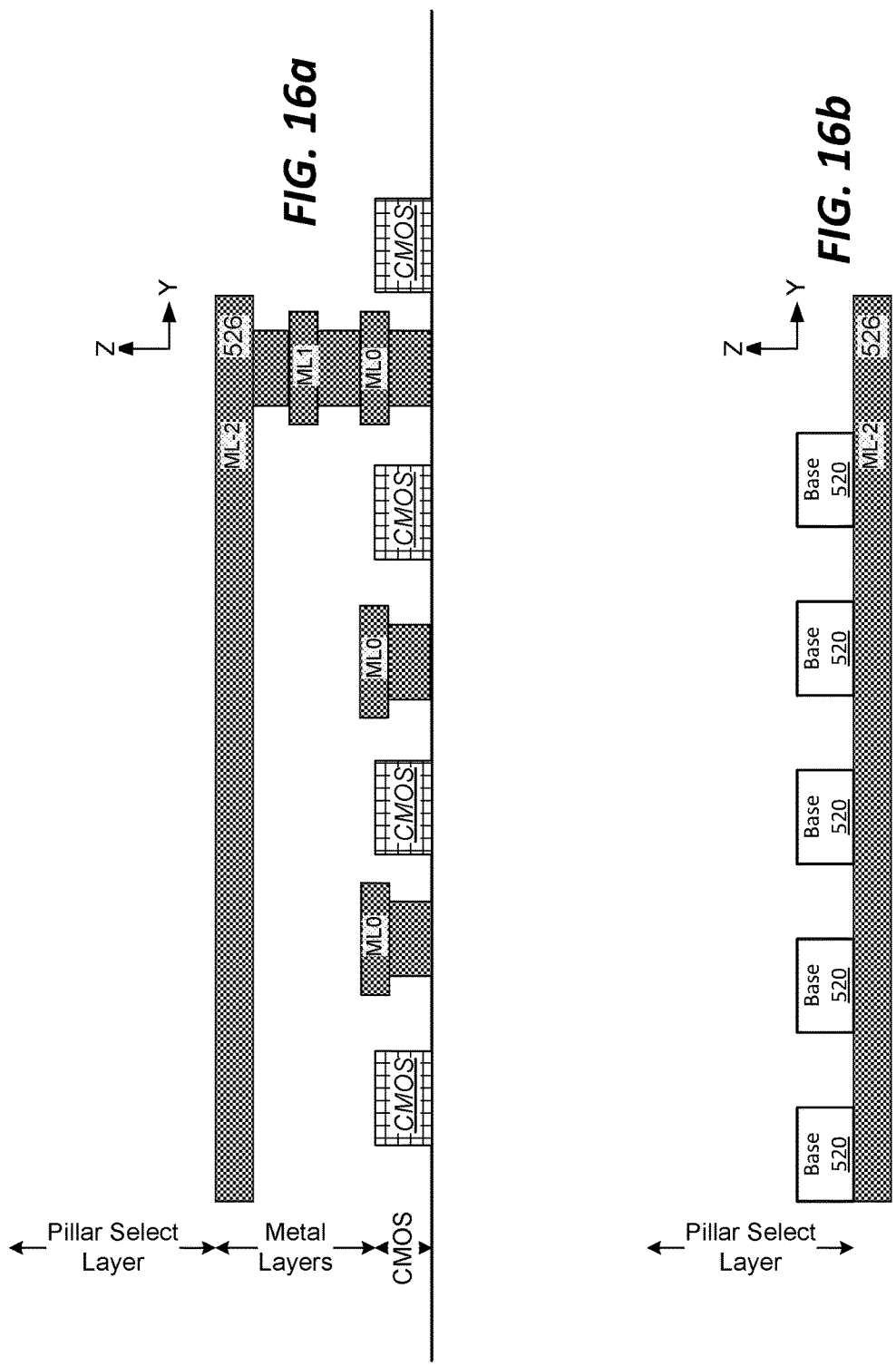

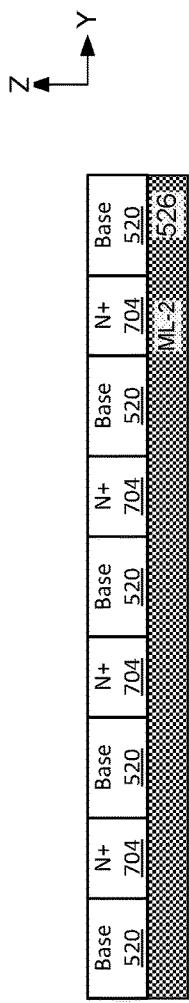
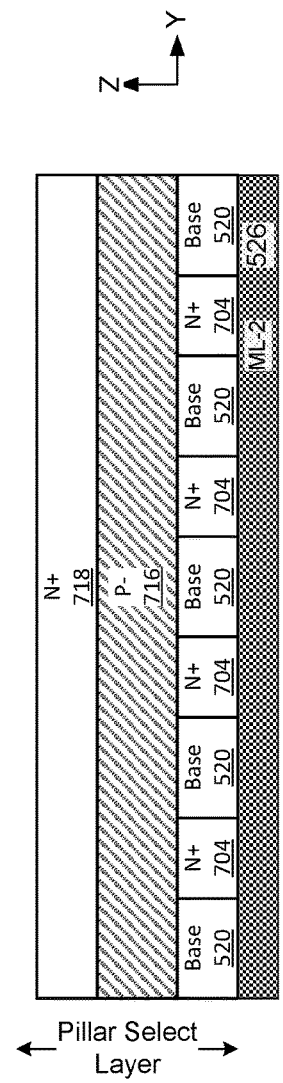
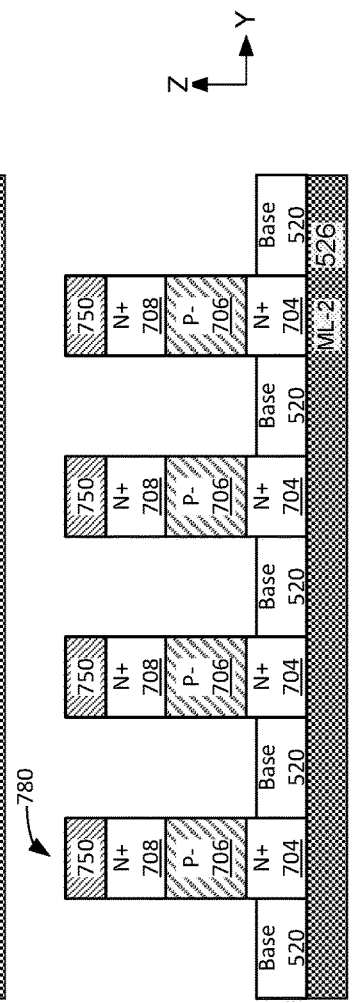

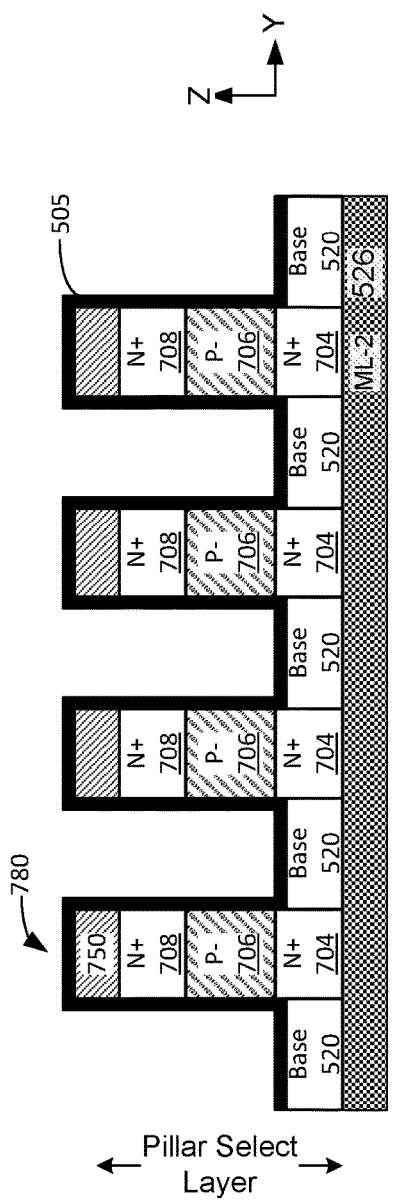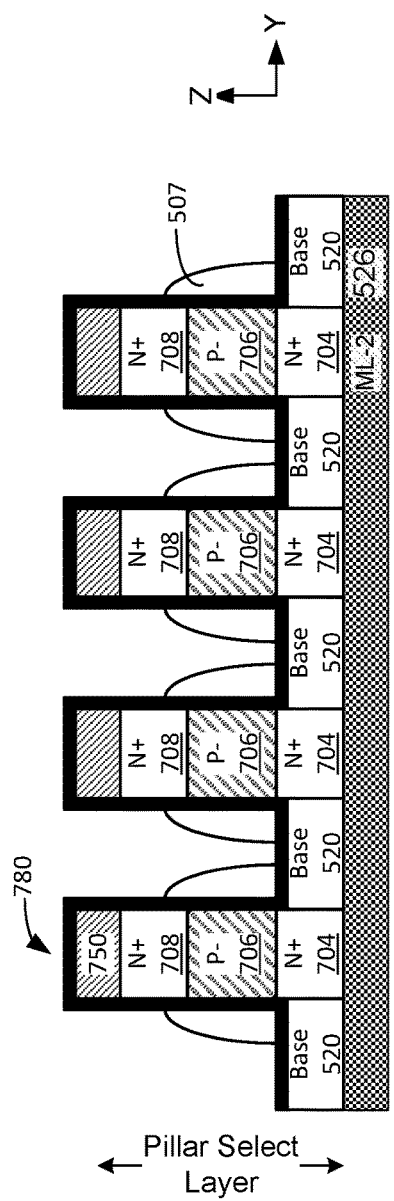

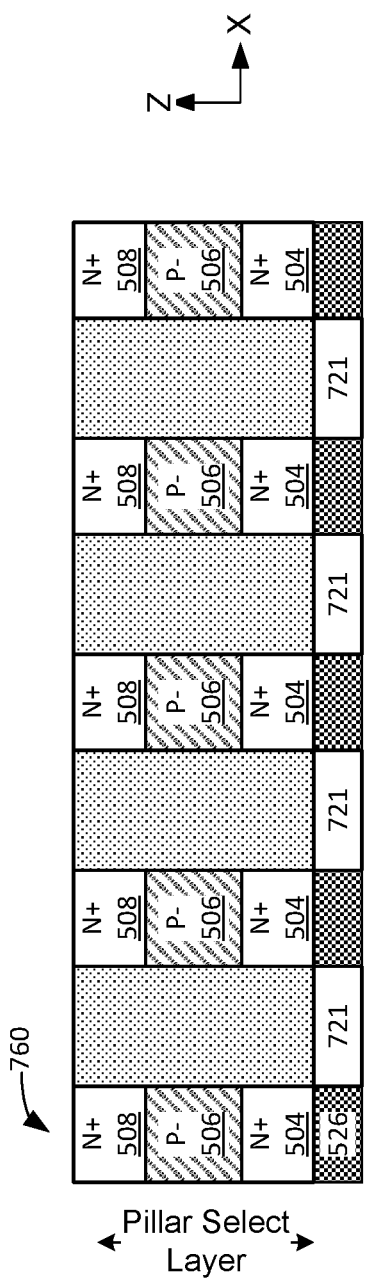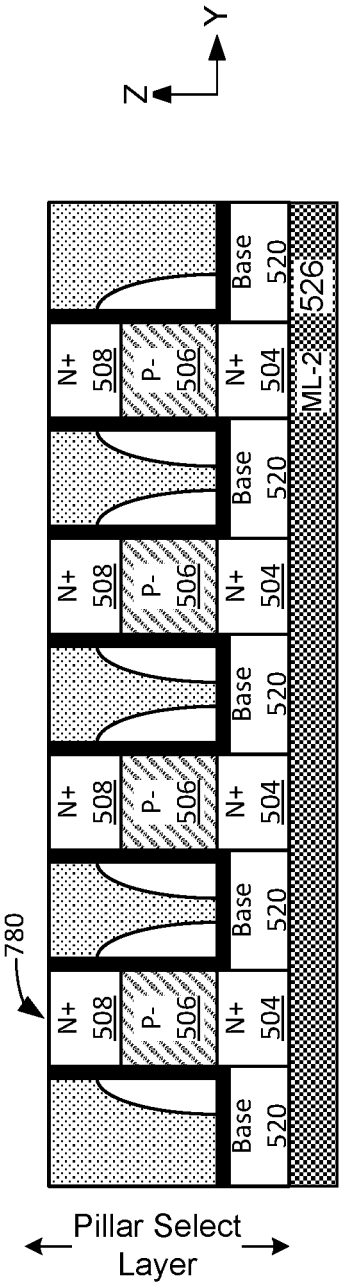
FIG. 16j
FIG. 16k

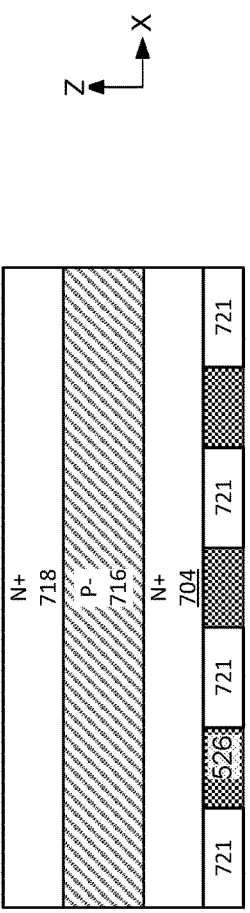
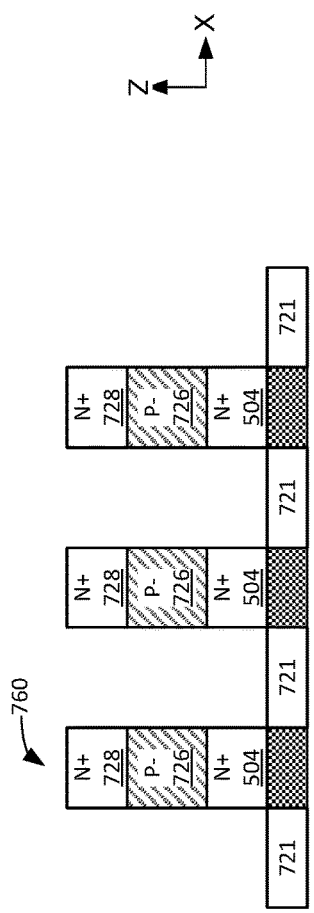
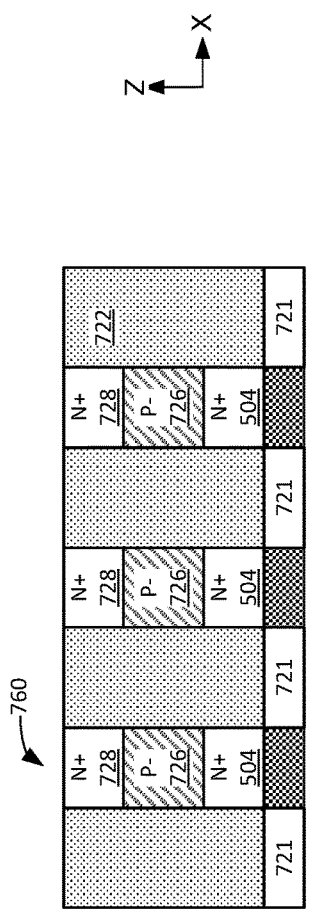

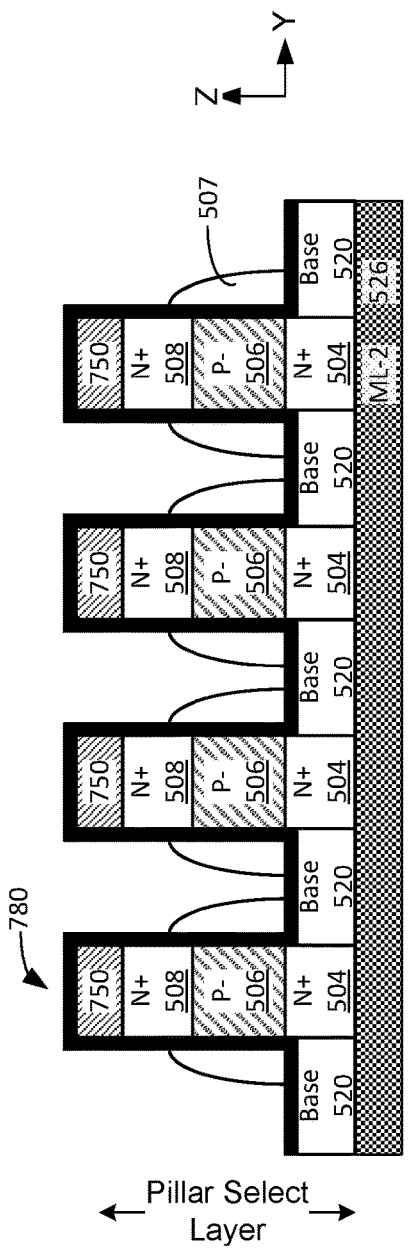
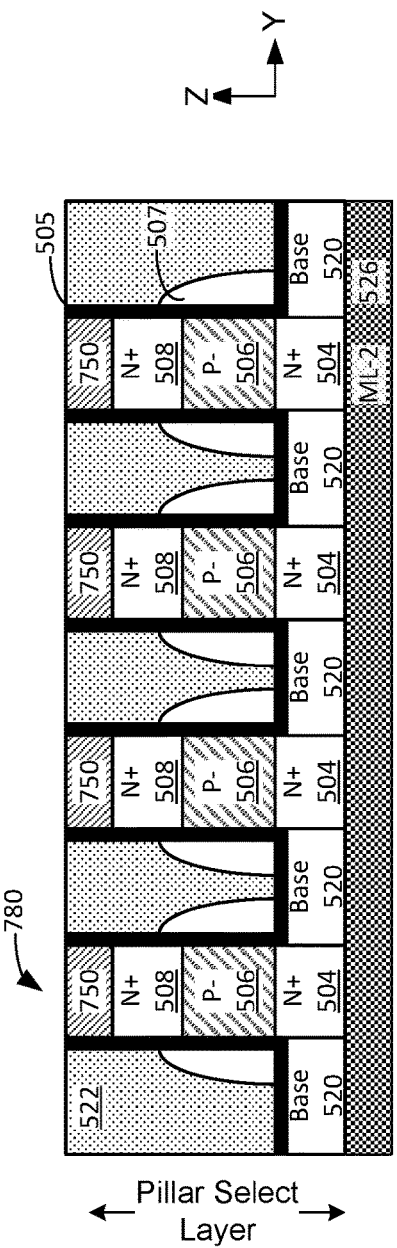

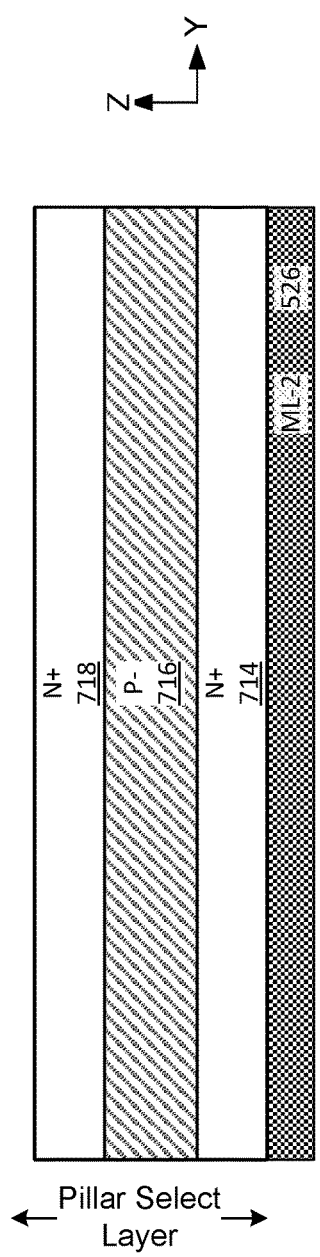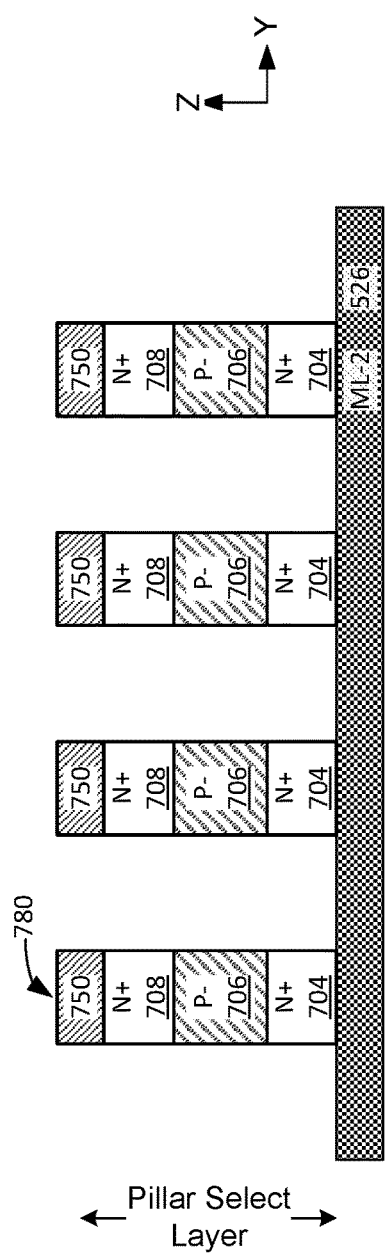

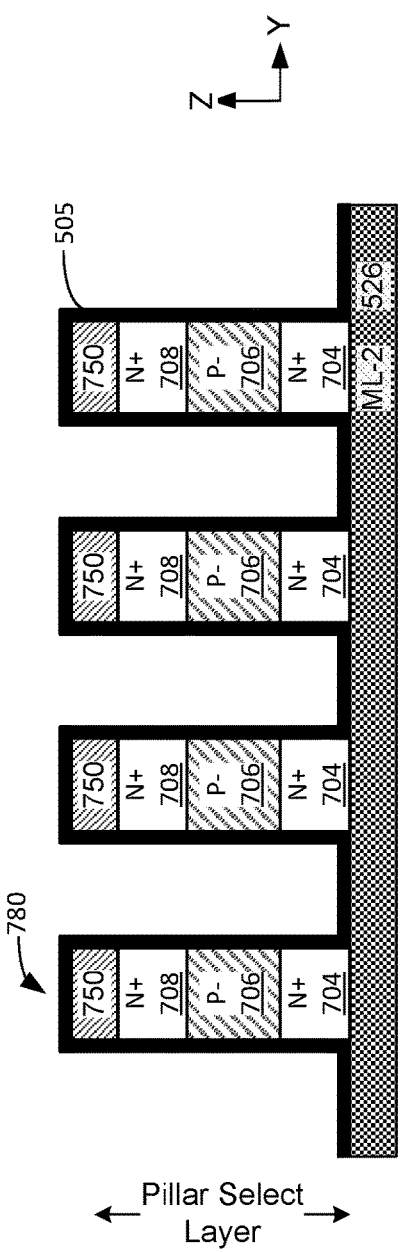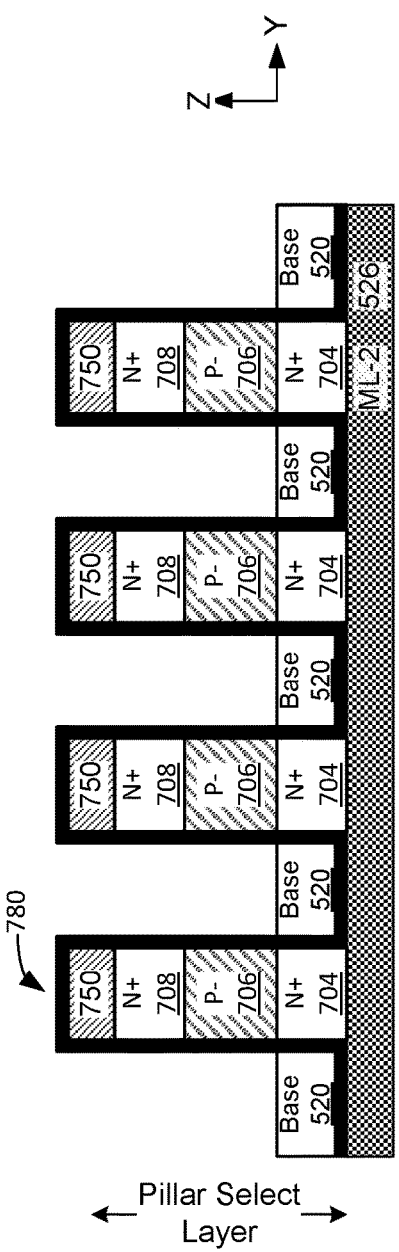

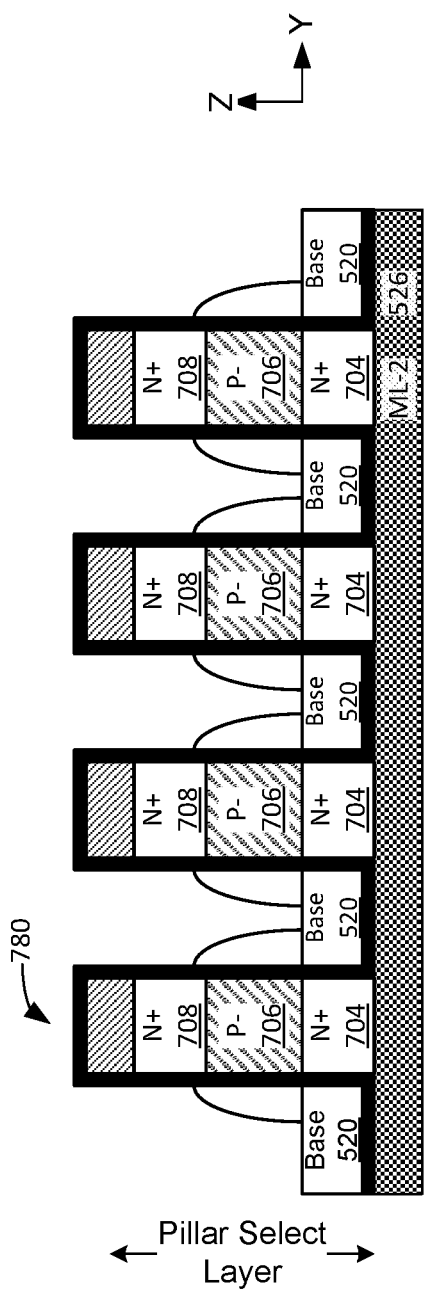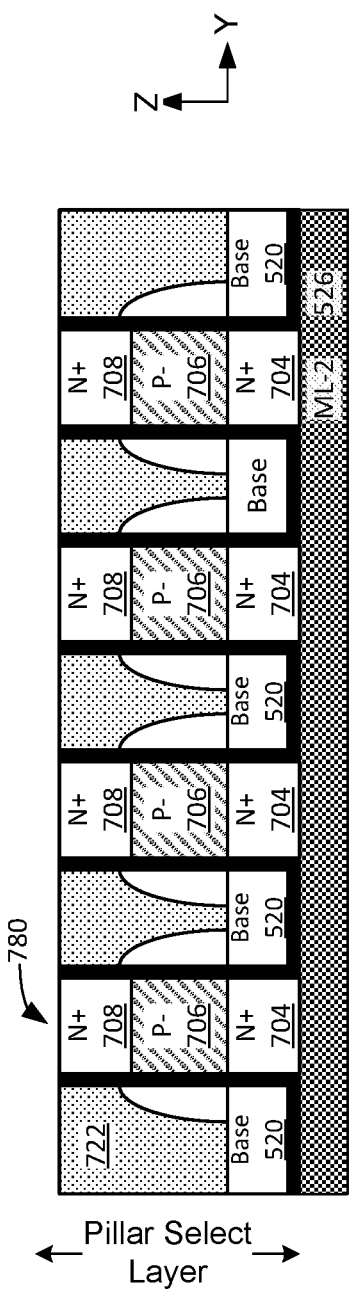

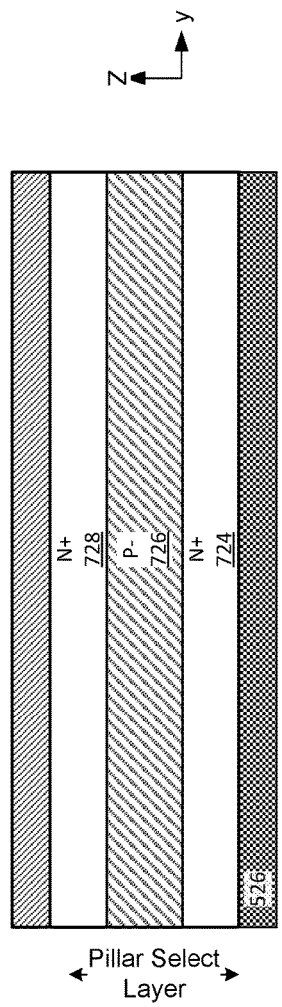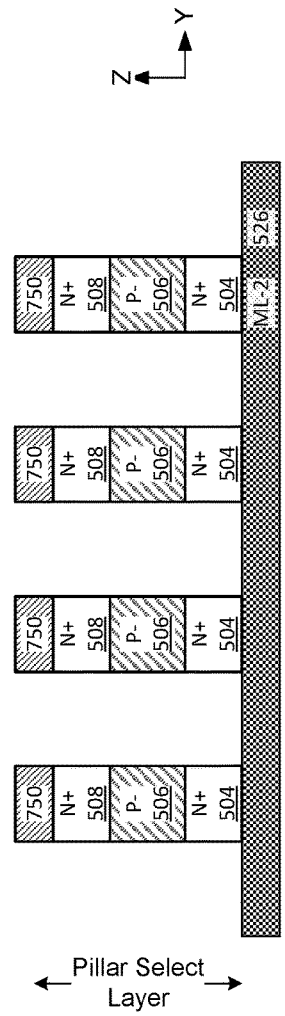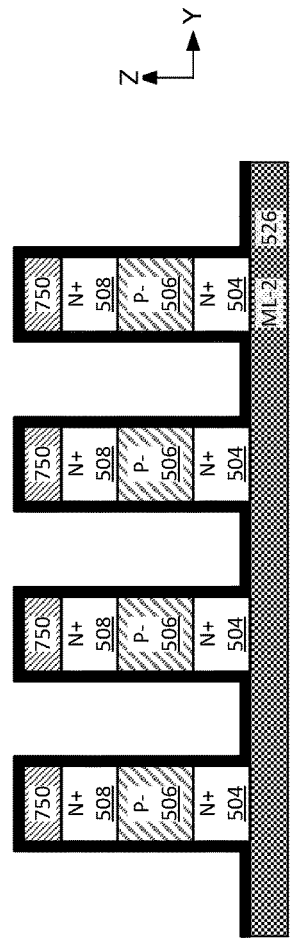

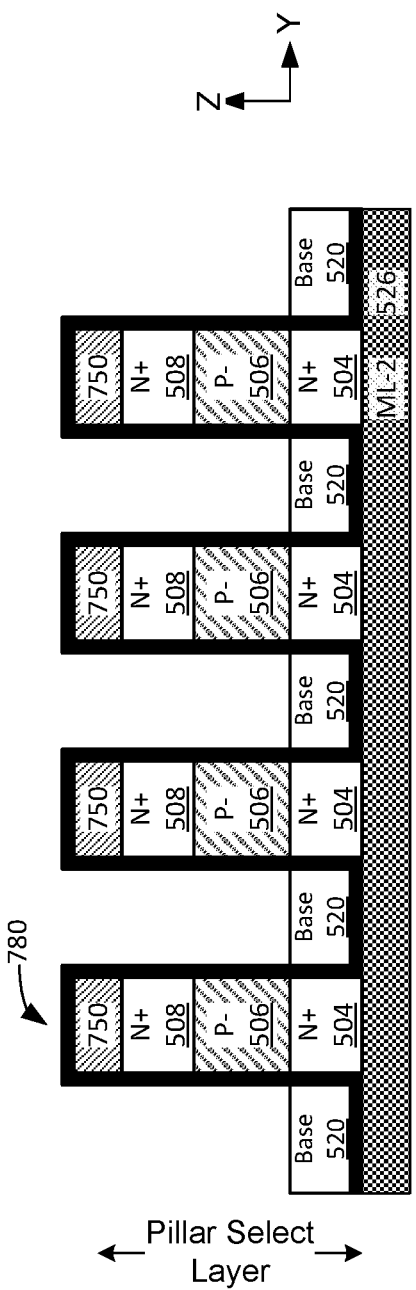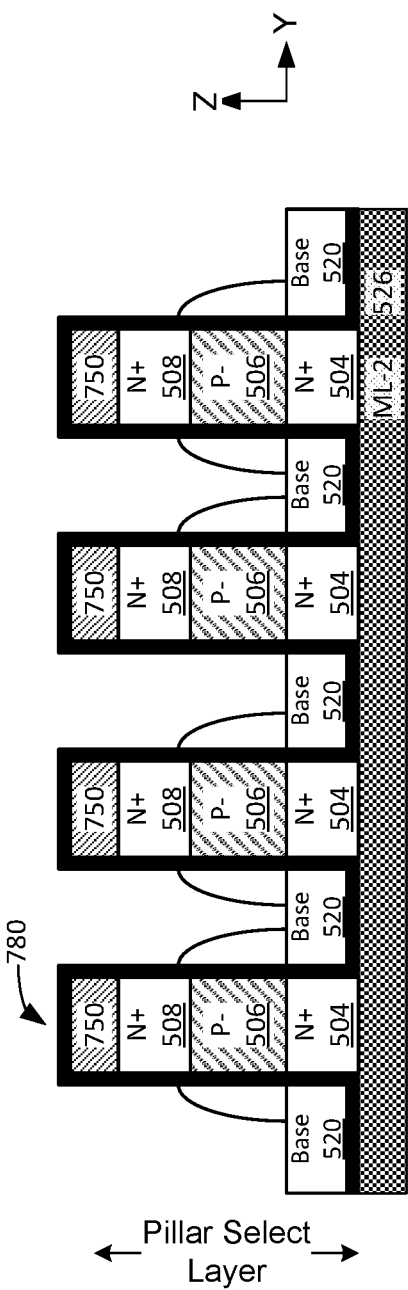

VERTICAL BIT LINE NON-VOLATILE
MEMORY SYSTEMS AND METHODS OF
FABRICATION

CLAIM OF PRIORITY

The present application is a continuation of U.S. patent application Ser. No. 14/938,637, entitled "Vertical Bit Line Non-Volatile Memory Systems and Methods of Fabrication," by Konevecki et al., filed Nov. 11, 2015, published as U.S. 2016/0064222 on Mar. 3, 2016 and issued as U.S. Pat. No. 9,558,949 on Jan. 31, 2017, which is a divisional application of U.S. patent application Ser. No. 14/196,904, entitled "Vertical Bit Line Non-Volatile Memory Systems And Methods of Fabrication," by Konevecki et al., filed Mar. 4, 2014, published as U.S. 2014/0248763 on Sep. 4, 2014 and issued as U.S. Pat. No. 9,202,694 on Dec. 1, 2015, which claims priority from U.S. Provisional Patent Application No. 61/772,256, entitled "Process Flow to Realize a Vertical Bit Line ReRem Memory," by Konevecki et al., filed Mar. 4, 2013, all of which are incorporated by reference herein in their entirety.

BACKGROUND OF THE INVENTION

The present disclosure relates to technology for non-volatile storage.

One example of non-volatile memory uses variable resistance memory elements that may be set to either low or high resistance states. Upon application of sufficient voltage, current, or other stimulus, the variable resistance memory element switches to a stable low-resistance state, which is sometimes referred to as SETTING the device. This resistivity-switching is reversible such that subsequent application of an appropriate voltage, current, or other stimulus can serve to return the reversible resistivity-switching material to a stable high-resistance state, which is sometimes referred to as RESETTING the device. This conversion can be repeated many times.

The variable resistance memory elements may be in a high resistance state when first manufactured. This may be referred to as the "virgin state." In the virgin state, the resistance could be even higher than for the RESET state. The term "FORMING" is sometimes used to describe putting the variable resistance memory elements into a lower resistance state for the first time. For some memory elements, the FORMING operation requires a higher voltage than the SET and/or RESET operations.

3D memory arrays having variable resistance memory elements have been proposed. In one possible architecture, word lines extend horizontally and bit lines extend vertically. There a multiple levels of the word lines, hence multiple levels of memory elements. Each memory element is located between one of the vertical bit lines and one of the horizontal word lines. During operation, some of the memory cells are selected for the SET, RESET, or FORM operation, while others are unselected.

BRIEF DESCRIPTION OF THE DRAWINGS

FIGS. 14a-14g are perspective and cross-sectional views depicting a pillar select layer and memory layer fabricated according to the process of FIG. 13 in one example.

FIGS. 16a-16k are cross-sectional views depicting a pillar select layer and fabricated according to the process of FIG. 15 in one example.

FIGS. 18a-18g are cross-sectional views depicting a pillar select layer and fabricated according to the process of FIG. 17 in one example.

FIGS. 20a-20h are perspective and cross-sectional views depicting a pillar select layer and fabricated according to the process of FIG. 19 in one example.

FIGS. 22a-22i are perspective and cross-sectional views depicting a pillar select layer and fabricated according to the process of FIG. 21 in one example.

DETAILED DESCRIPTION

Figure 1:
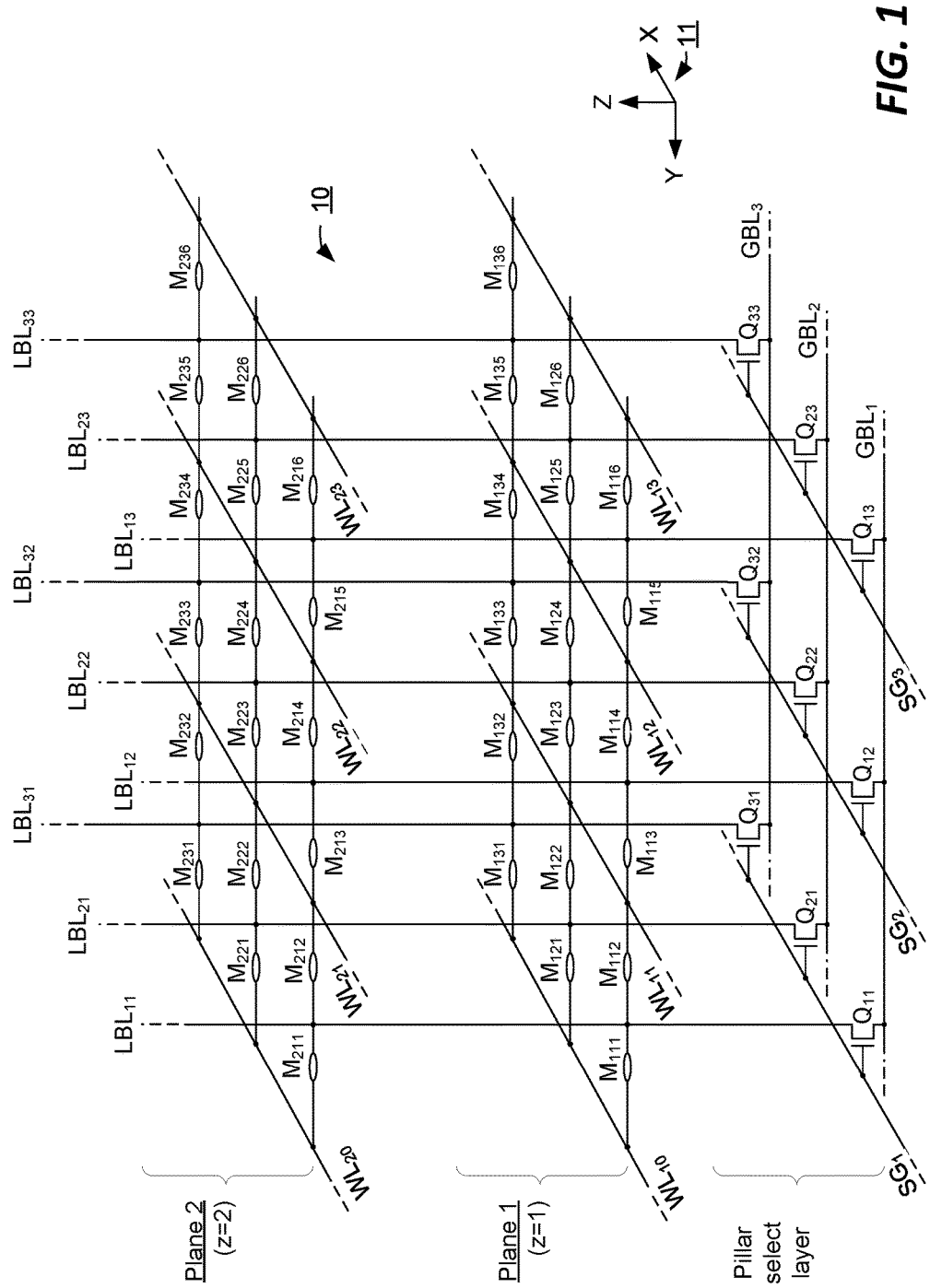
FIG. 1 is an equivalent circuit for a portion of an example three-dimensional array of variable resistance memory elements including a vertical bit line architecture with vertical TFT select devices.

The disclosed technology is directed to a three-dimensional (3D) non-volatile memory array having a vertically-oriented thin film transistor (TFT) select device and methods of fabricating such 3D memories. The vertically-oriented TFT, or more simply vertical TFT, may be used as a vertical bit line select device in one embodiment, coupling a global bit line to a local vertical bit line. A select device pillar includes a body and upper and lower source/drain regions. At least one gate is separated horizontally from the select device pillar by a gate dielectric.

The gates overlie the global bit lines with one or more insulating layers therebetween to provide adequate isolation between the gates and the global bit lines. In one embodiment, the gate is separated vertically from the global bit lines by the gate dielectric. In another embodiment, the gate is separated vertically from the global bit lines by a dielectric base, in addition to or in place of the gate dielectric. Processes for fabricating the vertical TFT select devices are provided that variously utilize a gate dielectric and dielectric bases to provide vertical separation and isolation between the conductive gate regions of the select devices and the conductive bit lines that lie beneath.

Processes are described for forming the select devices over global bit lines that extend in a column direction. In one example, a gate dielectric layer is formed after forming layer stack lines for a row of select devices that extend orthogonally to the global bit lines in a row direction. A gate layer is formed after the gate dielectric layer and is etched to form first and second gates for each of these layer stack rows. The gate dielectric layer can extend vertically along the layer stack rows to separate the gates from the body of the select devices. Horizontally, the gate dielectric layer extends in the column direction to vertically separate the gate layer from the underlying global bit lines. Dielectric bases are formed under the gates in one embodiment to increase the vertical separation and isolation from the global bit lines. The bases can be formed before or after the gate dielectric.

In one embodiment, the layer stack lines are formed in a one-step process. For example, a triple layer of silicon including N+, P−, and N+ regions may be formed and etched to form the layer stack lines. In one embodiment, a two-step process using a damascene approach may be used to form N+ strips between dielectric strips, followed by depositing and etching the P− and N+ regions.

Various options for forming the gates of the vertical TFT select devices are provided. In one embodiment, the gates are formed in a gate-first process by first patterning and etching layer stack rows for the select devices, orthogonally over the underlying set of global bit lines that are elongated in the column direction. The gate dielectric and gates are then formed, followed by patterning and etching layer stack columns, forming pillars of the select device layers. Each pillar includes a body, an upper source/drain region, and a lower source/drain region. Additional regions such as contact and insulating regions may be formed over the upper source/drain region. Additional regions such as an electrode may be formed under the lower source/drain region.

In another embodiment, the gates are formed in a gate-last process by first patterning and etching layer stack columns for the select devices, overlying and parallel to the global bit lines. After a gap fill, layer stack rows for the select devices are patterned and etched, forming the select device pillars. After defining the rows, the gate dielectric and gate layers can be formed that are elongated in the row direction, providing horizontal separation between the gates and bodies. Optionally, dielectric bases may be formed, before or after forming the gate dielectric.

In one embodiment, the vertical TFT is used as a bit line selection device in a three-dimensional (3D) array of memory elements where bit lines of the array are oriented vertically. That is, instead of stacking a plurality of two-dimensional arrays on a common semiconductor substrate, where each two-dimensional array has its own bit lines, multiple two-dimensional arrays are stacked on top of each other in separate planes but then share common bit lines that extend up through the planes. As a selection device, the vertical TFT may be referred to as a select gate or decoder. Memory elements in a 3D memory array may be controlled by applying proper voltages to their vertical bit lines and word lines. By applying either a select voltage or an unselect voltage to the vertical bit lines, while applying either a select voltage or an unselect voltage to the horizontal word lines, memory cells are selected/unselected for operations such as SET, RESET, and FORM. The vertical TFT selection device provides the proper voltage to the vertical bit line.

In FIG. 1, an architecture of a three-dimensional memory 10 is described using a schematic of an equivalent circuit of a portion of the 3D memory. A standard three-dimensional rectangular coordinate system 11 is used for reference, the directions of each of vectors x, y and z being orthogonal with the other two. In another embodiment direction x and y are substantially 60 degrees from each other. The array in FIG. 1 includes vertical bit lines.

A circuit for selectively connecting internal memory elements with external data circuits is formed using select devices $Q_{xy}$, where x gives a relative position of the device in the x-direction and y its relative position in the y-direction. The individual select devices $Q_{xy}$ are vertical TFTs in accordance with embodiments. Global bit lines ($GBL_x$) are elongated in the y-direction and have relative positions in the x-direction that are indicated by the subscript. The global bit lines ($GBL_x$) are individually connectable with the source or drain of the vertical TFT select devices $Q_{xy}$ having the same position in the x-direction, although during reading and also typically programming only one select device connected with a specific global bit line is turned on at time. The other of the source or drain of the individual select devices $Q_{xy}$ is connected with one of the local bit lines ($LBL_{xy}$). The local bit lines are elongated vertically, in the z-direction, and form a regular two-dimensional array in the x (row) and y (column) directions.

In order to connect one set (in this example, designated as one row) of local bit lines with corresponding global bit lines, row select lines $SG_y$ are elongated in the x-direction and connect with control terminals (gates) of a single row of vertical TFT select devices $Q_{xy}$ having a common position in the y-direction. The vertical TFT select devices $Q_{xy}$ therefore connect one row of local bit lines ($LBL_{xy}$) across the x-direction (having the same position in the y-direction) at a time to corresponding ones of the global bit-lines ($GBL_x$), depending upon which of the row select lines $SG_y$ receives a voltage that turns on the vertical TFT select devices to which it is connected. The remaining row select lines receive voltages that keep their connected vertical TFT select devices $Q_{xy}$ off. It may be noted that since only one vertical TFT select device ($Q_{xy}$) is used with each of the local bit lines ($LBL_{xy}$), the pitch of the array across the semiconductor substrate in both x and y-directions may be made very small, and thus the density of the memory storage elements large.

Memory elements $M_{zxy}$ are formed in a plurality of planes positioned at different distances in the z-direction above a substrate (which may be below the pillar select layer). Two planes 1 and 2 are illustrated in FIG. 1 but there will typically be additional planes such as 4, 6, 8, 16, 32, or even more. In each plane at distance z, word lines $WL_{zy}$ are elongated in the x-direction and spaced apart in the y-direction between the local bit-lines ($LBL_{xy}$). The word lines $WL_{zy}$ of each plane individually cross adjacent two of the local bit-lines $LBL_{xy}$ on either side of the word lines. The individual memory storage elements $M_{zxy}$ are connected between one local bit line $LBL_{xy}$ and one word line $WL_{zy}$ adjacent these individual crossings. An individual memory element $M_{zxy}$ is therefore addressable by placing proper voltages on the local bit line $LBL_{xy}$ and word line $WL_{zy}$ between which the memory element is connected. The voltages are chosen to provide the electrical stimulus necessary to cause the state of the memory element to change from an existing state to the desired new state. After the device is first fabricated, voltages may be selected to provide the electrical stimulus necessary to "form" the memory element, which refers to lowering its resistance from a virgin state. The levels, duration and other characteristics of these voltages depend upon the material that is used for the memory elements.

Each "plane" of the three-dimensional memory structure is typically formed of at least two layers, one in which the conductive word lines $WL_{zy}$ are positioned and another of a dielectric material that electrically isolates the planes from each other. Additional layers may also be present in each plane, depending for example on the structure of the memory elements $M_{zxy}$. The planes are stacked on top of each other above a semiconductor substrate with the local bit lines $LBL_{xy}$ being connected with storage elements $M_{zxy}$ of each plane through which the local bit lines extend.

The memory arrays described herein, including memory 10, may be monolithic three dimensional memory arrays. A monolithic three dimensional memory array is one in which multiple memory levels are formed above (and not in) a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

Figure 2:
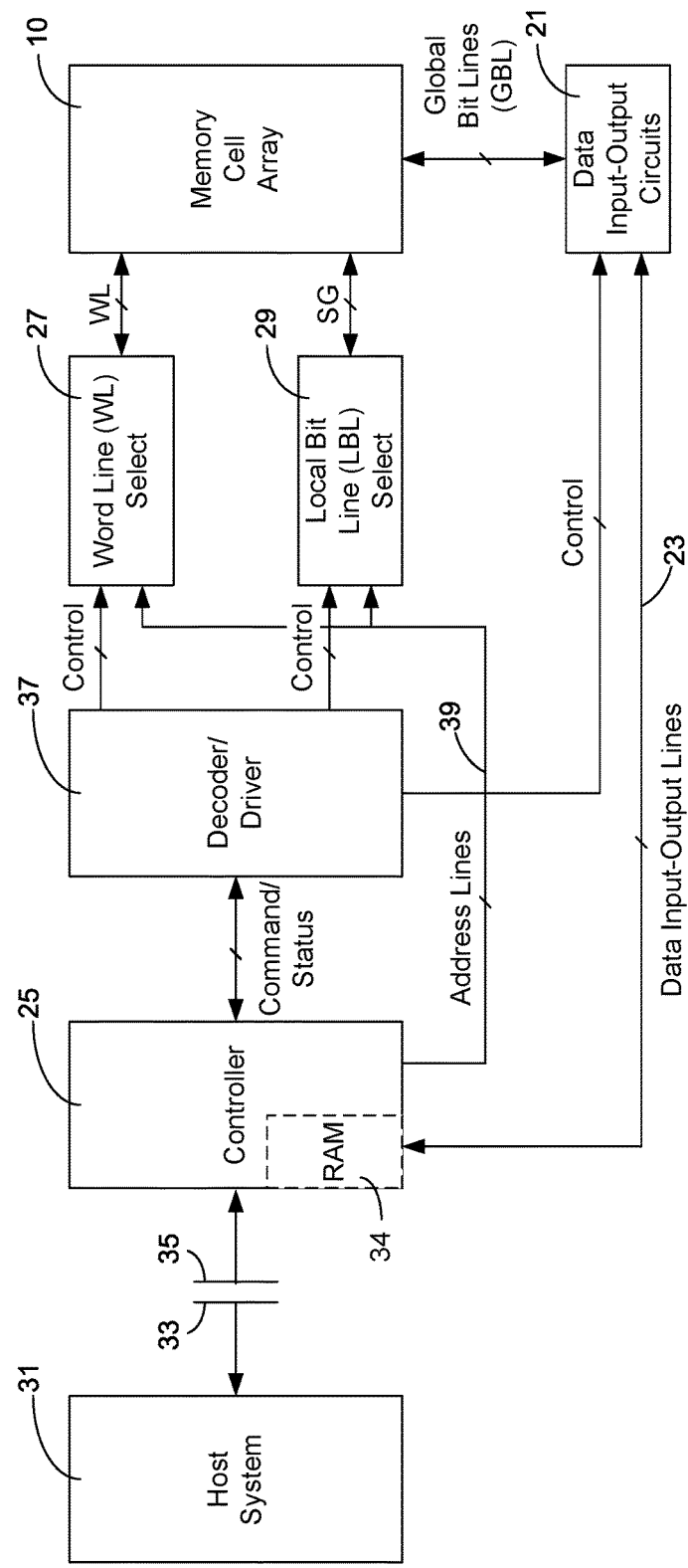
FIG. 2 is a schematic block diagram of a re-programmable non-volatile memory system which utilizes the memory array of FIG. 1.

FIG. 2 is a block diagram of an illustrative memory system that can use the three-dimensional memory 10 of FIG. 1. Data input-output circuits 21 are connected to provide (during programming) and receive (during reading) analog electrical quantities in parallel over the global bit-lines $GBL_x$ of FIG. 1 that are representative of data stored in addressed memory elements $M_{zxy}$. Data input-output circuits 21 typically contain sense amplifiers for converting these electrical quantities into digital data values during reading, which digital values are then conveyed over lines 23 to a memory system controller 25. Conversely, data to be programmed into the array 10 are sent by the controller 25 to the input-output circuits 21, which then programs that data into addressed memory element by placing proper voltages on the global bit lines $GBL_x$. For binary operation, one voltage level is typically placed on a global bit line to represent a binary "1" and another voltage level to represent a binary "0". The memory elements are addressed for reading or programming by voltages placed on the word lines $WL_{zy}$ and row select lines $SG_y$ by respective word line select circuits 27 and local bit line circuits 29. In the specific three-dimensional array of FIG. 1, the memory elements lying between a selected word line and any of the local bit lines $LBL_{xy}$ connected at one instance through the select devices $Q_{xy}$ to the global bit lines $GBL_x$ may be addressed for programming or reading by appropriate voltages being applied through the select circuits 27 and 29.

Controller 25 typically receives data from and sends data to a host system 31. Controller 25 usually contains an amount of random-access-memory (RAM) 34 for temporarily storing such data and operating information. Commands, status signals and addresses of data being read or programmed are also exchanged between the controller 25 and host 31. The memory system operates with a wide variety of host systems. They include personal computers (PCs), laptop and other portable computers, cellular telephones, personal digital assistants (PDAs), digital still cameras, digital movie cameras and portable audio players. The host typically includes a built-in receptacle 33 for one or more types of memory cards or flash drives that accepts a mating memory system plug 35 of the memory system but some hosts require the use of adapters into which a memory card is plugged, and others require the use of cables therebetween. Alternatively, the memory system may be built into the host system as an integral part thereof.

Controller 25 conveys to decoder/driver circuits 37 commands received from the host 31. Similarly, status signals generated by the memory system are communicated to the controller 25 from decoder/driver circuits 37. The circuits 37 can be simple logic circuits in the case where the controller controls nearly all of the memory operations, or can include a state machine to control at least some of the repetitive memory operations necessary to carry out given commands. Control signals resulting from decoding commands are applied from the circuits 37 to the word line select circuits 27, local bit line select circuits 29 and data input-output circuits 21. Also connected to the circuits 27 and 29 are address lines 39 from the controller that carry physical addresses of memory elements to be accessed within the array 10 in order to carry out a command from the host. The physical addresses correspond to logical addresses received from the host system 31, the conversion being made by the controller 25 and/or the decoder/driver 37. As a result, th local bit line select e circuits 29 partially address the designated storage elements within the array 10 by placing proper voltages on the control elements of the select devices $Q_{xy}$ to connect selected local bit lines ($LBL_{xy}$) with the global bit lines ($GBL_x$). The addressing is completed by the circuits 27 applying proper voltages to the word lines $WL_{zy}$ of the array.

Although the memory system of FIG. 2 utilizes the three-dimensional memory array 10 of FIG. 1, the system is not limited to use of only that array architecture. A given memory system may alternatively combine this type of memory with other another type including flash memory, such as flash memory having a NAND memory cell array architecture, a magnetic disk drive or some other type of memory. The other type of memory may have its own controller or may in some cases share the controller 25 with the three-dimensional memory cell array 10, particularly if there is some compatibility between the two types of memory at an operational level.

Although each of the memory elements $M_{zxy}$ in the array of FIG. 1 may be individually addressed for changing its state according to incoming data or for reading its existing storage state, it is certainly preferable to program and read the array in units of multiple memory elements in parallel. In the three-dimensional array of FIG. 1, one row of memory elements on one plane may be programmed and read in parallel. The number of memory elements operated in parallel depends on the number of memory elements connected to the selected word line. In some arrays, the word lines may be segmented (not shown in FIG. 1) so that only a portion of the total number of memory elements connected along their length may be addressed for parallel operation, namely the memory elements connected to a selected one of the segments. In some arrays the number of memory elements programmed in one operation may be less than the total number of memory elements connected to the selected word line to minimize IR drops, to minimize power, or for other reasons.

Previously programmed memory elements whose data have become obsolete may be addressed and re-programmed from the states in which they were previously programmed. The states of the memory elements being re-programmed in parallel will therefore most often have different starting states among them. This is acceptable for many memory element materials but it is usually preferred to re-set a group of memory elements to a common state before they are re-programmed. For this purpose, the memory elements may be grouped into blocks, where the memory elements of each block are simultaneously reset to a common state, preferably one of the programmed states, in preparation for subsequently programming them. If the memory element material being used is characterized by changing from a first to a second state in significantly less time than it takes to be changed from the second state back to the first state, then the reset operation is preferably chosen to cause the transition taking the longer time to be made. The programming is then done faster than resetting. The longer reset time is usually not a problem since resetting blocks of memory elements containing nothing but obsolete data is typically accomplished in a high percentage of the cases in the background, therefore not adversely impacting the programming performance of the memory system.

With the use of block re-setting of memory elements, a three-dimensional array of variable resistive memory elements may be operated in a manner similar to flash memory arrays. Resetting a block of memory elements to a common state corresponds to erasing a block of flash memory elements to an erased state. The individual blocks of memory elements may be further divided into a plurality of pages of storage elements. The memory elements of a page can be programmed and read together. This is similar to the use of pages in flash memories. The memory elements of an individual page are programmed and read together. When programming, those memory elements that are to store data that are represented by the reset state are not changed from the reset state. Those of the memory elements of a page that need to be changed to another state in order to represent the data being stored in them have their states changed by the programming operation. Example resetting, programming (e.g., setting) and reading operations of a memory array like that of FIGS. 1-3 can be found in U.S. patent application Ser. No. 13/788,990, entitled Vertical Bit line TFT Decoder for High Voltage Operation," filed Mar. 7, 2013 and incorporated by reference herein in its entirety.

Figure 3:
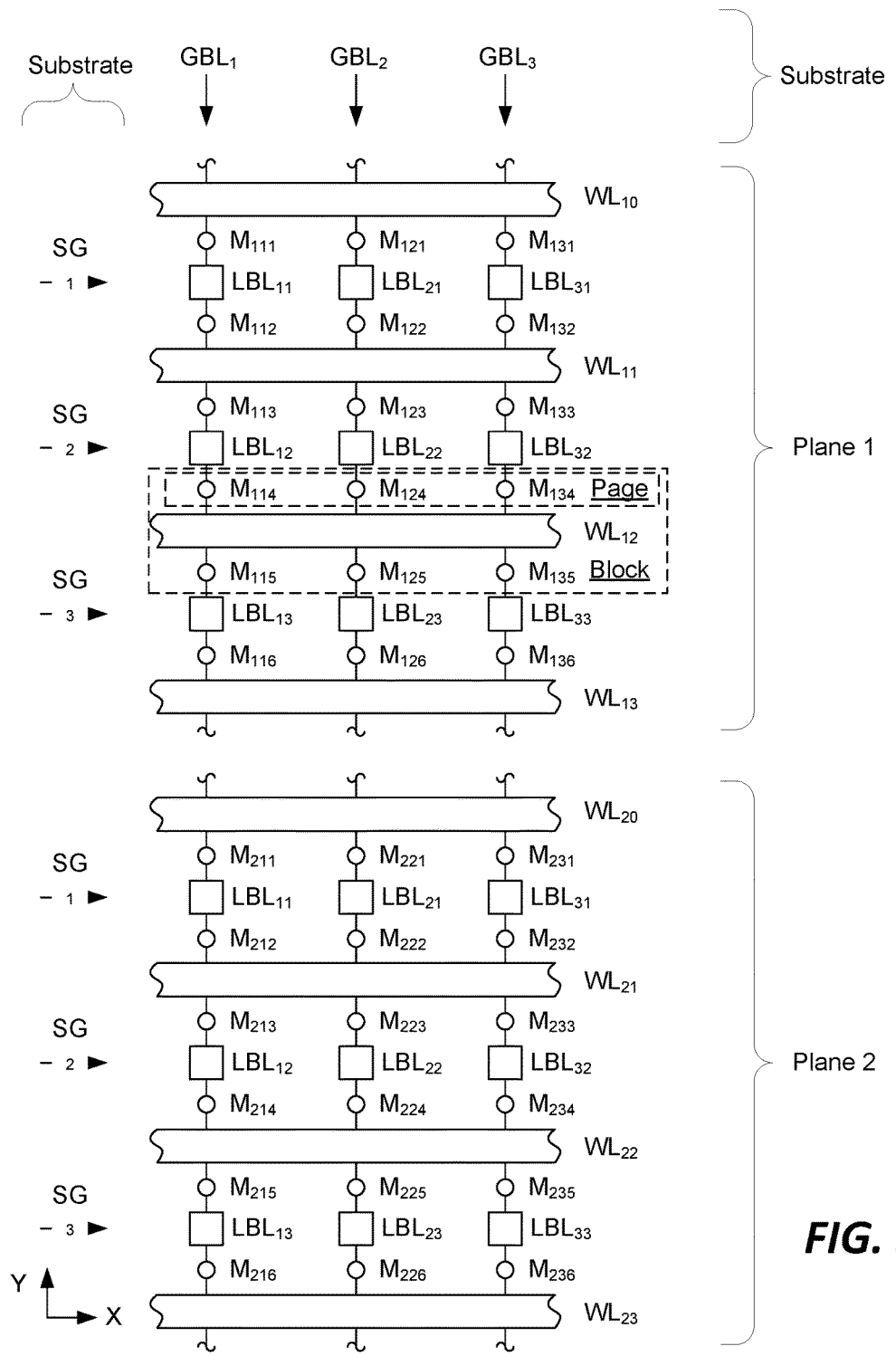
FIG. 3 provides plan views of the two planes and substrate of the three-dimensional array of FIG. 1.

An example of use of such blocks and pages is illustrated in FIG. 3, which provides plan schematic views of planes 1 and 2 of the array of FIG. 1. The different word lines $WL_{zy}$ that extend across each of the planes and the local bit lines $LBL_{xy}$ that extend through the planes are shown in two-dimensions. Individual blocks are made up of memory elements connected to both sides of one word line, or one segment of a word line if the word lines are segmented, in a single one of the planes. There are therefore a very large number of such blocks in each plane of the array. In the block illustrated in FIG. 3, each of the memory elements $M_{114}$, $M_{124}$, $M_{134}$, $M_{115}$, $M_{125}$ and $M_{135}$ connected to both sides of one word line $WL_{12}$ form the block. Of course, there will be many more memory elements connected along the length of a word line but only a few of them are illustrated, for simplicity. The memory elements of each block are connected between the single word line and different ones of the local bit lines, namely, for the block illustrated in FIG. 3, between the word line $WL_{12}$ and respective local bit lines $LBL_{12}$, $LBL_{22}$, $LBL_{32}$, $LBL_{13}$, $LBL_{23}$ and $LBL_{33}$.

A page is also illustrated in FIG. 3. In the specific embodiment being described, there are two pages per block. One page is formed by the memory elements along one side of the word line of the block and the other page by the memory elements along the opposite side of the word line. The example page marked in FIG. 3 is formed by memory elements $M_{114}$, $M_{124}$ and $M_{134}$. Of course, a page will typically have a very large number of memory elements in order to be able to program and read a large amount of data at one time. Only a few of the storage elements of the page of FIG. 3 are included, for simplicity in explanation.

Figure 4:
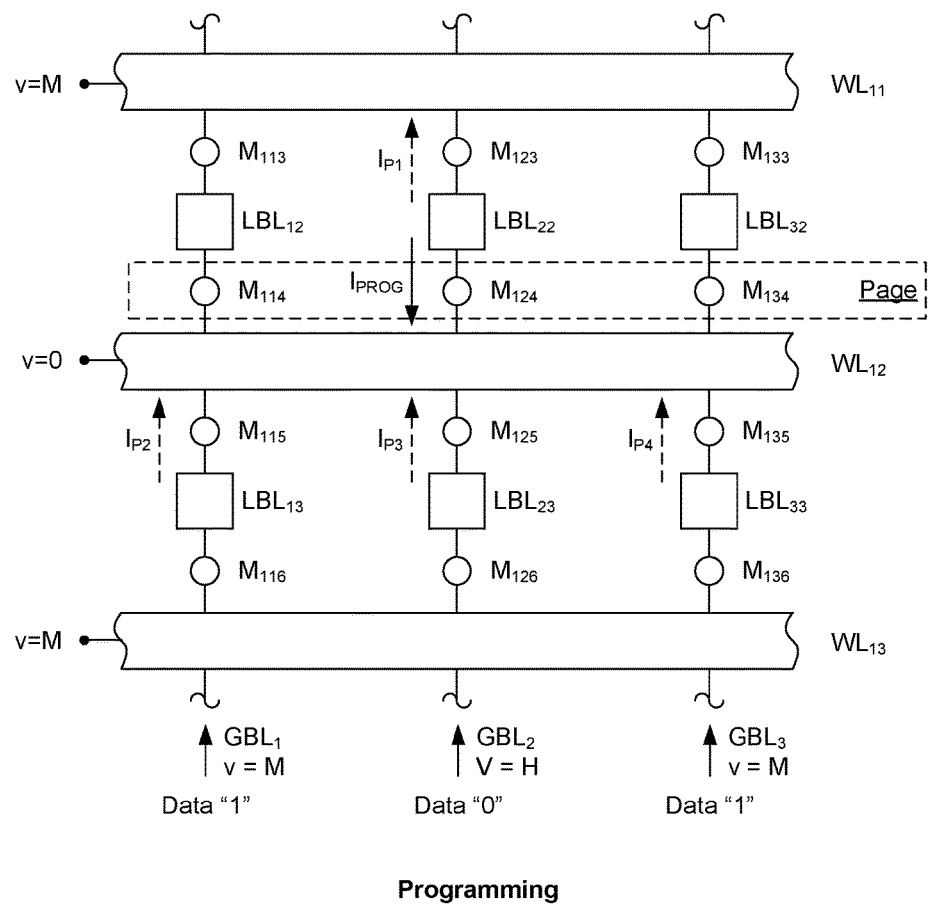
FIG. 4 is an expanded view of a portion of one of the planes of FIG. 3, annotated to show effects of programming data.
Figure 5:
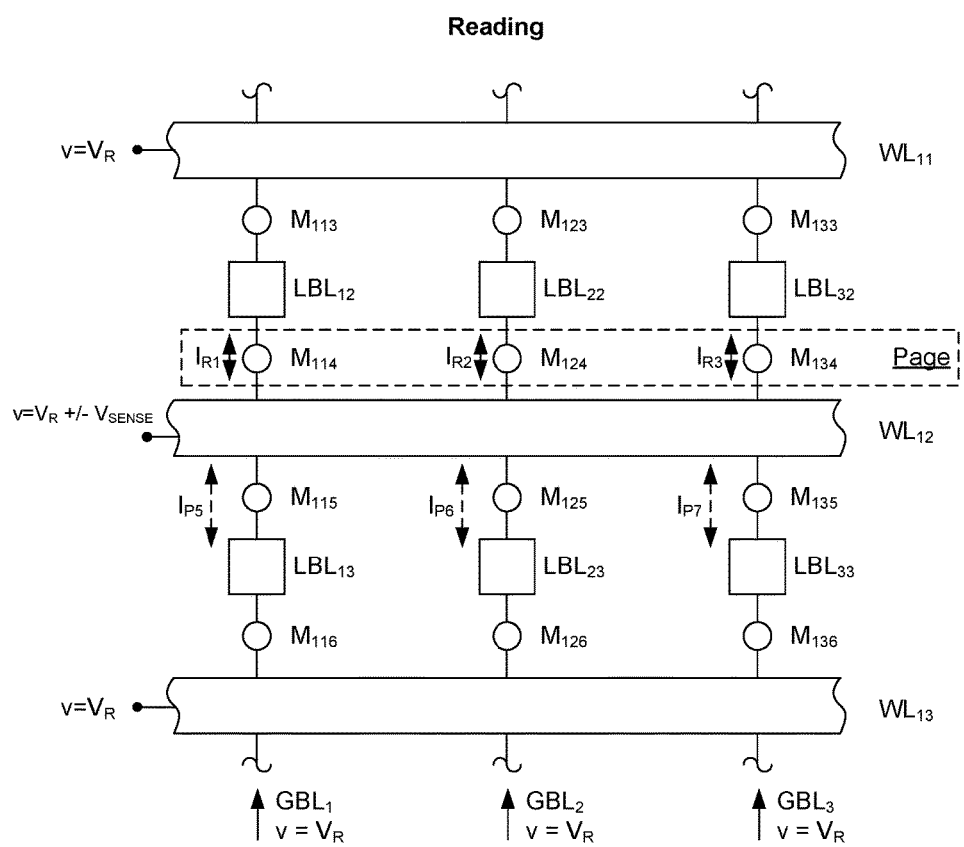
FIG. 5 is an expanded view of a portion of one of the planes of FIG. 3, annotated to show effects of reading data.

An expanded version of the page indicated in FIG. 3 is provided in FIG. 4, with annotations added to illustrate a programming operation. The individual memory elements of the page are initially in their reset state because all the memory elements of its block have previously been reset. The reset state is taken herein to represent a logical data "1." For any of these memory elements to store a logical data "0" in accordance with incoming data being programmed into the page, those memory elements are switched into their low resistance state, their set state, while the remaining memory elements of the page remain in the reset state.

For programming a page, only one row of select devices is turned on, resulting in only one row of local bit lines being connected to the global bit lines. This connection alternatively allows the memory elements of both pages of the block to be programmed in two sequential programming cycles, which then makes the number of memory elements in the reset and programming units equal.

The material used for the non-volatile memory elements $M_{zxy}$ in the arrays described herein can be a chalcogenide, a metal oxide, CMO, or any one of a number of materials that exhibit a stable, reversible shift in resistance in response to an external voltage applied to or current passed through the material. Other materials can also be used. The technologies described below are not restricted to any one set of materials for forming the non-volatile memory elements.

By way of example, metal oxides are characterized by being insulating when initially deposited. One suitable metal oxide is a titanium oxide ($TiO_x$). A composite structure can be formed in a non-conductive (high resistance) state. When a large negative voltage (such as 1.5 volt) is applied across the structure, a relatively high current can flow through the structure. The device is then in its low resistance (conductive) state. The conductive path is broken by applying a large positive voltage across the structure. The device returns to its high resistance state. Both of the conductive and non-conductive states are non-volatile. Examples of other oxide materials that can be used for the non-volatile memory elements $M_{zxy}$ in the array include HfOx, ZrOx, WOx, NiOx, CoOx, CoAlOx, MnOx, $ZnMn_2O_4$, ZnOx, TaOx, NbOx, HfSiOx, HfAlOx.

Another class of materials suitable for the memory storage elements includes solid electrolytes. They are electrically conductive when deposited. Individual memory elements can be formed and isolated from one another. Examples of solid electrolytes materials are: TaO, GeSe or GeS. Other systems suitable for use as solid electrolyte cells are: Cu/TaO/W, Ag/GeSe/W, Cu/GeSe/W, Cu/GeS/W, and Ag/GeS/W.

Carbon may also be used as a non-volatile memory element. Carbon is usually used in two forms, conductive (or grapheme like-carbon) and insulating (or amorphous carbon). The operation of a carbon resistive switching nonvolatile memories involves transforming chemical bond configurations by applying appropriate current (or voltage) pulses to the carbon structure. For example, when a very short high amplitude voltage pulse is applied across the material, the conductance is greatly reduced as the carbon may be in an amorphous state. On the other hand, when in the reset state, applying a lower voltage for a longer time causes part of the material to change into the conductive state. Carbon nanotubes (CNTs) may be used as a non-volatile memory material. Such nanotubes can demonstrate very high conductivity. When an electric field is applied across this fabric, the CNT's tend to flex or align themselves such that the conductivity of their fabric is changed.

Yet another class of materials suitable for the memory storage elements is phase-change materials. A group of phase-change materials may include chalcogenide glasses, often of a composition $Ge_xSb_yTe_z$, where x=2, y=2 and z=5. GeSb may also be used. Other materials include AgInSbTe, GeTe, GaSb, BaSbTe, InSbTe and various other combinations of these basic elements. When a high energy pulse is applied for a very short time to cause a region of the material to melt, the material "quenches" in an amorphous state, which is a low conductive state. When a lower energy pulse is applied for a longer time such that the temperature remains above the crystallization temperature but below the melting temperature, the material crystallizes to form polycrystal phases of high conductivity.

It will be noted that the memory materials in most of the foregoing examples utilize electrodes on either side thereof whose compositions are specifically selected. In embodiments of the three-dimensional memory array herein where the word lines (WL) and/or local bit lines (LBL) also form these electrodes by direct contact with the memory material, those lines can be made of the conductive materials described above. In embodiments using additional conductive segments for at least one of the two memory element electrodes, those segments can be made of the materials described above for the memory element electrodes.

Steering elements are commonly incorporated into controllable resistance types of memory storage elements. Steering elements can be a transistor or a diode. Although an advantage of the three-dimensional architecture described herein is that such steering elements are not necessary, there may be specific configurations where steering elements are included. The diode can be a p-n junction (not necessarily of silicon), a metal/insulator/insulator/metal (MIIM), or a Schottky type metal/semiconductor contact but can alternately be a solid electrolyte element.

For simplicity the above description has considered the simplest case of storing one data value within each cell: each cell is either reset or set and holds one bit of data. However, the techniques of the present application are not limited to this simple case. By using various values of ON resistance and designing the sense amplifiers to be able to discriminate between several of such values, each memory element can hold multiple-bits of data in a multiple-level cell (MLC).

Additional information regarding the various memory materials that may be used can be found in U.S. patent application Ser. No. 13/788,990, entitled Vertical Bit line TFT Decoder for High Voltage Operation," filed Mar. 7, 2013 and incorporated by reference herein in its entirety.

Figure 6:
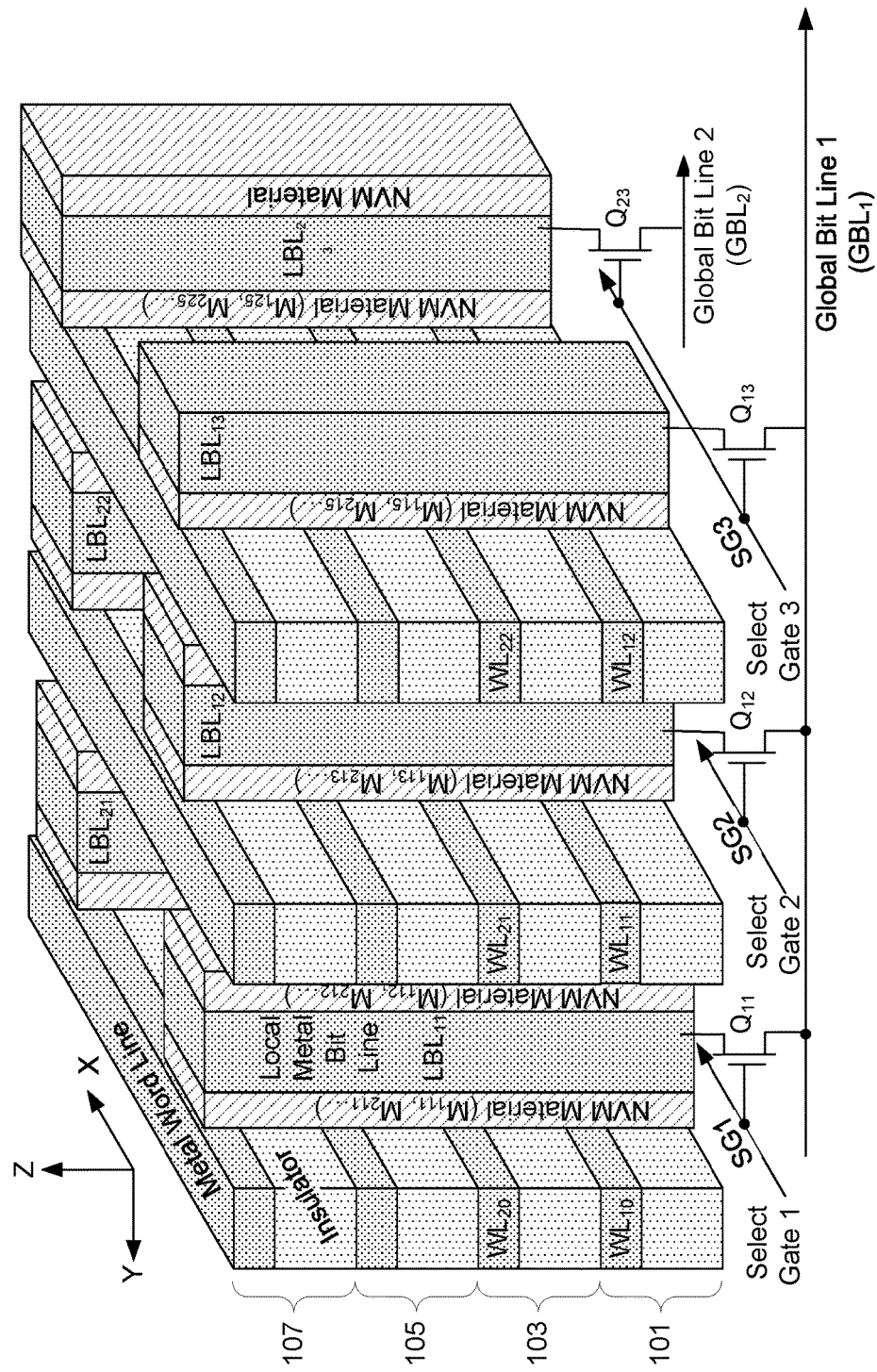
FIG. 6 is an isometric view of a portion of the three-dimensional array shown in FIG. 1 according to a first specific example of an implementation thereof.

One example semiconductor structure for implementing the three-dimensional memory element array of FIG. 1 is illustrated in FIG. 6, which is configured for use of non-volatile memory element (NVM) material that is non-conductive when first deposited. A metal oxide of the type discussed above has this characteristic. Since the material is initially non-conductive, there is no necessity to isolate the memory elements at the cross-points of the word and bit lines from each other. Several memory elements may be implemented by a single continuous layer of material, which in the case of FIG. 6 are strips of NVM material oriented vertically along opposite sides of the vertical bit lines in the y-direction and extending upwards through all the planes. A significant advantage of the structure of FIG. 6 is that all word lines and strips of insulation under them in a group of planes may be defined simultaneously by use of a single mask, thus greatly simplifying the manufacturing process.

Referring to FIG. 6, a small part of four planes 101, 103, 105 and 107 of the three-dimensional array are shown. Elements of the FIG. 6 array that correspond to those of the equivalent circuit of FIG. 1 are identified by the same reference numbers. It will be noted that FIG. 6 shows the two planes 1 and 2 of FIG. 1 plus two additional planes on top of them. All of the planes have the same horizontal pattern of conductor, dielectric and NVM material. In each plane, metal word lines (WL) are elongated in the x-direction and spaced apart in the y-direction. Each plane includes a layer of insulating dielectric that isolates its word lines from the word lines of the plane below it or, in the case of plane 101, of the substrate circuit components below it. Extending through each plane is a collection of metal local bit line (LBL) "pillars" elongated in the vertical z-direction and forming a regular array in the x-y direction.

Each bit line pillar is connected to one of a set of global bit lines (GBL) in the silicon substrate running in the y-direction at the same pitch as the pillar spacing through the select devices ($Q_{xy}$) formed in the substrate whose gates are driven by the row select lines (SG) elongated in the x-direction, which are also formed in the substrate. The select devices $Q_{xy}$ may be conventional CMOS transistors (or vertical MOSFET thin film transistors, or Junction FET, or npn transistors) and fabricated using the same process as used to form the other conventional circuitry. In the case of using npn transistors instead of MOS transistors, the row select line (SG) lines are replaced with the base contact electrode lines elongated in the x-direction. Also fabricated in the substrate but not shown in FIG. 6 are sense amplifiers, input-output (I/O) circuitry, control circuitry, and any other necessary peripheral circuitry. There is one row select line (SG) for each row of local bit line pillars in the x-direction and one select device (Q) for each individual local bit line (LBL).

Each vertical strip of NVM material is sandwiched between the vertical local bit lines (LBL) and a plurality of word lines (WL) vertically stacked in all the planes. Preferably the NVM material is present between the local bit lines (LBL) in the x-direction. A memory storage element (M) is located at each intersection of a word line (WL) and a local bit line (LBL). In the case of a metal oxide described above for the memory storage element material, a small region of the NVM material between an intersecting local bit line (LBL) and word line (WL) is controllably alternated between conductive (set) and non-conductive (reset) states by appropriate voltages applied to the intersecting lines. In one embodiment, the NVM material includes Hafnium Oxide, the word lines comprise TiN, and the bit lines comprise N+ silicon.

There may also be a parasitic NVM element formed between the LBL and the dielectric between planes. By choosing the thickness of the dielectric strips to be large compared to the thickness of the NVM material layer (that is, the spacing between the local bit lines and the word lines), a field caused by differing voltages between word lines in the same vertical word line stack can be made small enough so that the parasitic element never conducts a significant amount of current. Similarly, in other embodiments, the non-conducting NVM material may be left in place between adjacent local bit lines if the operating voltages between the adjacent LBLs remain below the programming threshold.

Aa vertically oriented select device (e.g., three terminal switch and/or select transistor) for connecting the individual local bit line pillars to the respective global bit lines is provided. For example, the select devices $Q_{11}, Q_{12}, \ldots, Q_{21}, Q_{22}, \ldots$ of FIG. 1 can be implemented as vertically oriented select devices. In one embodiment, each vertically oriented select device is a pillar select device that is formed as a vertical structure, switching between a local bit line pillar and a global bit line. The pillar select devices, unlike previous embodiments where they are formed within a CMOS layer, are in the present embodiments formed in a separate layer (pillar select layer) above the CMOS layer/substrate, along the z-direction between the array of global bit lines and the array of local bit lines. The CMOS layer is the substrate where the support circuitry is implemented, including the row select circuit and word line drivers. The use of vertically oriented select devices above, but not in, the substrate allows the memory elements to be arranged in a more compact fashion, thereby increasing density. Additionally, positioning the vertically oriented select devices above the substrate allows for other devices (e.g., the word line drivers) to be positioned in the substrate under the memory array rather than outside of the array, which allows the integrated circuit to be smaller. For example, a pillar shaped Thin Film Transistor (TFT) FET or JFET can be can be used as the select device.

Figure 7:
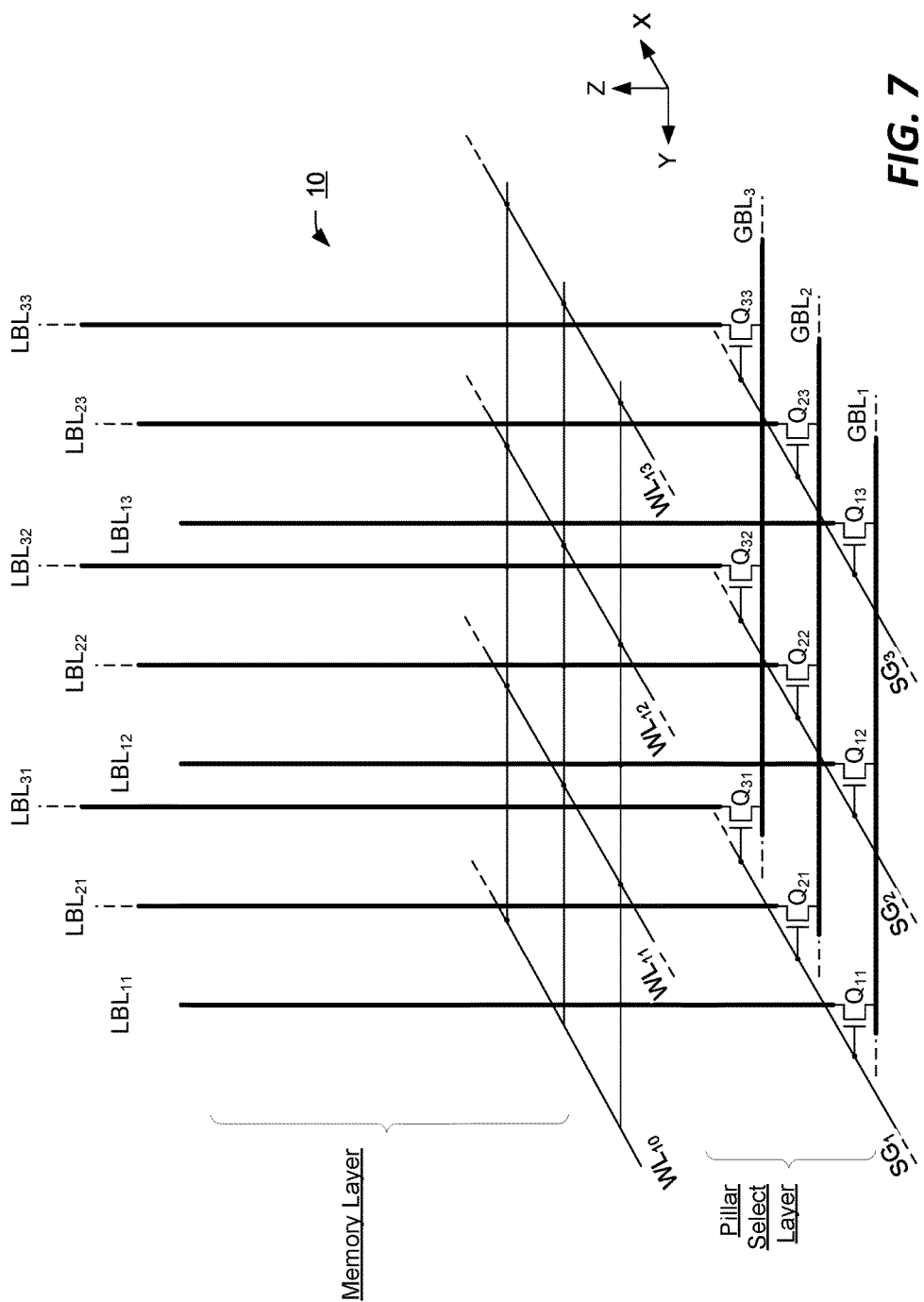
FIG. 7 is an equivalent circuit of a portion of an example three-dimensional array of variable resistance memory elements, wherein the array has vertical bit lines and a pillar select layer, both of which are above (and not in) the substrate.

FIG. 7 illustrates schematically the three dimensional memory ("3D memory") comprising of a memory layer on top of a pillar select layer. The 3D memory 10 is formed on top of a CMOS substrate (not shown explicitly) where structures in the CMOS are referred to as being in the FEOL ("Front End of Lines"). The vertically oriented select devices switching individual vertical bit lines (that are above and not in the substrate) to individual global bit lines are now formed on top of the FEOL layer in the BEOL ("Back End of Lines"). Thus, the BEOL comprises of the pillar select layer with the memory layer on top of it. The vertically oriented select devices (such as $Q_{11}, Q_{12}, \ldots, Q_{21}, Q_{22}, \ldots$, etc) are formed in the pillar select layer as vertically oriented select devices. The pillar select layer is formed above (and not in) the substrate. The memory layer is similar to that described above, comprising of multiple layers of word lines and memory elements. For simplicity, FIG. 7 shows only one layer of word lines, such as $WL_{10}$, $W_{11}, \ldots$, etc without showing the memory elements that exist between each crossing of a word line and a bit line.

Figure 8B:
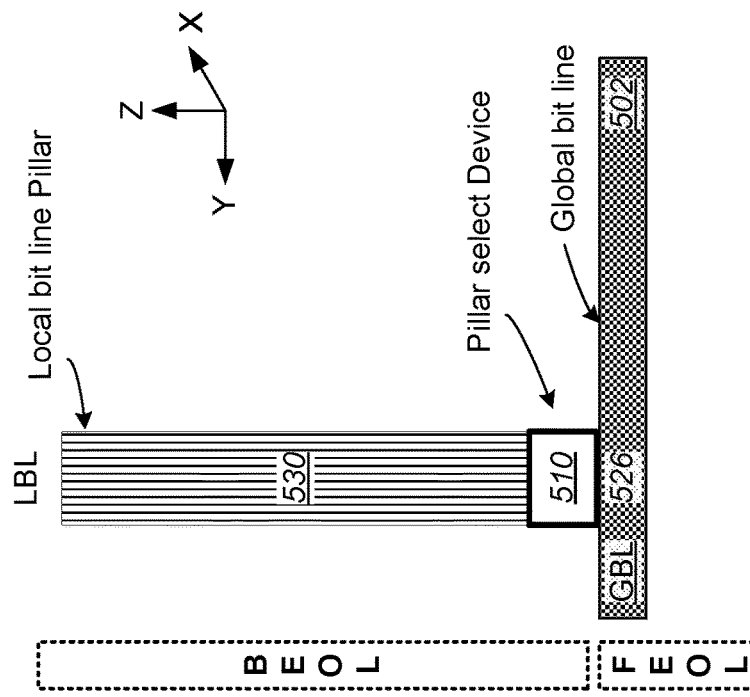
FIG. 8B is a plan view that depicts a vertical bit line, a vertically oriented select device and a global bit line.
Figure 8A:
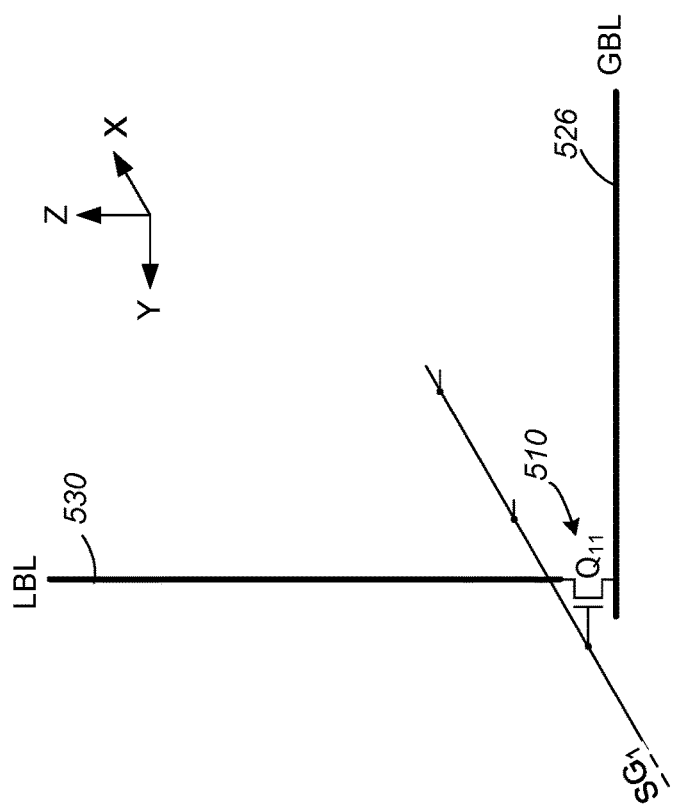
FIG. 8A is a schematic that depicts a vertical bit line, a vertically oriented select device and a global bit line.

FIG. 8A illustrates a schematic circuit diagram of a given vertically oriented select device switching a local bit line to a global bit line. In the example, the local bit line LBL 440 is switchable to the global bit line GBL 250 by a vertically oriented select transistor 500 such as $Q_{11}$. The gate of the select transistor $Q_{11}$ is controllable by a signal exerted on a row select line $SG_1$.

FIG. 8B illustrates the structure of the vertically oriented select device in relation to the local bit line and the global bit line. The global bit line such as GBL 250 is formed below the vertically oriented select device, in the FEOL as part of the metal layer-1 or metal layer-2 502. The vertically oriented select device in the form of the vertical active TFT transistor 500 (e.g., vertically oriented channel MOS TFT or vertically oriented channel JFET) is formed in the BEOL layer on top of the GBL 250 (and above, but not in, the substrate). The local bit line LBL 440, in the form of a pillar, is formed on top of the vertically oriented select device 500. In this way, the vertically oriented select device 500 can switch the local bit line pillar LBL to the global bit line GBL.

Figure 9:
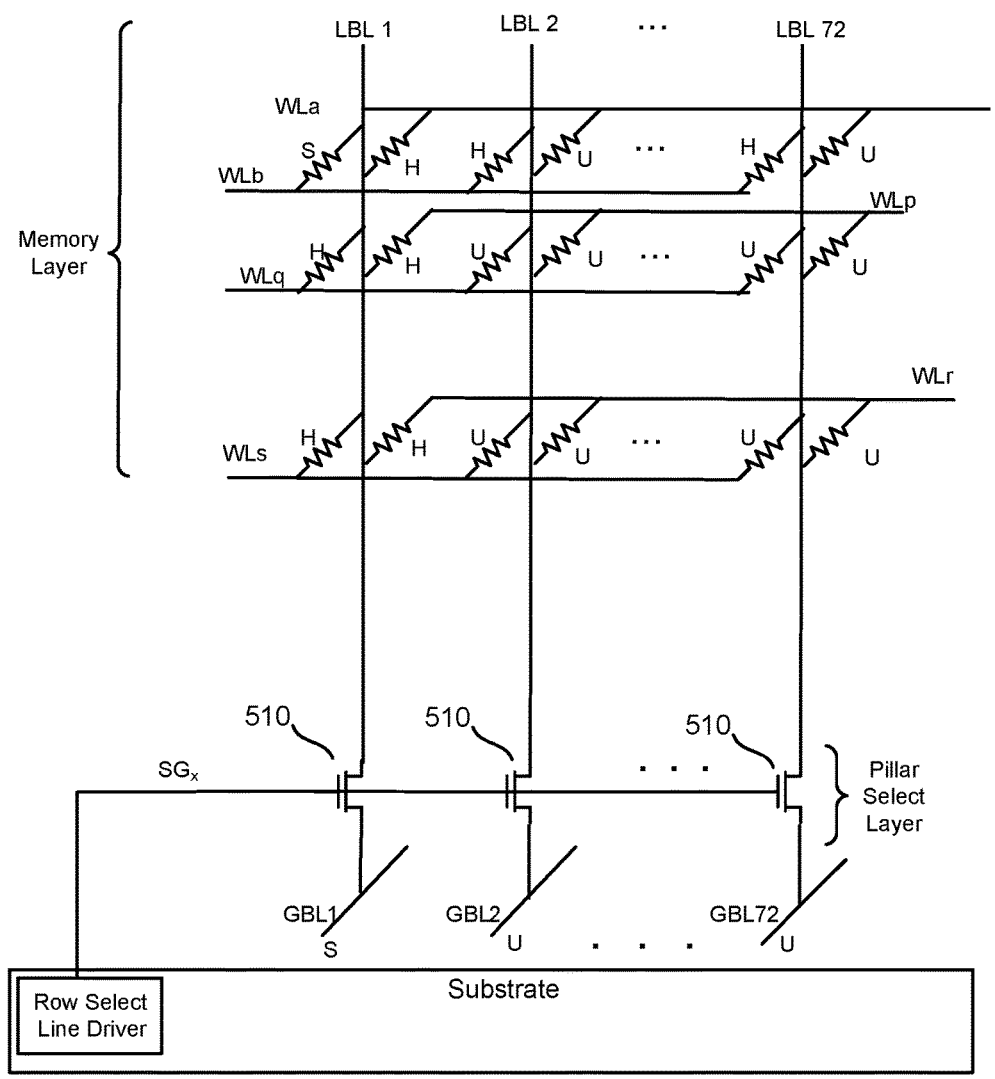
FIG. 9 is a schematic of a portion of the memory system, depicting vertical bit lines above the substrate, vertically oriented select devices above the substrate and row select line drivers in the substrate.

FIG. 9 shows a portion of the memory system, with the memory elements being depicted as resistors (due to their reversible resistance switching properties). FIG. 9 shows the Pillar Select Layer below the Memory Layer and above (and not in) the Substrate. Only a portion of the Memory Layer is illustrated. For example, FIG. 9 shows bit lines LBL1, LBL2, . . . LBL72. In this embodiment each of the word lines are connected to 72 memory elements. Each of the memory elements is connected between a word line and a bit line. Therefore, there will be 72 memory elements connected to the same word line and different bit lines (of the 72 bit lines in a row). Each of the bit lines are connected to a respective global bit line by one of the vertically oriented select devices 504 of the Pillar Select Layer. The signal $SG_x$ driving the set of vertically oriented select devices 504 depicted in FIG. 9 is controlled by the Row Select Line Driver. Note that the Row Select Line Driver is implemented in the substrate. The global bit lines (GBL1, GBL2, . . . GBL72) are implemented in the metal lines above the substrate. FIG. 9 shows one slice taken along the word line direction such that each of the bit lines depicted in FIG. 9 are connected to different global bit lines via the vertically oriented select devices 504.

In one embodiment, pairs of neighboring word lines (e.g., WLa and WLb, WLp and WLq, WLr and WLs) will be connected to memory elements that are in turn connected to common bit lines. FIG. 9 shows three pairs of word lines (WLa and WLb, WLp and WLq, WLr and WLs), with each of the pair being on a different layer of the memory structure. In one illustrative embodiment, the word lines receive address dependent signals such a that word line WLb is selected for memory operation while word lines WLa, WLp, WLq, WLr and WLs are not selected. Although the enabling signal applied on row select line $SG_X$ causes all of the vertically oriented select devices 504 to connect the respective global bit lines to the respective local bit lines of FIG. 9, only the global bit line GLBL1 includes a data value for programming (as noted by the S). Global bit lines GLBL2 and GLBL72 do not include data for programming (as noted by the U). This can be due to the data pattern being stored as the global bit lines receive data dependent signals. Note that while SGx receive an enable signal, other select lines receive a disable signal to turn off the connected select devices.

Because local bit line LBL 1 and word line WLb are both selected for programming, the memory element between local bit line LBL1 and word line WLb is selected for the memory operation (as noted by the S). Since local bit line LBL1 is the only bit line with program data, the other memory elements connected to WLb will be half selected (as noted by H). By half selected, it is meant that one of the control lines (either the bit line or the word line) is selected but the other control line is not selected. A half selected memory element will not undergo the memory operation. The word line WLa is not selected; therefore, the memory cell between WLa and local bit line LBL1 is half selected, and the other memory elements on WLa are unselected. Since word lines WLp, WLq, WLr and WLs are not selected, their memory elements connected to LBL1 are half selected and the other memory elements connected to those word lines are unselected.

Figure 10:
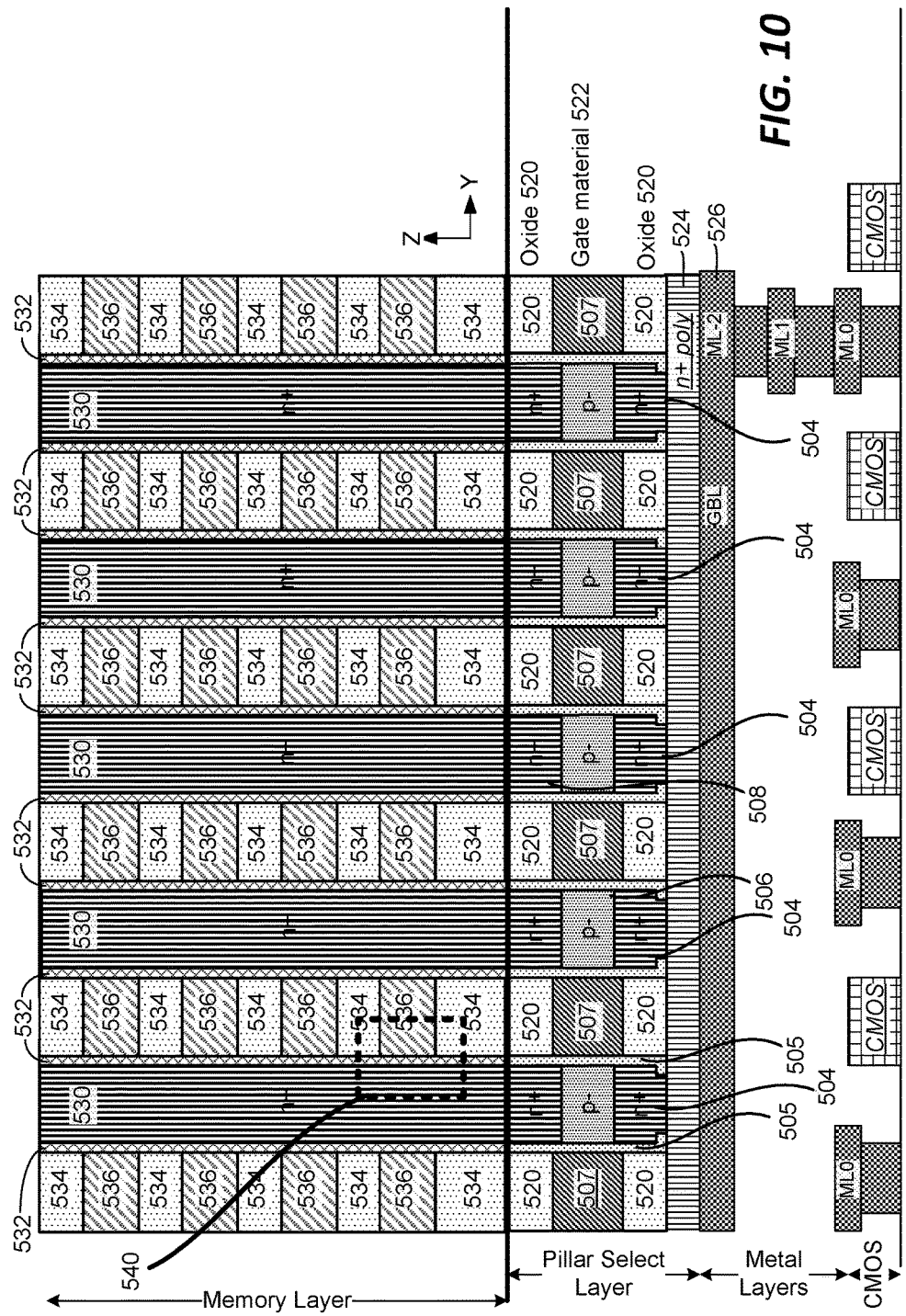
FIG. 10 illustrates one embodiment of a memory structure with vertical local bit lines above the substrate and vertically oriented select devices above the substrate that connect the bit lines to global bit lines.

FIG. 10 is a cross-sectional view of a memory structure using the vertically oriented select device discussed above and the memory structure of FIG. 6. As described below, the memory structure of FIG. 10 is a continuous mesh array of memory elements because there are memory elements connected to both sides of the bit lines and memory elements connected to both sides of the word lines. At the bottom of FIG. 10, the CMOS substrate is depicted. Implemented on the top surface of the CMOS structure are various metal lines including ML-0, ML-1, and ML-2. Line 526 of ML-2 serves as a respective global bit line (GBL). The Pillar Select Layer includes two oxide layers 520 with a gate material layer 522 sandwiched there between. The oxide layers 520 can be $SiO_2$. The metal line ML-2 526 serving as a global bit line can be implemented of any suitable material, including Tungsten, or Tungsten on a Titanium Nitride adhesion layer or a sandwich of n+ polysilicon on Tungsten on Titanium Nitride adhesion layer. Gate material 522 can be polysilicon, Titanium Nitride, Tantalum Nitride, Nickel Silicide or any other suitable material. Gate material 522 implements the row select lines $SG_x$ (e.g. $SG_1$, $SG_2$, . . . of FIG. 1), which are labeled in FIG. 10 as row select lines 580, 582, 584, 586, 588 and 590.

The memory layer includes a set of vertical bit lines 530 (e.g., comprising N+ polysilicon or a metal). Interspersed between the vertical bit lines 530 are alternating oxide layers 534 and word line layers 536. In one embodiment, the word lines are made from TiN. Between the vertical bit lines 530 and the stacks of alternating oxide layers 536 and word line layers 536 are vertically oriented layers of reversible resistance switching material 532. In one embodiment the reversible resistance switching material is made of Hafnium Oxide $HfO_2$. However, other materials (as described above) can also be used. Box 540 depicts one example memory element which includes the reversible resistance switching material 532 sandwiched between a word line 536 and vertical bit line 530. The memory elements are positioned above, and not in, the substrate. Directly below each vertical bit line 530 are the vertically oriented select devices 510, each of which comprises (in one example embodiment) a n+/p-/n+ TFT. Each of the vertically oriented select devices 504 have oxide layers 505 on each side. FIG. 10 also shows an n+ polysilicon layer 524. As can be seen, the npn TFT of vertically oriented select devices 504 can be used to connect the global bit line GBL (layer 526) with any of the vertical bit lines 530.

FIG. 10 shows six row select lines ($SG_x$) 580, 582, 584, 586, 588 and 590 in the gate material layer 522, each underneath a stack of multiple word lines. As can be seen, each of the row select lines 580, 582, 584, 586, 588 and 590 is positioned between two vertically oriented select devices 504, above and not in the substrate. Therefore each row select line can serve as the gate signal to either of the two neighboring vertically oriented select devices 504; therefore, the vertically oriented select devices 504 are said to be double gated. Each vertically oriented select device 504 can be controlled by two different row select lines, in this embodiment. One aspect of the vertically oriented select devices incorporated to the base portion of each bit line pillar is that two adjacent vertically oriented select devices share the same gate region. This allows the vertically oriented select devices to be closer together.

Figure 11:
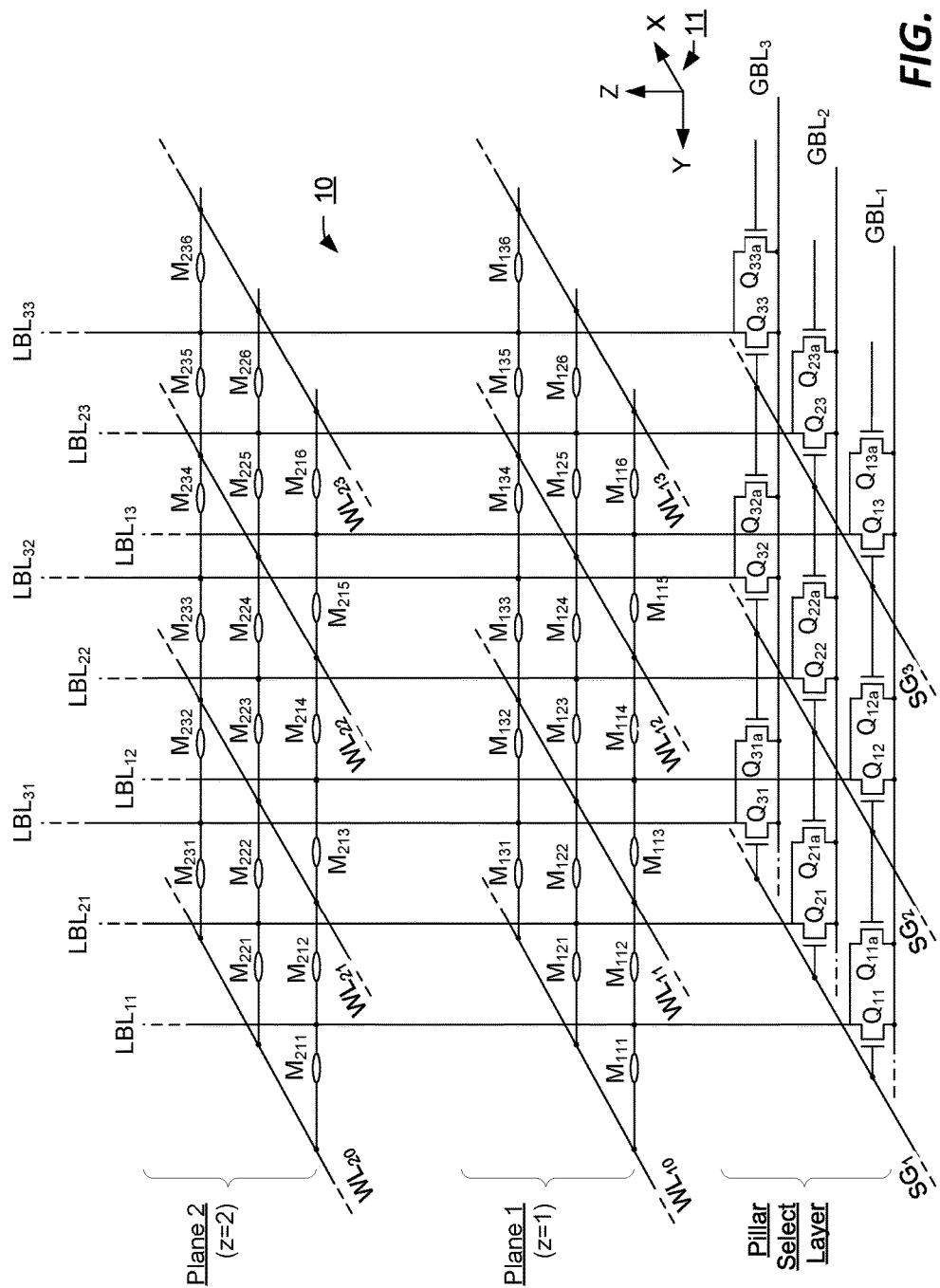
FIG. 11 is a schematic of a portion of the memory system, depicting vertical bit lines and vertically oriented select devices above the substrate.

FIG. 11 is a partial schematic of the memory system of FIG. 10 depicting the above-described double-gated structure for the vertically oriented select devices 504. Planes 1 and 2 of FIG. 11 are the same as in FIG. 1. As can be seen, each local bit line LBL is connectable to a respective global bit line GBL by two row select signals. FIG. 11 shows two transistors connecting to each local bit line. For example, transistor $Q_{11}$ can connect local bit line $LBL_{11}$ to global bit line $GBL_1$ in response to row select line $SG_1$ and transistor $Q_{11a}$ can connect local bit line $LBL_{11}$ to global bit line $GBL_1$ in response to row select line $SG_2$. The same structure is used for the other local bit lines depicted in FIG. 11.

Figure 12:
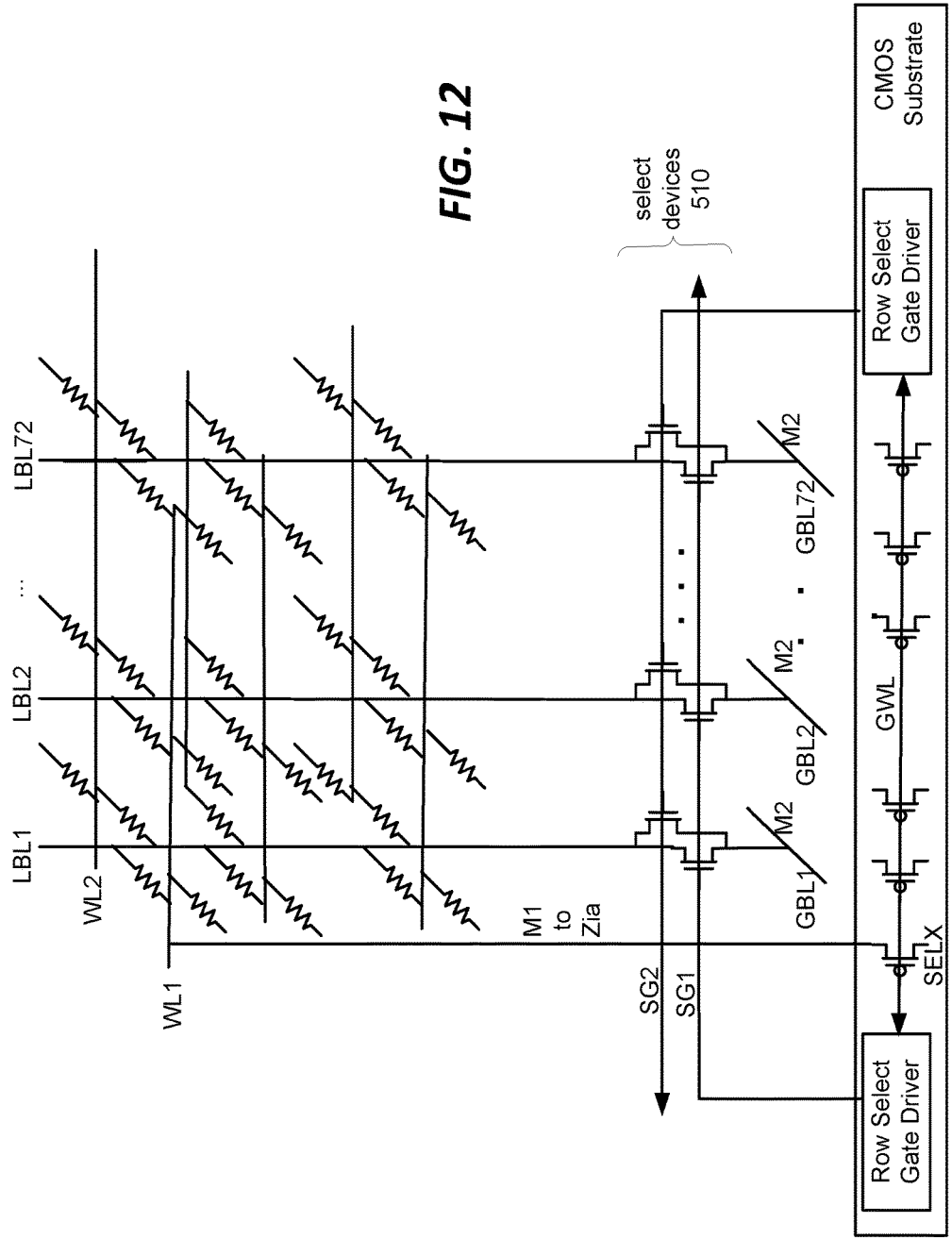
FIG. 12 is a schematic of a portion of the memory system, depicting vertical bit lines, vertically oriented select devices above the substrate and row select line drivers in the substrate.

FIG. 12 shows another partial schematic also depicting the double-gated structure such that each local bit line (LBL1, LBL2, . . . LBL72) are connected to their respective global bit lines (GBL1, GBL2, . . . GBL72) by any of two respective vertically oriented select devices that are positioned above the CMOS substrate. As can be seen, while the double-gated structure of FIG. 10 includes positioning the various select devices 504 above the substrate, the Row Select Line Drivers providing the row select lines $SG_1$, $SG_2$, . . . are positioned in the substrate. Similarly, the global word lines (e.g., GWL) are position in a metal layer on the substrate and below the vertically oriented select devices. Furthermore, as will be explained below, in one embodiment the Row Select Line Driver uses the appropriate global word line GWL as an input.

The structure of FIG. 10 presents various fabrication specifications to be met in order to realize a functional device. Accordingly, an architecture is presented having vertical TFT select devices with unique spacer-based gate formations and arrangements of the vertical TFT layers. A fabrication is provided to enable precise control of the gate to source/drain overlap for the select devices. A controlled positioning of the gate lower endpoint region is provided. In various embodiments, a gate dielectric layer is formed after the layers for the vertical TFT select devices are formed and at least partially etched. The gates are separated horizontally from the select devices by the gate dielectric layer. Moreover, the gate can be positioned over the gate dielectric layer in one example, defining the lower endpoint of the gate. An additional dielectric base can be incorporated to provide further isolation between the gate and global bit line.

Figure 13:
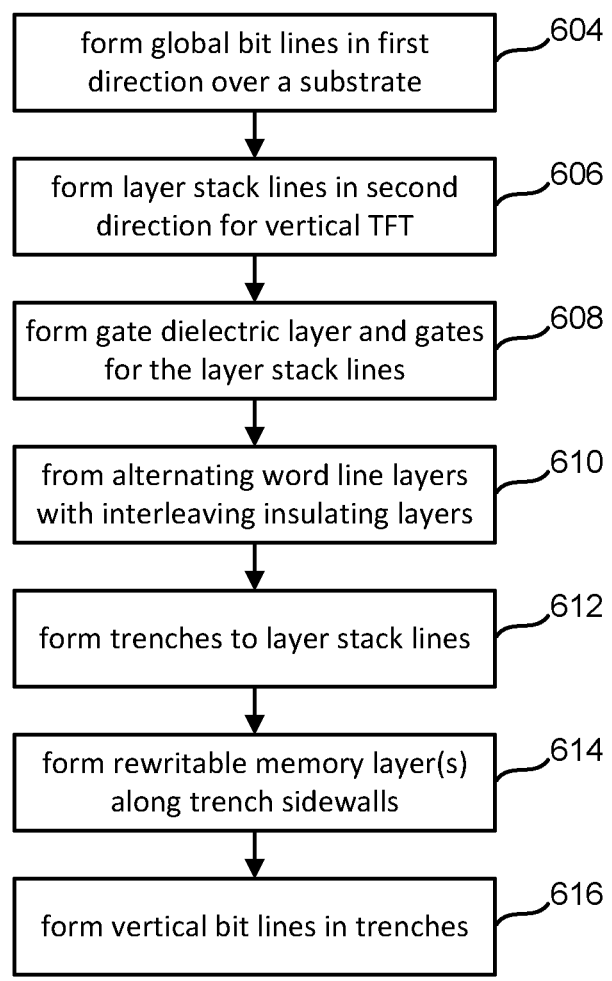
FIG. 13 is a flowchart describing a method of fabricating a three-dimensional memory having vertical bit lines and vertical TFT select devices in accordance with one embodiment.

FIG. 13 is a flow chart describing a process of fabricating a three-dimensional memory array in accordance with one embodiment. The process in FIG. 13 can be performed after manufacturing metal layers and substrate layers (e.g., drivers and other logic). For example, the process of FIG. 13 can follow zero ML-0 and first ML-1 metal layer manufacturing processes. In one example, the process may be preceded by forming a base oxide (e.g., 600 nm).

Figure 14A:
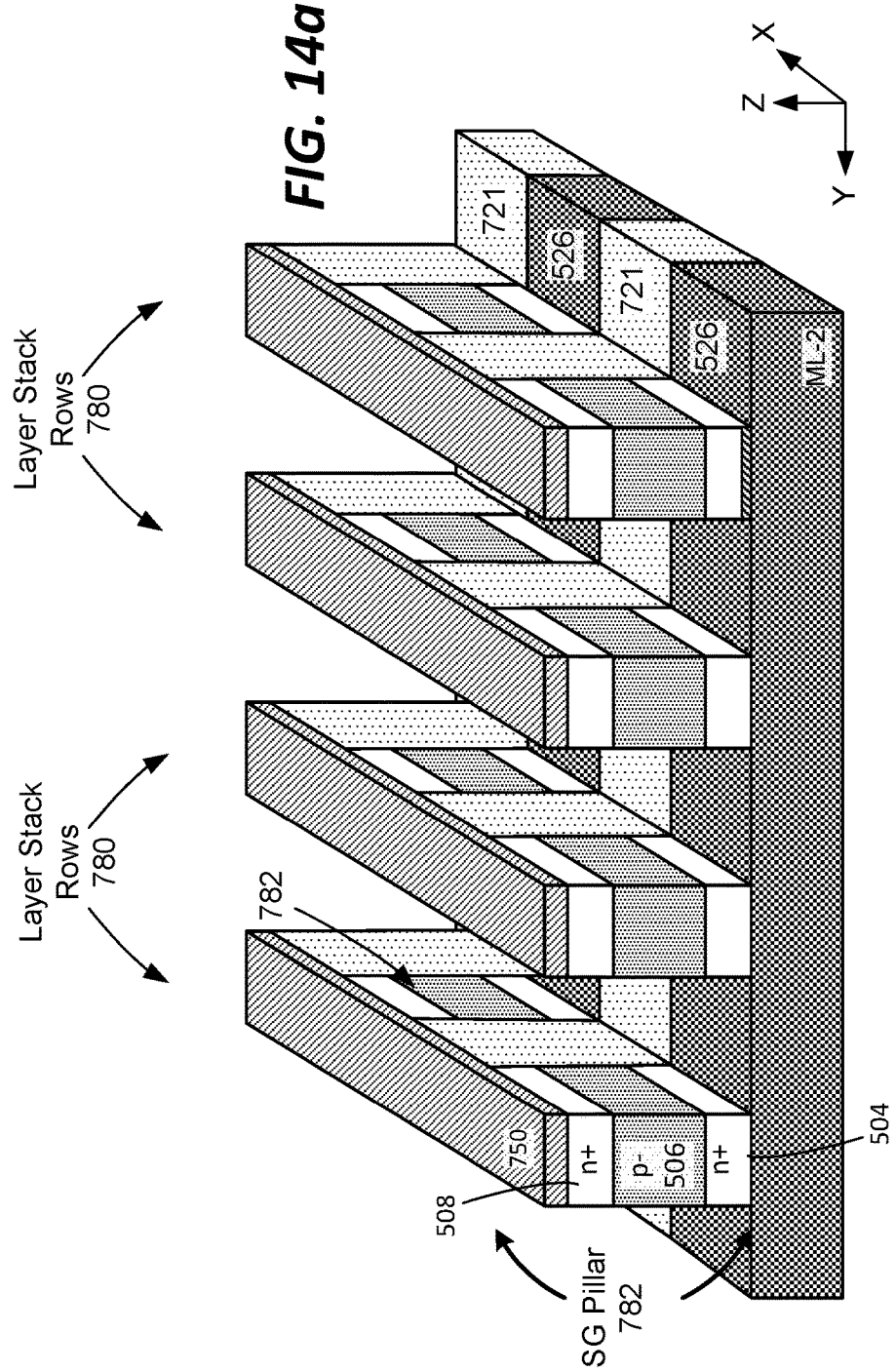

At step 604, global bit lines are formed that are elongated in a column direction over the previously formed layers and the substrate. At step 606, layer stack lines for a pillar select layer are formed over the second ML-2 metal layer. FIG. 14*a* depicts the results of step 604 and 606 in one embodiment. Four layer stack lines 780 (also called layer stack rows), each containing two select gate (SG) or select device pillars 782 are shown. It is noted that a typical memory will include many more pillar select lines and within each pillar select line, many more select device pillars. The layer stack lines are elongated in the row or x-direction, orthogonal to the global bit lines which extend in the column or y-direction. The global bit lines may include one or more metal layers such as a layer of tungsten (W) (e.g., 150 nm) between two layers of titanium nitride (TiN) (e.g., 20-100 nm) in one example. Additional layers such as and n+ polysilicon layer may be included in the bit lines. Various processes as described may be used to pattern and form the layer stack lines and bit lines. The global bit lines are separated by dielectric strips 721 formed from an oxide or other insulating material. Over the global bit lines 526 and dielectric strips 721 are layer stack rows 780 that are elongated in the x-direction. Each layer stack row includes a plurality of select device pillars 782. Each pillar is separated from adjacent pillars in the same line by an insulating material. The insulating material may be formed from the same or a different material than strips 721 as later described.

Each select gate pillar includes a lower n+ region (e.g., 30 nm) forming the lower S/D region for the select device, a p– region (e.g., 120 nm) forming the body, and an upper n+ region (e.g., 50 nm) forming the upper S/D region. Note that the upper S/D region is a drain in one example and the lower S/D region is a source. In other example, the upper S/D region is a source and the lower S/D region is a drain. As described above, different configurations and materials may be used to form the body and S/D regions. Each pillar may also include metal (e.g., TiN) and dielectric (e.g., SiN) regions (not shown). The metal region may be used to form a contact to the overlying vertical metal bit line, for example. These regions are optional and are not included in other embodiments. Each pillar stack line includes a strip 750 of hard mask material such SiN overlying the pillar stack line. The strip 750 of hard mask material may be used in etching to form the pillar stack lines, for example. In one example, the hard mask material is a metal such as tungsten and/or TiN that serves as a mask and also enables contact to the metal bit lines. Furthermore, the metal hard mask may provide a suitable etch stop for forming trenches in which the metal bit lines are formed.

Figure 14B:
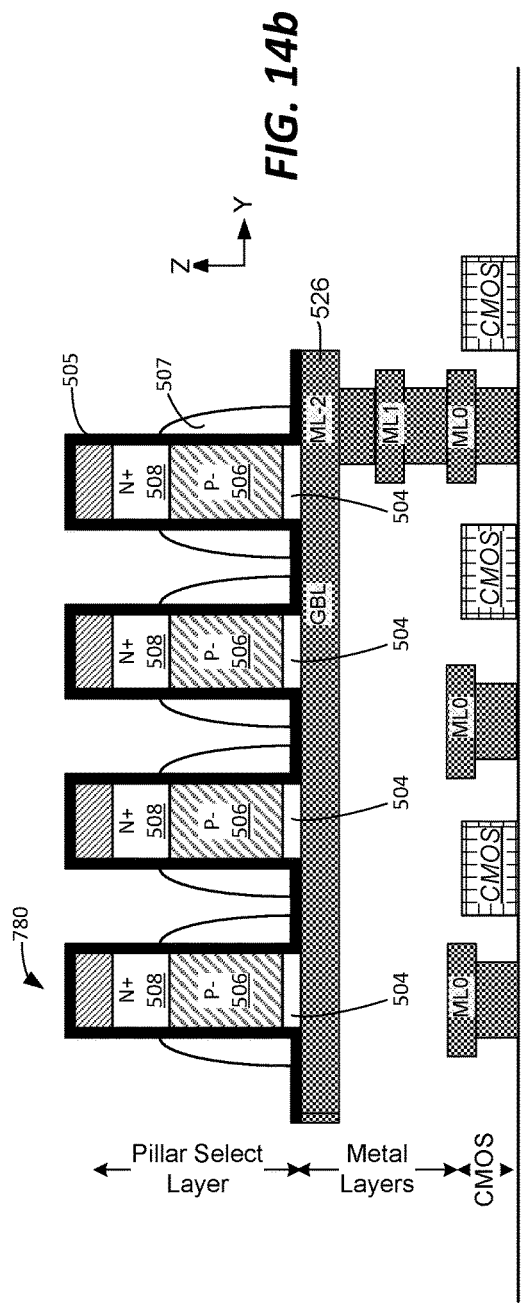
Figure 14C:
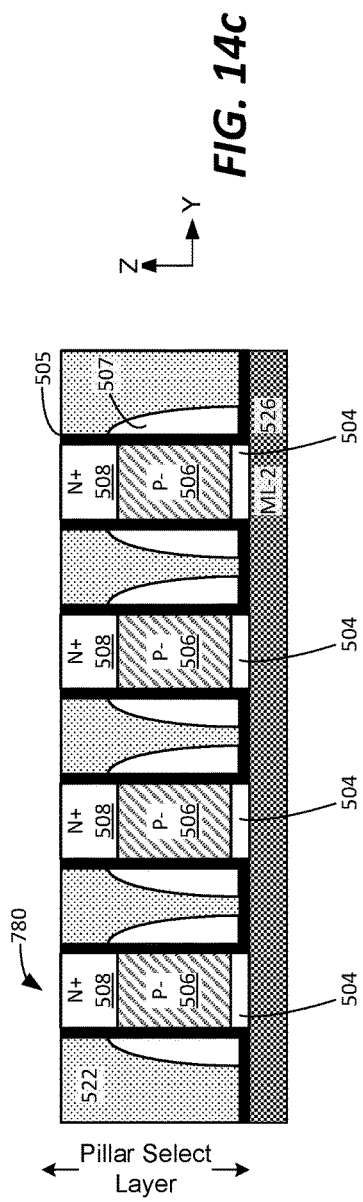

At step 608, a gate dielectric layer and gates for the select devices are formed. FIG. 14*b* is a cross-sectional view along a line in the y-direction through a column of select devices depicting the results of step 608 in embodiment. The gate dielectric layer 505 layer extends over the upper surface and along the vertical sidewalls (elongated in the x-direction) of each select device pillar. In one example, gate dielectric layer 505 is an oxide such as silicon oxide or hafnium oxide formed by atomic layer deposition (ALD). In another example, gate dielectric layer 505 is a thermally grown oxide. Conformal deposition can be used to form a dielectric layer between approximately 3 and 10 nanometers in thickness in one example. The gate dielectric layer 505 extends horizontally between the adjacent layer stack lines over the underlying global bit line 526. Although not shown in FIG. 14*b*, an optional base dielectric region can be formed before or after the gate dielectric to provide further isolation between the gates 507 and the global bit lines 526.

A gate layer is formed and etched back to form individual gates that extend vertically along the vertical sidewalls of the layer stack lines. Etching back the gate material removes horizontal portions of the gate material to leave sidewall spacers. Each sidewall spacer forms one gate 507. The gates 507 are separated from the pillar stack lines by the gate dielectric 505. In this example, gates 507 may be referred to as spacer gates 507 due to their formation by conformal deposition and etch back as associated with spacer-formation processes. Any suitable etch back process may be used. In the x-direction, the gates extend along each layer stack row to form gates for each select device formed in the line. In the vertical or z-direction, the upper surface of the gates may extend beyond the upper S/D junction between the p– body region and the upper n+ S/D region. The gates extend vertically toward the substrate, having a lower surface that extends beyond the lower S/D junction between the p– body region and the lower n+ S/D region. The gate bottom height refers to the vertical distance between the lower surface of the gate and the upper surface of the global bit line. The gate bottom height is controlled by the ALD process for the gate dielectric deposition in one example. This can provide precise control to position the bottom of the gate relative to the lower junction. In one example, the gate is formed by depositing 60 nm of TiN, and etching back 135 nm to leave the spacers.

At step 610, alternating word line and interleaving insulating layers are formed over the layer stack lines as part of the memory layer. FIG. 14*d* depicts the results of step 610 in one embodiment. In FIG. 14*d*, a gap fill dielectric 522 such as SiO2 is formed, followed by etching to form a planar flat surface that exposes the upper surface of the layer stack lines. The etching, which may include CMP, can remove the hard mask material. In another example, the hard mask material or some portion thereof may remain after etching back.

The memory layer is formed after etching back the oxide. The memory layer includes alternating oxide layers 534 and word line layers 536 in this example. In one embodiment, the word lines are made from TiN. In one example, the TiN has a vertical thickness of 10 nm and the oxide has a vertical thickness of 7 nm but other dimensions may be used.

At step 612, trenches or channels are etched in the memory layer. One or more hard mask layers can be patterned to form lines in the x-direction that cover the memory layer at positions between the layer stack lines. Using the hard mask, the memory layer can be etched to form a trench having a bottom that exposes the upper surface of each layer stack line. FIG. 14*e* depicts the results of step 612 in one embodiment. Trenches 531 are etched in the memory layer, through the word line and insulating layers to expose the upper surface of the layer stack lines.

Figure 14F:
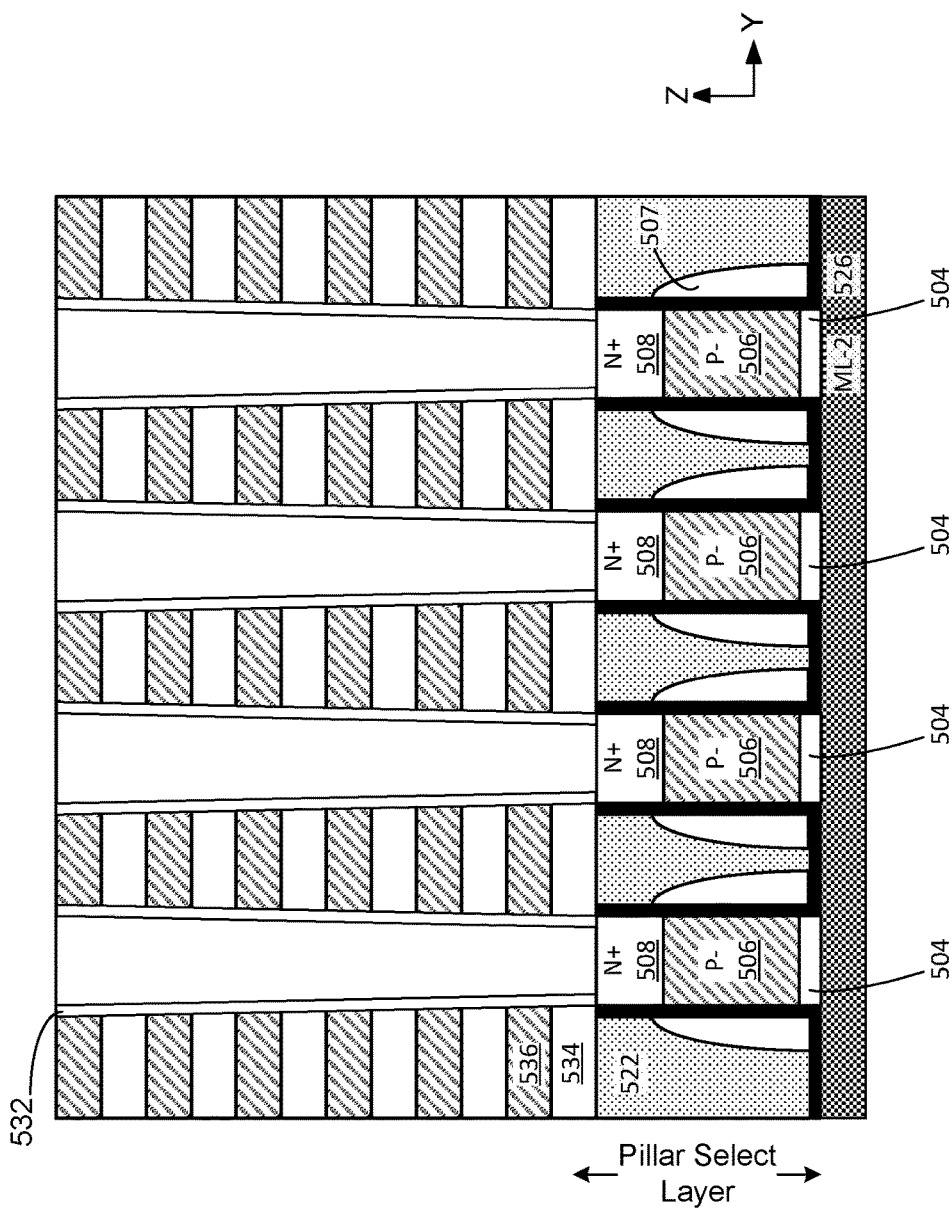

At step 614, one or more rewritable memory layers are formed in the trenches. FIG. 14*f* depicts the results of step 614 in one embodiment. Rewritable material 532 is conformally deposited to line the sidewalls of the trenches. In one example, the rewritable material may be deposited and etched back to remove the horizontal portions of the rewritable material that overlie the layer stack lines.

Figure 14G:
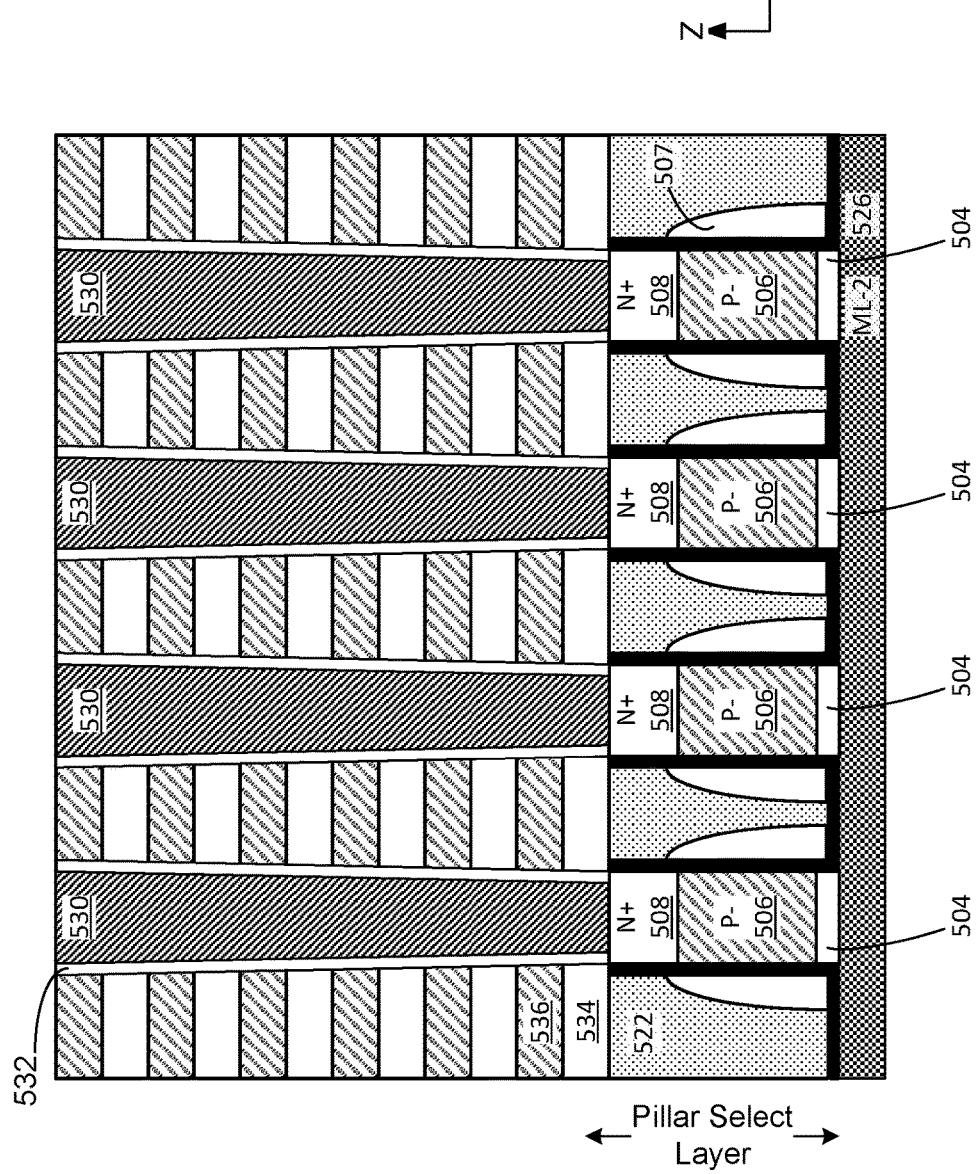

At step 616, vertical bit lines are formed in the trenches. FIG. 14*g* depicts the results of step 616 in one embodiment. One or more conductive layers are deposited and/or grown to fill the trenches. In one embodiment, the conductive layers include highly-doped N+ polysilicon. In another embodiment, the conductive layers include metals such as Tungsten and/or Titanium Nitride (TiN). Combinations of these material can also be used.

Figure 15:
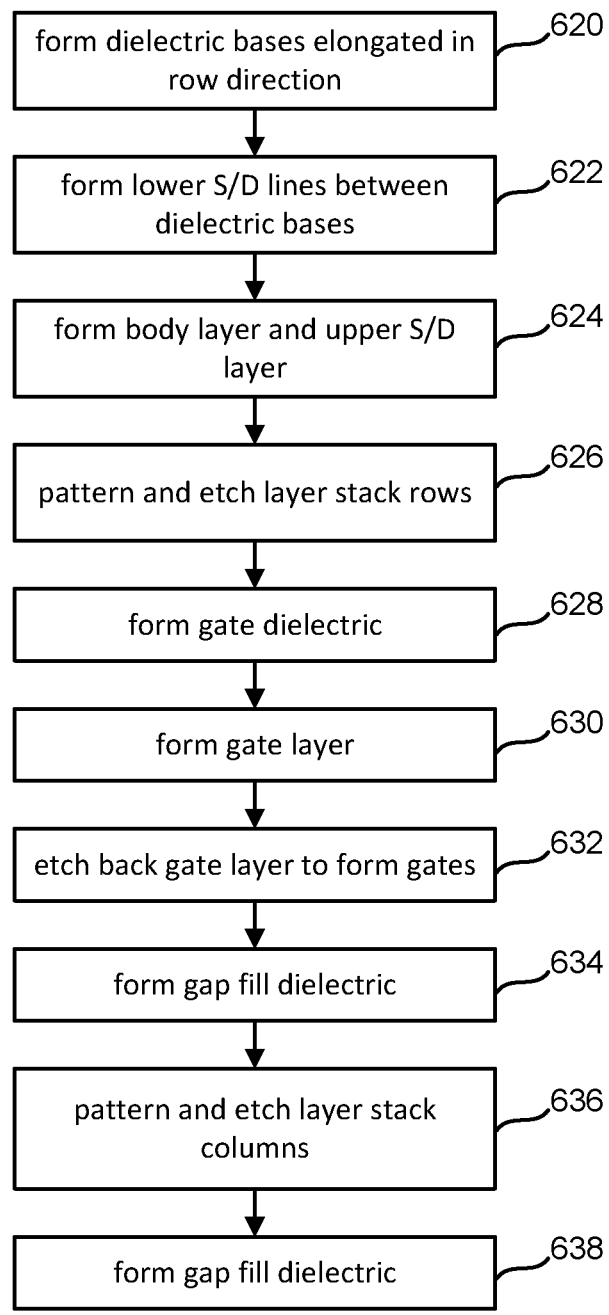
FIG. 15 is a flowchart describing a method of fabricating vertical TFT select devices including a two-step TFT and gate-first approach in accordance with one embodiment.

FIG. 15 is a flowchart describing a process of fabricating the pillar select layer for a three-dimensional memory device in accordance with one embodiment. In this example, a two-step process is provided for the formation of the select device layers Additionally, a gate-first implementation is provided whereby the gates for the select devices are fabricated before etching to define a dimension of the select device bodies in the column direction.

At step 620, a dielectric base layer is formed over a set of global bit lines that extend in a column direction over a substrate, including one or more CMOS layers and metal layers for example. FIG. 16b depicts the results of step 620 in one embodiment. The dielectric base layer is patterned and etched into dielectric bases 520 that extend in a row direction, orthogonal or another degree of offset from the global bit lines. In one embodiment, the dielectric base regions define a lower endpoint of the gates. In another embodiment, dielectric base regions, along with an overlying gate dielectric defines the lower endpoint. The dielectric base layer is SiO2 in one example, formed by chemical vapor deposition (CVD) although other materials and processes may be used. Chemical vapor deposition (CVD) processes, metal organic CVD processes, physical vapor deposition (PVD) processes, atomic layer deposition (ALD) processes, or other suitable techniques can be used to form the various layers described herein except where otherwise noted.

At step 622, a lower source/drain (S/D) layer is formed. FIG. 16c depicts the results of step 622 in one example. The lower S/D material can be deposited between the adjacent base regions and over the base regions, followed by etching back or polishing (e.g., CMP) to form lower S/D lines 704 that extend in the row direction in one example. The lower S/D material is N+ heavily doped polysilicon (e.g., 300 nm) in one example, but other materials can be used as earlier described. In this example, the lower S/D lines 704 are recessed with an upper surface that is planar with the base regions 520. In another example, the lower S/D lines may be recessed below the base regions. In one embodiment, a pre-clean is performed after forming the lower S/D lines, which recesses the oxide lines such that the lower S/D lines may extend above the oxide lines. In one example, the lower S/D layer has a vertical thickness of 300 nm when deposited, which may be etched back to 50 nm or less. Other dimensions may be used.

At step 624, a body layer and upper S/D layer are formed. FIG. 16b depicts the results of step 624 in one example. The body layer is a layer of P– silicon and the upper S/D layer is a layer of N+ silicon. In one example, the body layer has a vertical thickness of 120 nm, and the upper S/D layer has a vertical thickness of 50 nm.

At step 626, the layer stack is patterned into layer stack lines that are elongated in the row (second) direction. FIG. 16e depicts the results of step 626 in one embodiment. One or more hard mask layers (e.g., SiO2), are deposited and patterned into lines 750 that extend orthogonal to the global bit lines. Using the hard mask lines, the upper S/D layer 718 is etched into upper S/D lines 708 and the body layer 716 is etched into body lines 706. The mask targets a line over the predefined lower S/D lines 704. Although alignment between the vertical sidewalls of the structures is depicted, some mis-alignment can be tolerated. In FIG. 16e, the dielectric bases 520 are over-etched to further recess their upper surface above the upper surface of the lower S/D lines 704. The base region upper surface can be targeted with an offset from the lower S/D lines that is equal to the thickness of the later-formed gate dielectric in one example.

At step 628, a gate dielectric is formed. FIG. 16f depicts the results of step 628 in one example. The gate dielectric layer 505 layer extends over the upper surface and along the vertical sidewalls (elongated in the x-direction) of each select gate pillar.

At step 630, the gate layer is formed. At step 632, the gate layer is etched back to form gates for the select device pillars. FIG. 16g depicts the results of steps 630 and 632 in one embodiment. The gate material covers the gate dielectric 505, extending vertically with the gate dielectric along the vertical sidewalls of the select gate pillars and over the upper surface of the gate dielectric at the top of each pillar. In one embodiment, the gate material is TiN. In another embodiment, the gate material is polysilicon. In other example, any of the gate materials described above may be used.

The gate layer is etched back to form individual gates 507 that extend vertically along the vertical sidewalls of the layer stack lines. Etching back the gate material removes horizontal portions of the gate material to leave sidewall spacers. Each sidewall spacer forms one gate 507. The gates 507 are separated from the pillar stack lines by the gate dielectric 505. In the x-direction, the gates extend along the layer stack lines to form gates for each select gate formed in the line. In the vertical or z-direction, the upper surface of the gates may extend beyond the upper S/D junction between the P– body region and the upper N+ S/D region. The gates extend vertically toward the substrate, having a lower surface near the junction of the lower S/D region and the body. In another example, the lower surface extends beyond the lower S/D junction between the P– body region and the lower N+ S/D region.

Figure 16H:
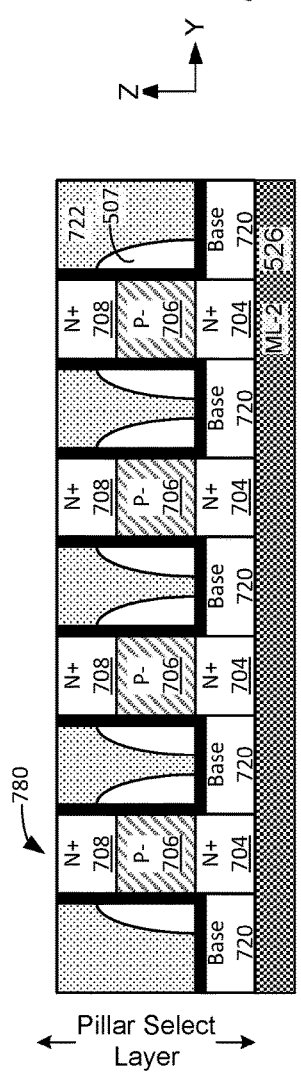
Figure 16I:
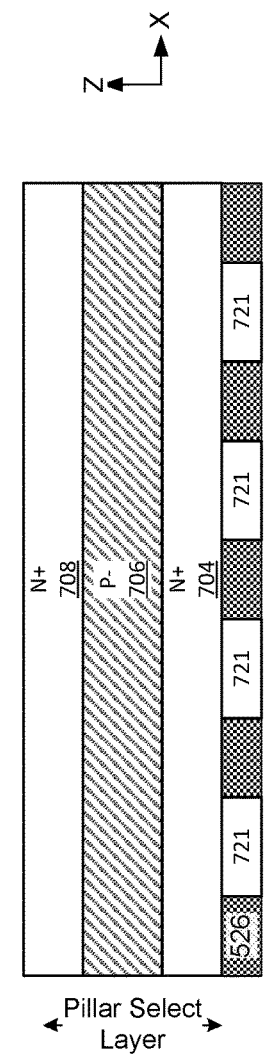

At step 634, a gap fill dielectric is formed. FIG. 16h depicts the results of step 634 in one example. A gap fill dielectric 722 is formed and then etched back to expose the upper surface of each layer stack line. In one example, the gap fill dielectric is a high density plasma (HDP) oxide, deposited to a thickness of 300 nm, then etched back 150 nm to expose the upper surface of the upper S/D region. In another example, the etch back may leave and expose the hard mask lines 750, for example where a conductive mask is used. FIG. 16i is a cross-sectional view taken along a line in the x-direction, depicting the pillar stack layer after step 634.

At step 636, the layer stack is patterned and etched into second layer stack lines that are elongated in the column direction. The pattern may target a line overlying the global bit lines, with a space corresponding to the spaces between bit lines. At step 638, a gap fill dielectric is formed after etching the layer stack.

FIG. 16j is a cross-sectional view in the x-direction showing the results of steps 636 and 638. FIG. 16k is a cross-sectional view in the y-direction showing the results of steps 636 and 638. The upper S/D lines 708 have been etched into upper S/D regions 508 for each select device pillar. The body lines 706 have been etched into the body 506 for each select device pillar. The lower S/D lines 704 have been etched into the lower S/D regions 504 for each select device pillar. A gap fill dielectric 522 such as SiO2 is formed and etched back to again expose the upper surface of the upper S/D regions for eventual contact with the vertical bit lines.

After forming the gap fill material, processing may continue as described in steps 610-616 of FIG. 13 to form the overlying memory layer and vertical bit lines.

Figure 17:
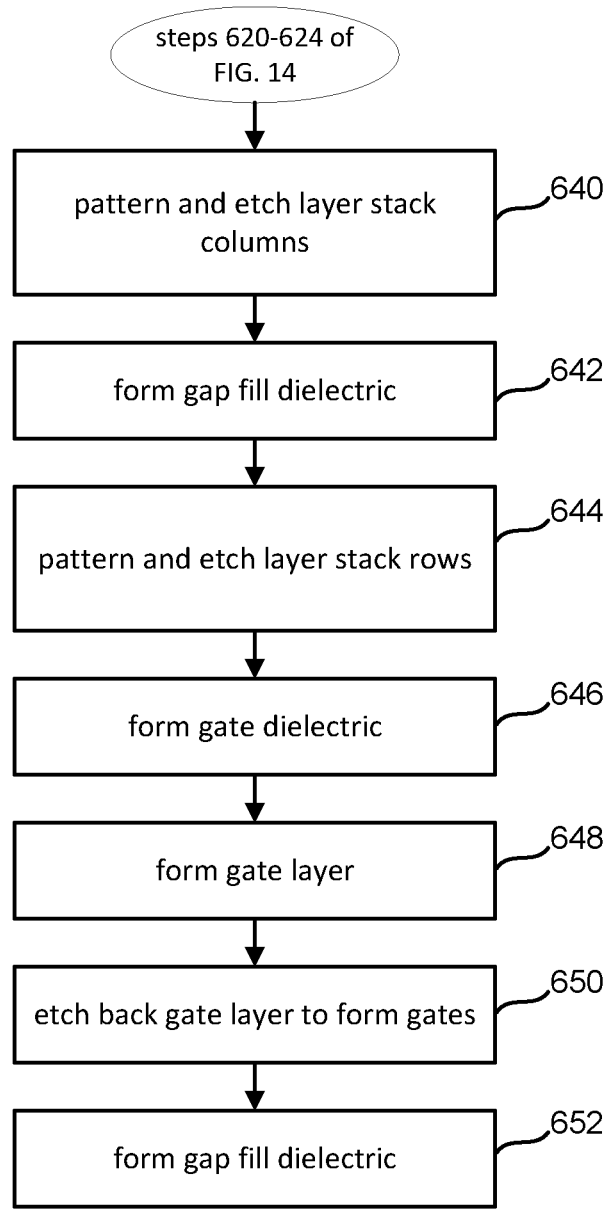
FIG. 17 is a flowchart describing a method of fabricating vertical TFT select devices including a two-step TFT and gate-last approach in accordance with one embodiment.

FIG. 17 is a flowchart describing a process of fabricating a pillar stack layer according to another embodiment. In FIG. 17, a two-step process is again used for forming lines of the select device S/D and body regions. In FIG. 17, however, a gate-last process is implemented whereby layer stack lines are first defined in a column direction parallel to the global bit lines, then in a row direction orthogonal to the global bit lines, before forming the gates that are elongated in the row direction.

The process in FIG. 17 begins as described in steps 620-624 of FIG. 15 and shown in FIGS. 16a-16d. Lower S/D lines 704 are formed in the x-direction, followed by forming a body layer 716 and upper S/D layer 718. FIG. 18a is a cross-sectional view in the x-direction depicting the results of steps 620-624.

At step 640 in FIG. 17, the layer stack is patterned and etched to form layer stack columns, parallel to the global bit lines. This may be contrasted with step 626 of FIG. 15 where the layer stack rows are first patterned, followed by patterning layer stack columns. FIG. 18b depicts the results of step 640 in one example. Layer stack columns 760 are formed that are elongated in the y-direction over the global bit lines. Although not shown, one or more hard mask layers may be patterned and used to etch layer stack columns 760. Layer stack columns are patterned and etched in the y-direction, including upper S/D lines 728 from layer 718, body lines 726 from body layer 716, and lower S/D region 504 from the previously formed lower S/D lines 704 in the row direction. It is noted that while patterning and etching of the global bit lines and overlying first layer stack lines is shown using separate processes, these layers may be patterned and etched using a common pattern in another example.

Figure 18D:
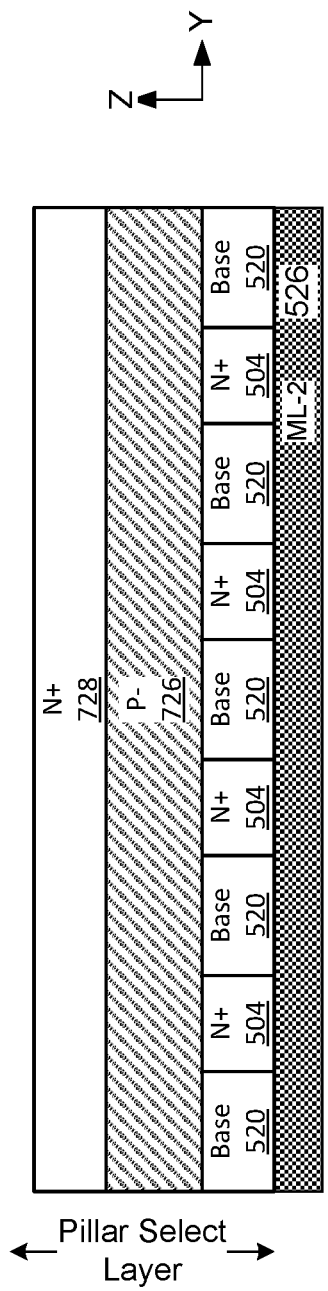

At step 642, a gap fill dielectric is formed. FIG. 18c depicts the results of step 642, after forming gap fill dielectric 722 and etching back to the upper surface of the upper S/D lines 728. FIG. 18d is a corresponding cross-sectional view in the y-direction depicting the results of step 642. An upper S/D line 728 and body line 726 are elongated in the y-direction over lower S/D regions 504 and bases 520.

Figure 18E:
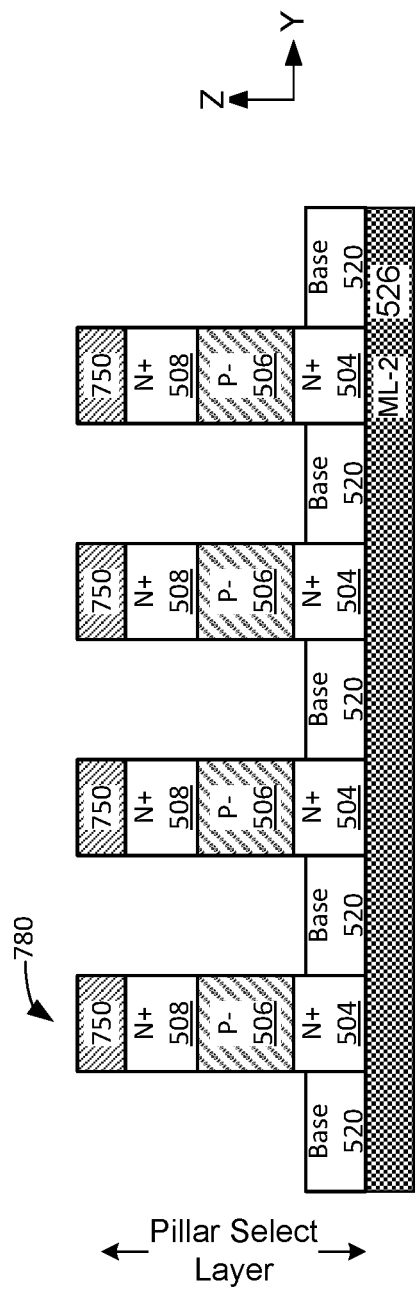

At step 644, the layer stack is patterned and etched to form layer stack rows that are elongated in the x-direction. FIG. 18e depicts the results of step 644 in one embodiment. Hard mask lines 750 are patterned and etched with a target line corresponding to the rows of lower S/D regions 504. Using the hard mask as a pattern, the upper S/D lines 728 are etched into upper S/D regions 508 and the body lines 726 are etched into bodies 506. Etching selective for the silicon layers and non-selective for oxide may be used. Etching can proceed until reaching the dielectric bases 520. In one example, the etch is selective for the dielectric base, targeting an overetch of approximately the thickness of the gate dielectric. In this manner, the lower endpoint of the gates can be precisely defined at a desired position relative to the lower S/D junction.

At step 646, one or more gate dielectric layers are formed as earlier described. At step 648, a gate layer is formed, followed by etching back at step 650. FIG. 18f depicts the results of steps 646-650 in one example. The gate dielectric layer 505 extends in the row direction along the vertical sidewalls of the layer stack rows 780. The gates 507 are formed as spacers that extend vertically along the gate dielectric layer for isolation from the body 506 and S/D regions 504 and 506.

At step 652, a gap fill dielectric is formed. FIG. 18g depicts the results of step 652 after forming a gap fill dielectric and etching back (e.g., CMP) to expose the upper surface of the hard mask lines 750. In this example, the hard mask lines may be formed of metal or another conductor to form a contact to the overlying and subsequently formed vertical bit lines. In one example, the hard mask lines include tungsten. In one example, the hard mask lines further include titanium nitride (TiN) or another layer overlying the tungsten. In another example, etching back the gap fill dielectric 522 may proceed until the upper surfaces of the upper S/D regions are exposed.

Figure 19:
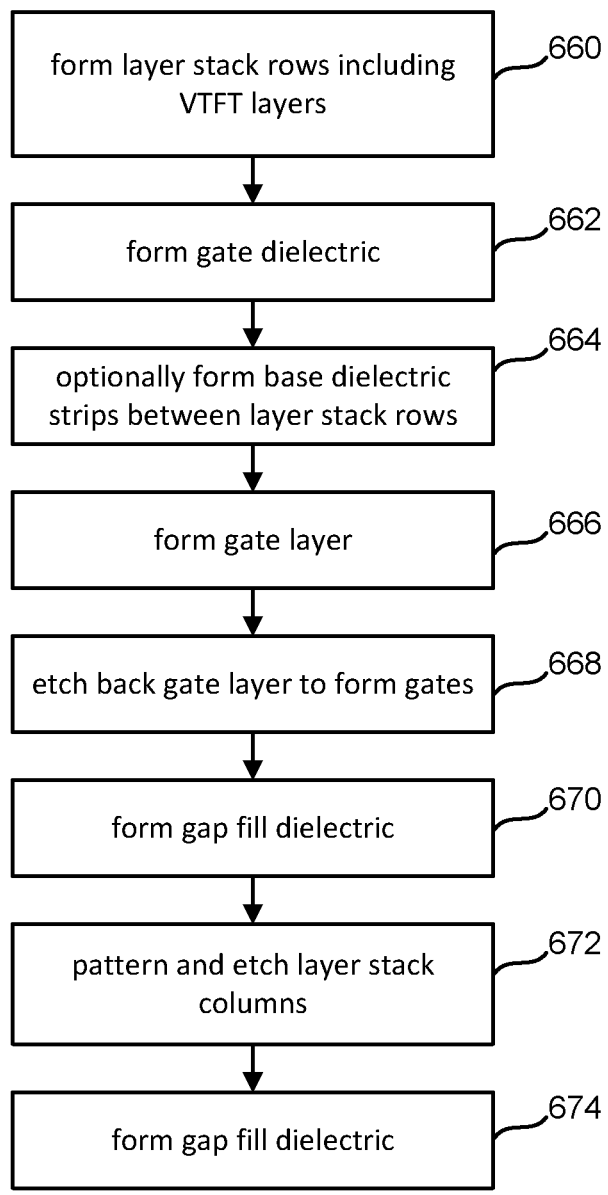
FIG. 19 is a flowchart describing a method of fabricating vertical TFT select devices including a one-step TFT and gate-first approach in accordance with one embodiment.

FIG. 19 is a flowchart describing a process of fabricating vertical TFT select devices that includes a one-step process for forming the lower S/D region, the body, and the upper S/D region. FIG. 19 incorporates a gate-first approach, whereby layer stack rows are first fabricated, followed by forming the gates, then forming layer stack columns with individual select device pillars.

At step 660, an initial layer stack is patterned and etched to form layer stack rows, orthogonal or otherwise offset from the global bit lines. FIGS. 20a-20b depict the results of step 660. FIG. 20a depicts the initial layer stack including the lower S/D layer 714, the body layer 716, and an upper S/D layer 718. FIG. 20b depicts the results of processing to form layer stack rows 780 in the x-direction. Rows include hard mask lines 750 that are patterned in the row direction, followed by etching the underlying layers. Etching forms lower S/D lines 704, body lines 706, and upper S/D lines 708 that are elongated in the row direction.

At step 662, a gate dielectric is formed. FIG. 20c depicts the results of step 662 in one example. Gate dielectric 505, such as an oxide, is formed conformally along the vertical sidewalls of the layer stack rows 780 as earlier described.

At step 664, dielectric bases are optionally formed between adjacent layer stack lines 780. Dielectric bases 520 are illustrated in FIG. 20d. Bases 520 can be used to increase the insulation between the gates and the underlying global bit lines. Additionally, bases 520 can be formed to aid in defining a lower endpoint of the gates. However, bases 520 are not required and are not included in one embodiment. For example, the gate dielectric 505 is an SiO2 gate oxide formed using atomic layer deposition to a thickness of about 5 nm. Such a gate oxide can provide adequate isolation between the gates and global bit lines in one embodiment At step 666, the gate layer is formed and at step 668 is etched back to form gates for the layer stack lines. FIG. 20e depicts the results of steps 666 and 668 in one embodiment. Gates 507 extend vertically along the vertical sidewalls of the layer stack lines 780. The gates 507 are separated from the pillar stack lines by the gate dielectric 505. In the x-direction, the gates extend along the layer stack lines to form gates for each select gate formed in the line.

Figure 20G:
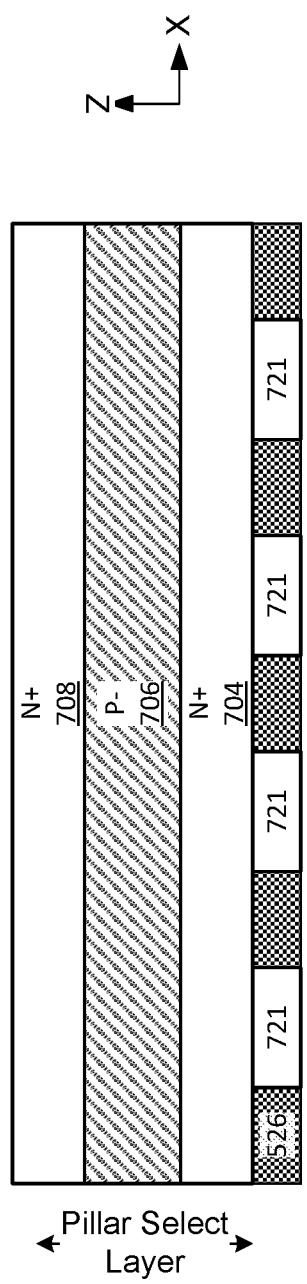

At step 670, a gap fill dielectric is formed. FIG. 20f depicts the results of step 670 in one example, with gap fill dielectric 722 deposited and etched back to expose the upper surface of each layer stack row 780. As with the earlier embodiments, the etch back process may stop at the hard mask lines 750 in other examples. FIG. 20g is a corresponding cross-sectional view taken along a line in the x-direction, depicting the layer stack after etching at step 670. A single upper S/D line 708, body line 706, and lower S/D line are shown extending over the global bit lines. step 634.

Figure 20H:
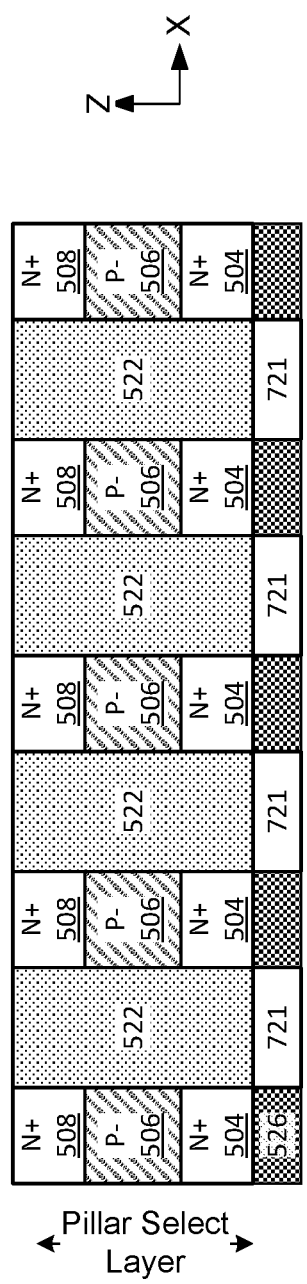

At step 672, the layer stack is patterned and etched into layer stack columns that are elongated in the y-direction. The pattern may target a line overlying the global bit lines, with a space corresponding to the spaces between bit lines. At step 674, a gap fill dielectric is formed after etching the layer stack. FIG. 20h is a cross-sectional view in the x-direction showing the results of steps 672 and 674. The upper S/D lines 708 are etched into upper S/D regions 508, the body lines 706 are etched into bodies 506, and the lower S/D lines 704 are etched into lower S/D regions 504. A gap fill dielectric 522 such as SiO2 is formed and etched back to again expose the upper surface of the upper S/D regions for contact with the vertical bit lines.

Figure 21:
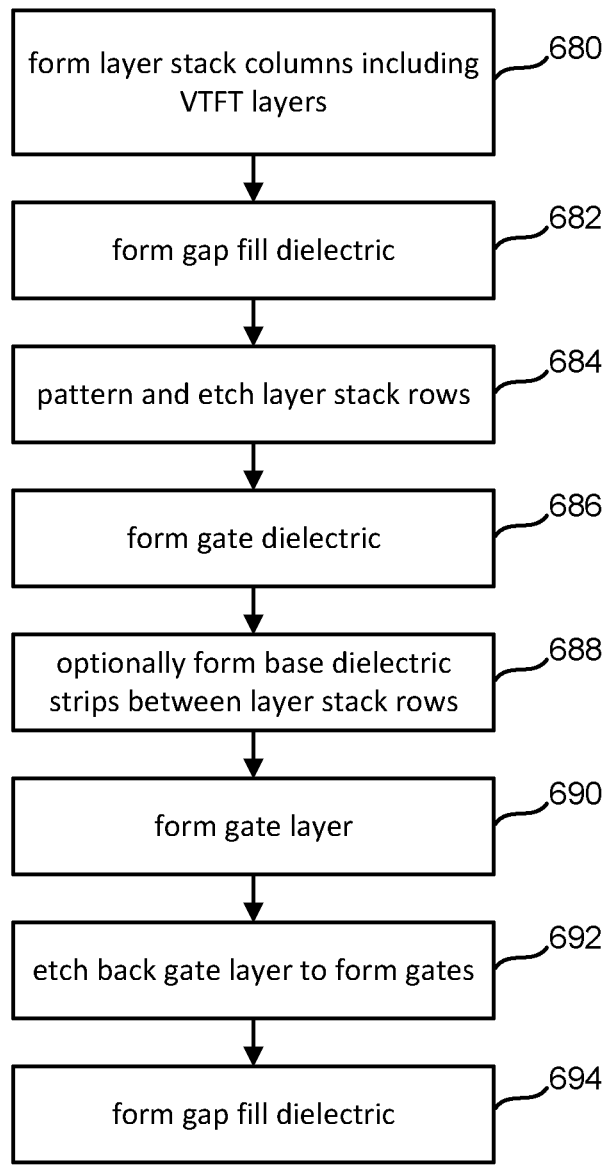
FIG. 21 is a flowchart describing a method of fabricating vertical TFT select devices including a one-step TFT and gate-last approach in accordance with one embodiment.

FIG. 21 is a flowchart describing a process of fabricating vertical TFT select devices that also includes a one-step process for forming the lower S/D region, the body, and the upper S/D region. FIG. 21 incorporates a gate-last approach, whereby layer stack lines (rows) are first fabricated in the x-direction, followed by forming the gates, then forming layer stack lines (columns) in the y-direction with individual select device pillars.

Figure 22A:
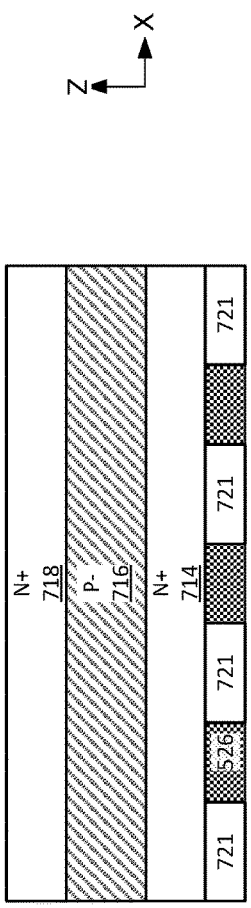
Figure 22B:
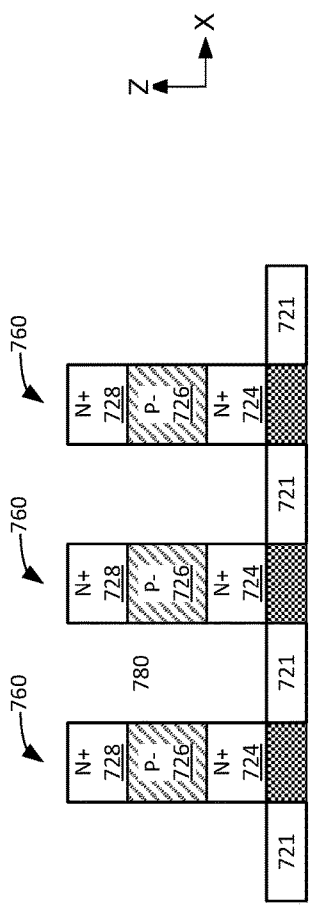
Figure 24A:
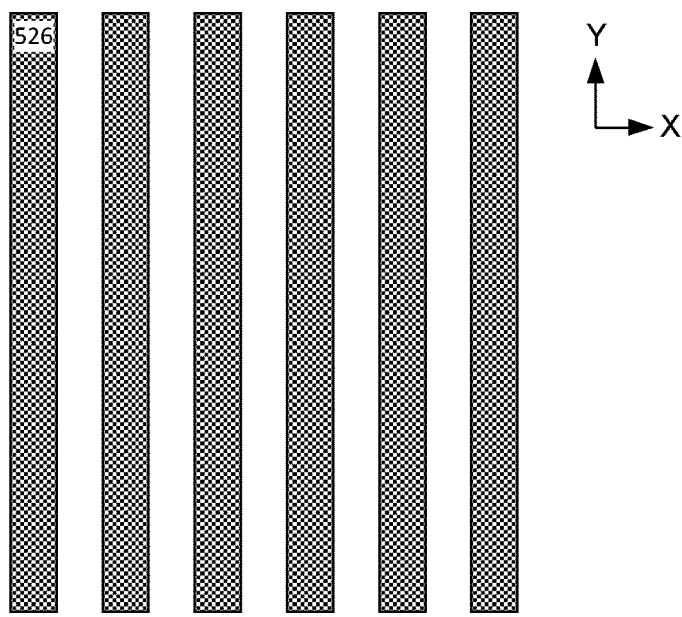
FIGS. 24a-24g are top views describing a process of forming a pillar select gate layer using a gate-last approach in accordance with one embodiment.
Figure 24B:
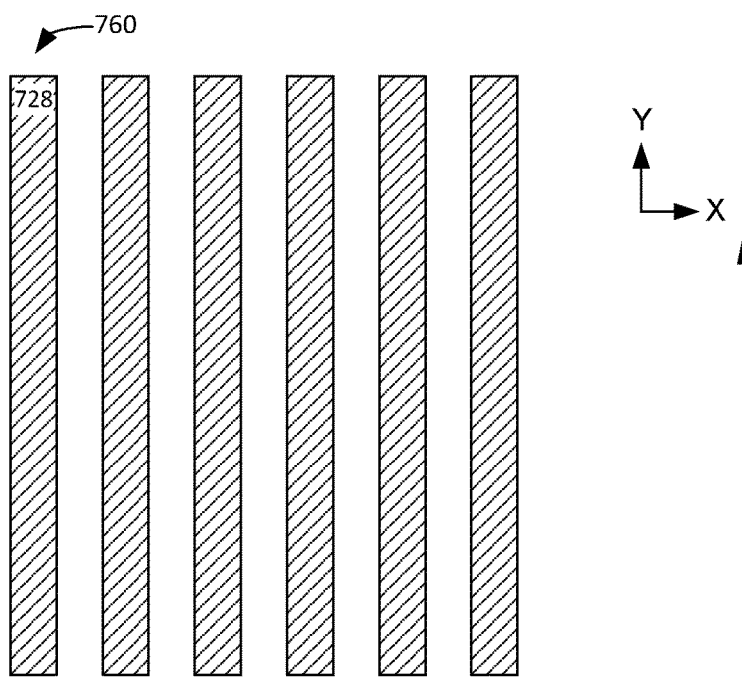

At step 680, an initial layer stack is patterned and etched to form layer stack columns in the y-direction, overlying and parallel to the global bit lines. FIGS. 22a-22b depict the results of step 680 in one example. FIG. 24a depicts the initial layer stack including the lower S/D layer 714, the body layer 716, and an upper S/D layer 718. FIG. 24b depicts the results of processing to form layer stack columns 760 in the y-direction. One or more hard mask layers (not shown) can be patterned and used to etch columns 760. Etching forms lower S/D lines 724, body lines 726, and upper S/D lines 728 that are elongated in the column direction.

Figure 22C:
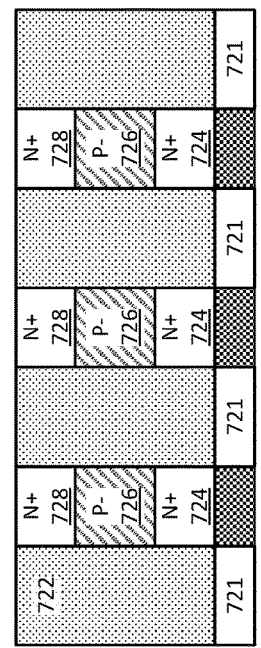

At step 682, a gap fill dielectric is formed. FIG. 22c depicts the results of step 682, in one example after forming gap fill dielectric 722 and etching back to the upper surface of the upper S/D lines 728. Although not shown, one or more hard mask layers may be patterned and used to etch layer stack columns 760. FIG. 22d is a cross-sectional view in the y-direction depicting the results of step 682. An upper S/D line 728, body line 726, and lower S/D line 724 are elongated in the y-direction over the global bit line 526.

At step 684, the layer stack is patterned and etched to form layer stack rows. FIG. 22e depicts the results of step 684 in one embodiment. Hard mask lines 750 are patterned and used to etch the upper S/D lines 728 into upper S/D regions 508, the body lines 726 into bodies 506, and the lower S/D lines 724 into lower S/D regions 504. Etching selective for the silicon layers and oxides may be used.

At step 686, one or more gate dielectric layers are formed. FIG. 22f depicts gate dielectric 505 as earlier described. At step 688, optional dielectric bases can be formed. FIG. 24g depicts the results of step 688 in one example, with bases 520 extending in the y-direction between layer stack rows and elongated in the x-direction along the length of the rows.

At step 690, a gate layer is formed, followed by etching back at step 692. FIG. 22h depicts the results of steps 690-692 in one example. The gates 507 are formed as spacers that extend vertically along the gate dielectric layer for isolation from the body 506 and S/D regions 504 and 508.

Figure 22I:
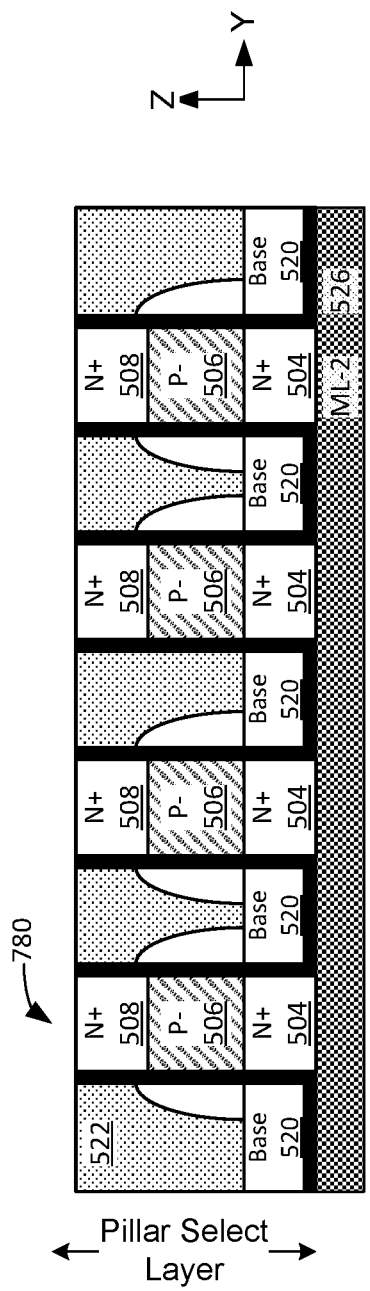

At step 694, a gap fill dielectric is formed. FIG. 22i depicts the results of step 694 after forming a gap fill dielectric 522 and etching back (e.g., CMP) to expose the upper surface of the upper S/D regions 508. In another example, hard mask lines may be formed of metal or another conductor to form a contact to the overlying and subsequently formed vertical bit lines. Accordingly, etching back at step 694 may proceed until the hard mask lines 750 are reached in another example. In this manner, the metal hard mask lines may provide an etch stop for subsequent memory processing, as well as possible contacts for the vertical bit lines to the select device upper S/D region.

FIGS. 23a-23g are top plan views depicting select layer to provide a more detailed explanation of a gate-first process such as that described in FIG. 15 (FIGS. 16a-16k) or FIG. 19 (FIGS. 20a-20h).

Figure 23A:
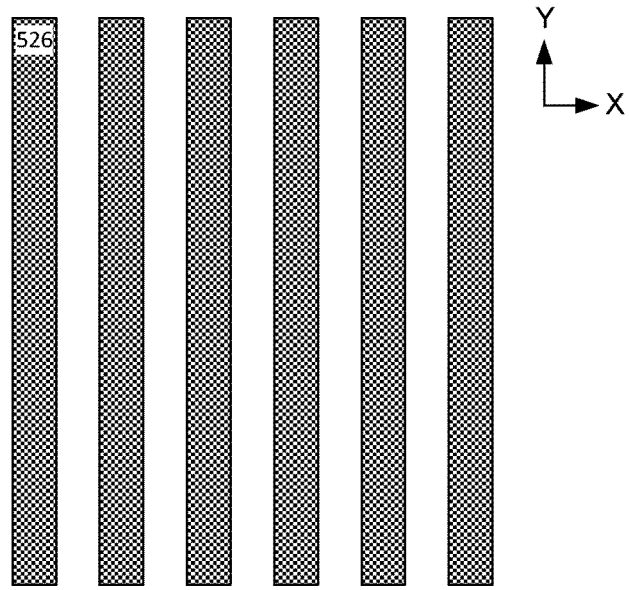
FIGS. 23a-23g are top views describing a process of forming a pillar select gate layer using a gate first approach in accordance with one embodiment.
Figure 23B:
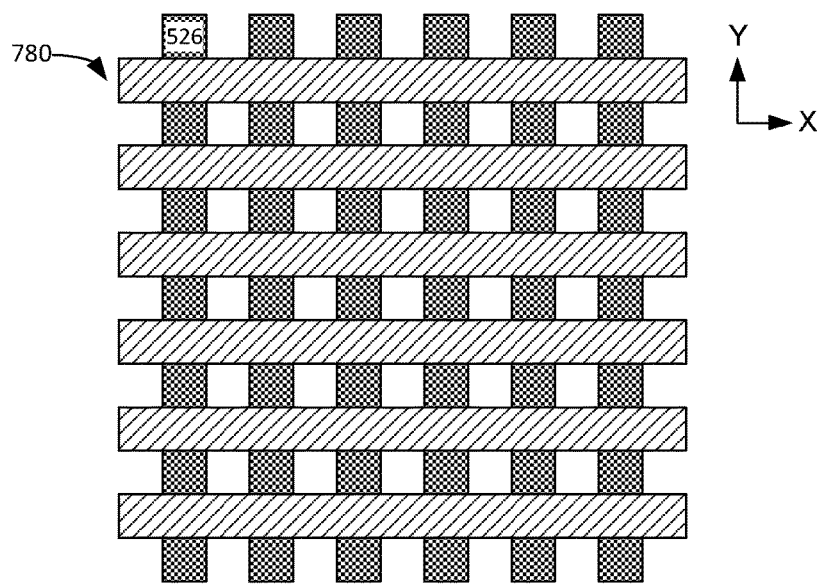

FIG. 23a is a top plan view depicting a set of global bit lines 526 that are elongated in the column or y-direction over a substrate and underlying CMOS and metal layers (not depicted). FIG. 23b depicts the results of processing to form layer stack rows 780 that are elongated in the x-direction. The layer stack rows can include lower S/D lines 704, body lines 706, and upper S/D lines 708, and one or more hard mask layers in one example.

Figure 23C:
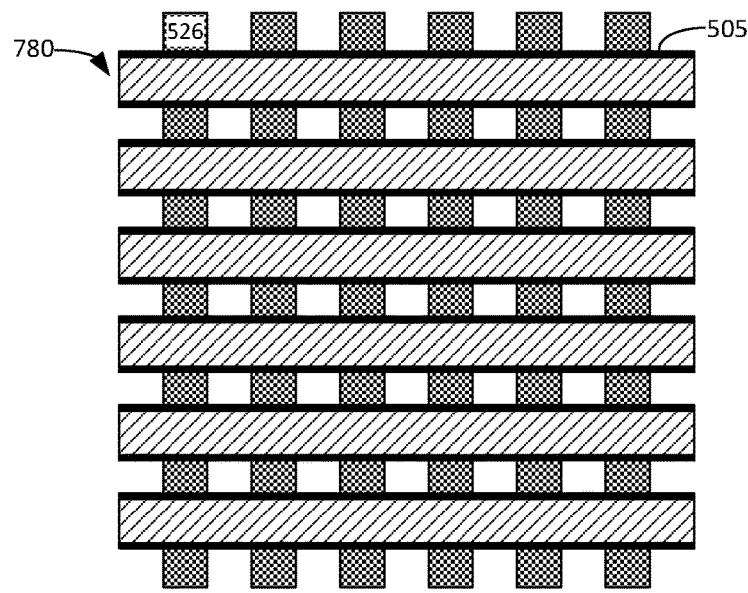
Figure 23D:
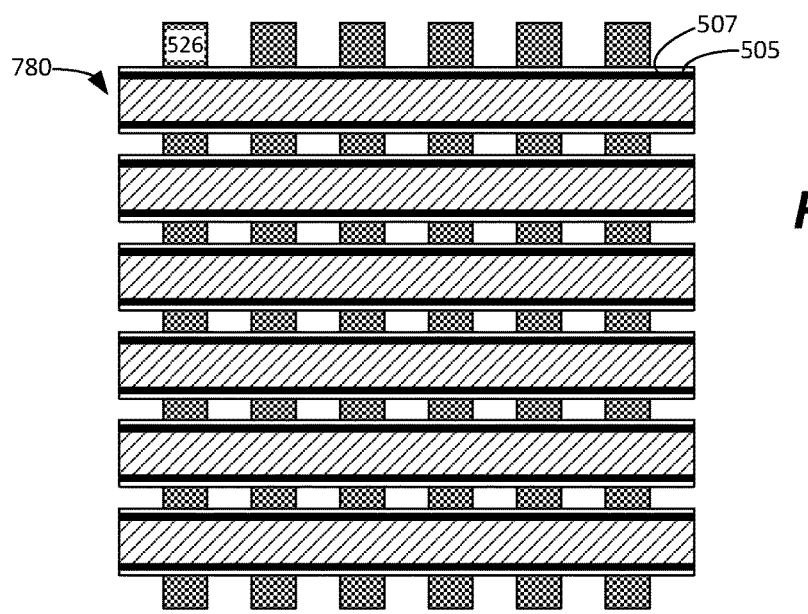
Figure 23E:
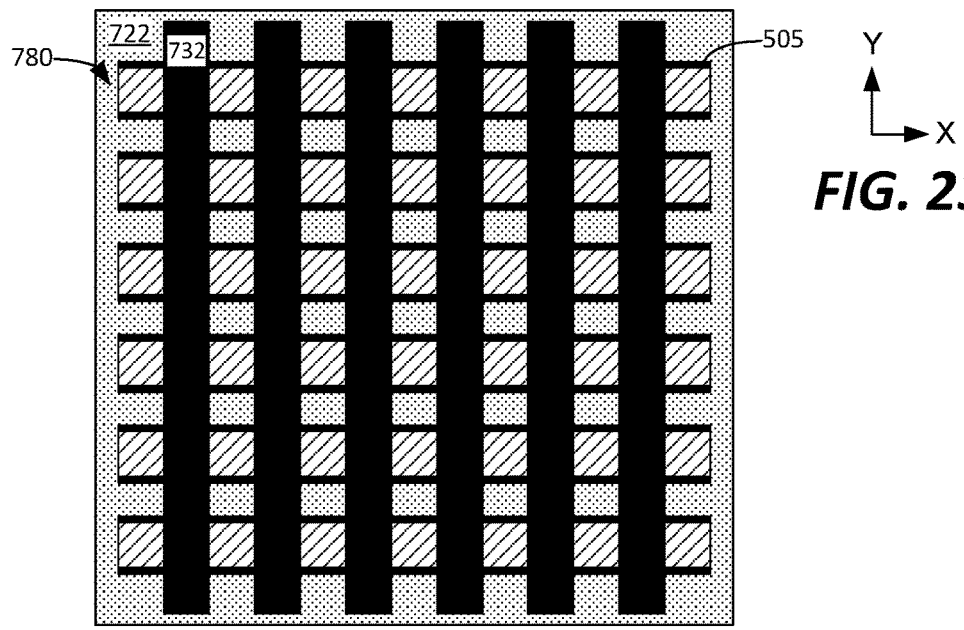

FIG. 23c depicts the results of processing to form a gate dielectric 505 which extends in the x-direction along the vertical sidewalls of the layer stack rows 780. FIG. 23d depicts the results of processing to form gates 507 that are elongated in the x-direction and separated from a corresponding layer stack row by the gate dielectric 505. FIG. 23e depicts the results of processing to form a gap fill dielectric 722. FIG. 23e additionally depicts a pattern including lines 732 that extend in the y-direction. For example, lines 732 may include hard mask strips patterned and etched using photolithography after forming the gap fill material. The lines may target the underlying global bit lines to divide layer stack rows 780 into individual pillars stacks for the select devices.

Figure 23F:
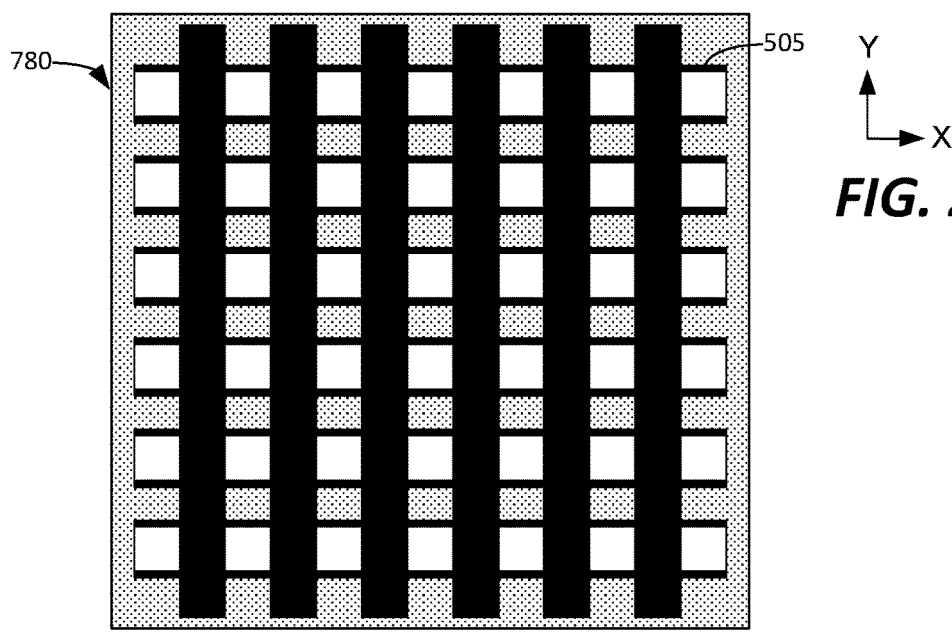

FIG. 23f depicts the results of etching to remove the exposed portions of layer stack rows 780. Etching removes the exposed portions of the S/D and body layers. In one embodiment, the etching is selective for the silicon layers and non-selective for oxide such as that of the gate dielectric 505 and fill material 722. In this manner, the gate dielectric 505 and gates 507 (underlying the gap fill dielectric 722) remain continuous in the x-direction.

Figure 23G:
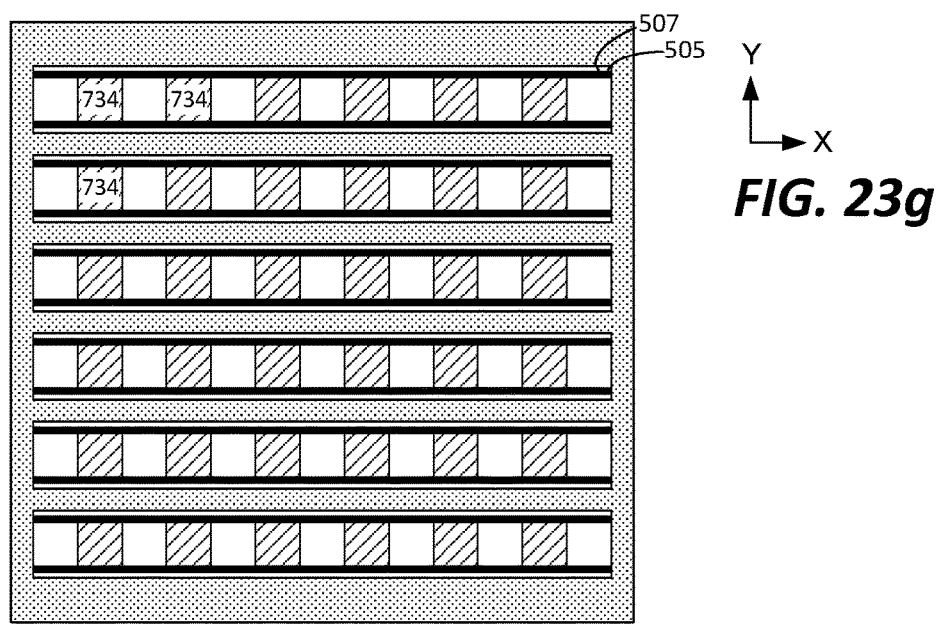

The pattern is removed as shown in FIG. 23g. Etching forms pillar stacks 734 from each layer stack row 780. Each pillar stack includes an upper S/D region 508, body 506, and lower S/D region 504 in one example. The gate dielectric 505 extends continuously in the x-direction along the vertical sidewalls of the layer stack lines. The gates also extend continuously in the x-direction, along the vertical sidewalls of the gate dielectric for isolation from the pillar stacks 734. While depicted in FIG. 23g, it is noted that the gates would be covered with the gap fill dielectric 722. An additional gap fill dielectric 522 (not shown) can be formed after removing the patterning strips.

FIGS. 24a-24g are top plan views depicting select layers during a gate-last process such as that described in FIG. 17 (FIGS. 18a-18g) and FIG. 21 (FIGS. 22a-22i).

FIG. 24a is a top plan view depicting a set of global bit lines 526 that are elongated in the column or y-direction over a substrate and underlying CMOS and metal layers (not depicted). FIG. 24b depicts the results of processing to form layer stack columns 760 that are elongated in the y-direction, overlying and parallel to the global bit lines. When used in the process of FIG. 17, the layer stack lines 760 can include a column of lower S/D regions 504, body lines 726, upper S/D lines 728, and one or more hard mask layers. When used in the process of FIG. 21, the layer stack lines can include a lower S/D line 724, body line 726, and upper S/D line 728.

Figure 24C:
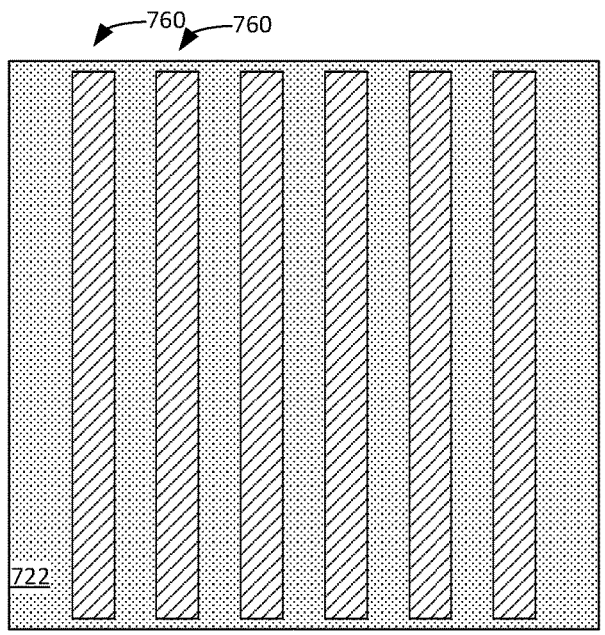
Figure 24C:
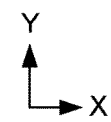

FIG. 24c depicts the results of processing to form a gap fill dielectric 722. Gap fill dielectric fills the spaces between the layer stack lines 760 and can overlie the layer stack lines. The gap fill dielectric can be etched back to expose the upper surface of the layer stack lines.

Figure 24D:
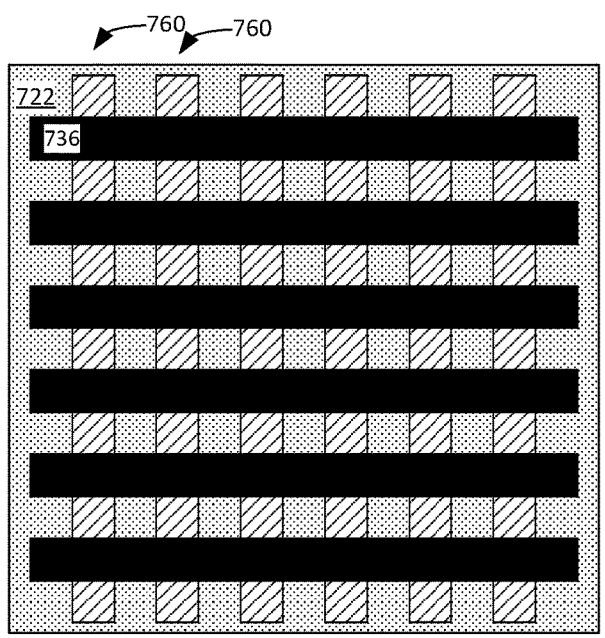
Figure 24D:
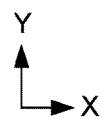

FIG. 24d depicts the results of processing to form a pattern including lines 736 that extend in the y-direction for etching the layer stack. For example, lines 736 may include the hard mask lines 750 as shown in FIG. 18e for patterning and etching to define body and upper S/D regions and FIG.

22e for patterning and etching to define body, upper S/D regions, and lower S/D regions.

Figure 24E:
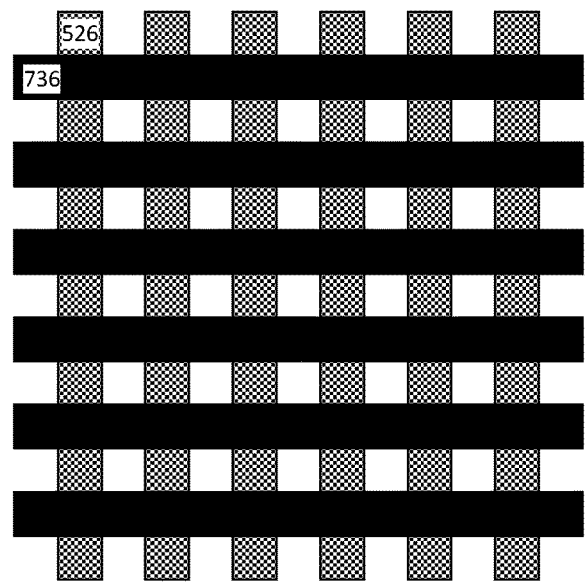

Using the lines 736 as a mask, the layer stack is etched as shown in FIG. 24e. In this example, an etch process selective for the silicon layers and oxides can be used. In this manner, etching removes the exposed portions of the layer stack columns 760 as well as exposed portions of the gap fill dielectric.

Figure 24F:
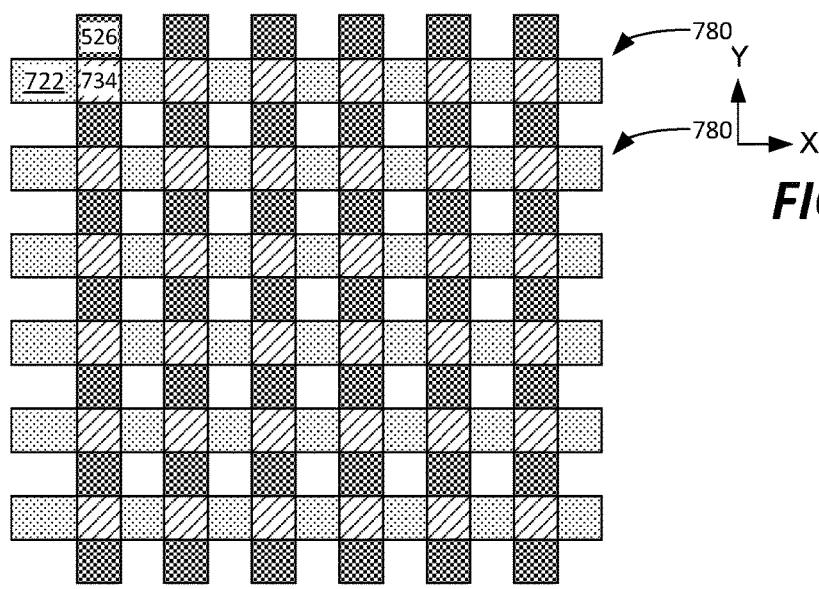
Figure 24G:
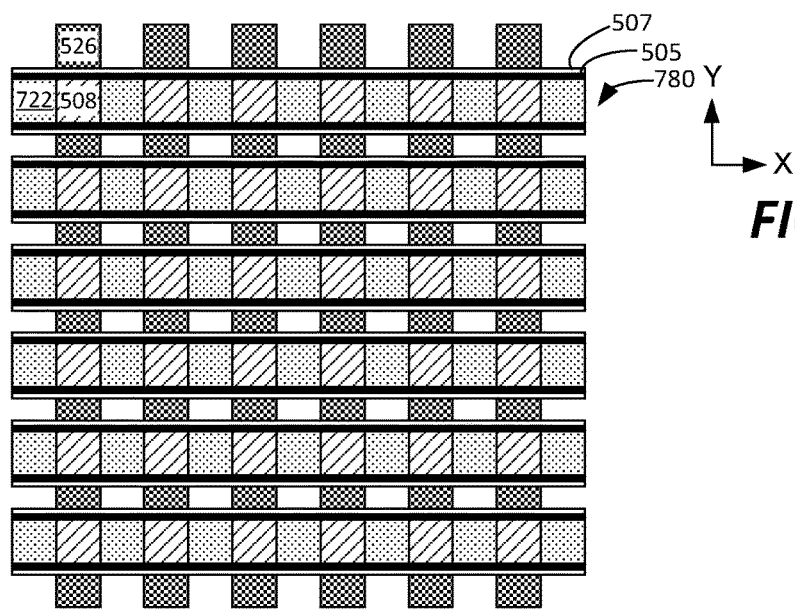

The pattern is removed as shown in FIG. 24f. Etching the layer stack forms layer stack lines 780 that are elongated in the row direction. Etching defines layer stack lines 780 with individual pillar stacks 734 separated by the gap fill dielectric 722. Each pillar stack includes an upper S/D region 508, body 506, and lower S/D region 504.

The gate dielectric 505 extends continuously in the x-direction along the vertical sidewalls of the layer stack lines. The gates also extend continuously in the x-direction, along the vertical sidewalls of the gate dielectric for isolation from the pillar stacks 734. An additional gap fill dielectric 522 (not shown) can be formed after removing the patterning FIG. 24g depicts the results after forming a gate dielectric 505 and gates 507 along the layer stack lines 780. Gate dielectric 505 extends in the x-direction along the vertical sidewalls of the layer stack lines 780. Gates 507 that are elongated in the x-direction and separated from a corresponding layer stack line by the gate dielectric 505.

Accordingly, there has been described a three-dimensional (3D) non-volatile memory array having a vertically-oriented thin film transistor (TFT) select device and method of fabricating a 3D memory with a vertically-oriented TFT select device. The vertically-oriented TFT, or more simply vertical TFT, may be used as a vertical bit line select device in one embodiment, coupling a global bit line to a local vertical bit line. A method of forming non-volatile storage has been described that includes forming over a plurality of global bit lines that are elongated in a first direction a plurality of layer stack lines that are elongated in a second direction. Each layer stack line of the plurality having two vertical sidewalls and including one or more silicon layers for the body of a plurality of vertical thin film transistor (TFT) select devices. The method includes forming a gate dielectric layer after forming the plurality of layer stack lines. The gate dielectric layer extends along the two vertical sidewalls of each layer stack line. A gate layer is formed after the gate dielectric layer, followed by etching back the gate layer to form a first gate and a second gate for each layer stack line of the plurality. The first gate and the second gate are separated from the corresponding layer stack line by the gate dielectric layer.

A method of forming non-volatile storage has been described that includes forming a first plurality of layer stack lines that are elongated in a first direction over a plurality of global bit lines that are elongated in the first direction. Each layer stack line includes one or more silicon layers extending continuously in the first direction. The method includes forming a gap fill material after forming the first plurality of layer stack lines, and patterning and etching the first plurality of layers stack lines to form a second plurality of layer stack lines that are elongated in a second direction. Each layer stack line of the second plurality has two vertical sidewalls and includes a plurality of select device pillars that are separated in the second direction by the gap fill material. The one or more silicon layers in each select device pillar form the body and source/drain regions for one of a plurality of vertical thin film transistor (TFT) select devices. The method includes forming a gate dielectric layer after forming the second plurality of layer stack lines. The gate dielectric layer extends along the two vertical sidewalls of each layer stack line of the second plurality. The method includes forming a gate layer after forming the gate dielectric layer, and etching back the gate layer to form a first gate and a second gate for each layer stack line of the second plurality. The first gate and the second gate are separated from the corresponding layer stack line by the gate dielectric layer.

A method of forming non-volatile storage has also been described that comprises forming over a plurality of global bit lines that are elongated in a first direction a first plurality of layer stack lines that are elongated in a second direction. Each layer stack line of the first plurality has two vertical sidewalls and includes one or more silicon layers for the body of a plurality of vertical thin film transistor (TFT) select devices. The method includes forming a gate dielectric layer after forming the first plurality of layer stack lines. The gate dielectric layer extends along the two vertical sidewalls of each layer stack line. The method includes forming a gate layer after forming the gate dielectric layer, and etching back the gate layer to form a first gate and a second gate for each layer stack line of the first plurality. The first gate and the second gate are separated from the corresponding layer stack line by the gate dielectric layer. The method includes, after etching back the gate layer, etching the continuous layer stack to form a second plurality of layer stack lines that are elongated in the first direction. Each layer stack line of the second plurality at least partially overlies one of the plurality of global bit lines.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. An apparatus, comprising:
   a plurality of global bit lines elongated in a first direction and separated in a second direction substantially orthogonal to the first direction;
   a plurality of layer stacks lines elongated in the second direction over the plurality of global bit lines, each layer stack line of the plurality having two vertical sidewalls and including a plurality of silicon layers for a plurality of vertical thin film transistor (TFT) select devices;
   a gate dielectric layer extending vertically along the two vertical sidewalls of each layer stack line and over the plurality of global bit lines continuously in the first direction from one vertical sidewall of each layer stack line to an adjacent vertical sidewall of an adjacent layer stack line, wherein the gate dielectric layer includes horizontal portions extending in the first direction over the plurality of global bit lines between adjacent layer stack lines in the first direction and vertical portions extending along the vertical sidewalls of each layer stack line;
   a first gate and a second gate elongated in the second direction between adjacent layer stack lines of the plurality, the first gate and the second gate are separated from corresponding layer stack lines by the gate dielectric layer; and a plurality of dielectric bases elongated in the second direction, wherein each dielectric base extends vertically between a lower surface of the first and second gates and an upper surface of the horizontal portions of the gate dielectric layer.

2. The apparatus of claim 1, further comprising:
a dielectric fill material extending horizontally between the first gate adjacent to a first layer stack line and the second gate adjacent to a second layer stack line.

3. The apparatus of claim 2, wherein:
the plurality of dielectric bases extend between adjacent layer stack lines in the first direction.

4. The apparatus of claim 3, wherein:
the gate dielectric layer extends over the plurality of dielectric bases.

5. The apparatus of claim 3, wherein:
each dielectric base extends over the gate dielectric layer between adjacent layer stack lines in the first direction.

6. The apparatus of claim 5, wherein:
the dielectric bases extend over the horizontal portions of the gate dielectric layer and between the vertical portions of the gate dielectric layer.

7. The apparatus of claim 6, further comprising:
a plurality of word line layers overlying the dielectric fill material;
a plurality of insulating layers overlying the dielectric fill material, each word line layer is separated from an adjacent word line layer by one of the insulating layers;
at least one rewritable memory layer formed along a first and second vertical sidewall of the plurality of word line layers and the plurality of insulating layers; and
a vertical bit line adjacent to the at least one rewritable memory layer; and
wherein the at least one rewritable memory layer forms a plurality of non-volatile storage elements at an intersection of the vertical bit line and one of the word line layers.

8. The apparatus of claim 7, wherein:
the plurality of non-volatile storage elements is a monolithic three-dimensional array of memory cells positioned above a substrate; and
the plurality of vertical TFT select devices are coupled between a plurality of vertical bit lines and the plurality of global bit lines.

9. An apparatus, comprising:
a first global bit line and a second global bit line elongated in a first direction and separated in a second direction substantially orthogonal to the first direction;
a first vertical thin film transistor (TFT) select device and a second vertical thin film transistor (TFT) select device overlying the first global bit line;
a gate dielectric layer extending vertically along two vertical sidewalls of each layer stack line and horizontally over the first global bit line, wherein the gate dielectric layer includes horizontal portions extending in the first direction over the global bit lines between adjacent layer stack lines in the first direction and vertical portions extending along the vertical sidewalls of each layer stack line;
a dielectric base elongated in the second direction over the first global bit line and the second global bit line and extending in the first direction between the first TFT select device and the second TFT select device; and a first gate separated from the first TFT select device by the gate dielectric layer; and
a second gate separate from the second TFT select device by the gate dielectric layer, wherein the dielectric base extends vertically between a lower surface of the first and second gates and an upper surface of the horizontal portions of the gate dielectric layer.

10. The apparatus of claim 9, wherein:
the gate dielectric layer extends over the dielectric base.

11. The apparatus of claim 9, wherein:
the dielectric base extends over the gate dielectric layer.

12. The apparatus of claim 11, wherein:
the gate dielectric layer includes a horizontal portion extending in the first direction over the first global bit line between the first TFT select device and the second TFT select device;
the gate dielectric layer includes vertical portions extending along the vertical sidewalls of the first TFT select device and the second TFT select device; and
the dielectric base extends over the horizontal portion of the gate dielectric layer and between the vertical portions of the gate dielectric layer.

13. The apparatus of claim 12, wherein:
the horizontal portion of the gate dielectric layer extends continuously in the first direction from one vertical sidewall of the first TFT select device to one vertical sidewall of the second TFT select device.

14. An apparatus, comprising:
a first vertical thin film transistor (TFT) select device and a second vertical thin film transistor (TFT) select device overlying a global bit line, the global bit line extending in a first horizontal direction and separated from a second global bit line in a second direction substantially orthogonal to the first horizontal direction;
a gate dielectric layer extending vertically along two vertical sidewalls of the first TFT select device and two vertical sidewalls of the second TFT select device, the gate dielectric layer extending continuously in the first direction from a first vertical sidewall of the first TFT select device to a second vertical sidewall of the second TFT select device;
a first gate separated from the first TFT select device by the gate dielectric layer;
a second gate separated from the second TFT select device by the gate dielectric layer;
a dielectric fill material insulating the first gate from the second gate in the first directions; and
a dielectric base elongated in the second direction over the first global bit line and the second global bit line and extending in the first direction between the first TFT select device and the second TFT select device, wherein the dielectric base extends vertically between the first gate and the gate dielectric layer and vertically between the second gate and the gate dielectric layer.

15. The apparatus of claim 14, wherein:
the gate dielectric layer extends over the dielectric base.

16. The apparatus of claim 14, wherein:
the dielectric base extends over the gate dielectric layer.

17. The apparatus of claim 16, wherein:
the gate dielectric layer includes a horizontal portion extending in the first direction over the first global bit line between the first TFT select device and the second TFT select device;
the gate dielectric layer includes vertical portions extending along the vertical sidewalls of the first TFT select device and the second TFT select device; and the dielectric base extends over the horizontal portion of the gate dielectric layer and between the vertical portions of the gate dielectric layer.

\* \* \* \* \*

UNITED STATES PATENT AND TRADEMARK OFFICE
CERTIFICATE OF CORRECTION

PATENT NO. : 9,853,090 B2
APPLICATION NO. : 15/379991
DATED : December 26, 2017
INVENTOR(S) : Konevecki et al.

Page 1 of 1

It is certified that error appears in the above-identified patent and that said Letters Patent is hereby corrected as shown below:

Column 24, Line 49, (Claim 1, Line 5): After "layer" and before "lines" delete "stacks" and replace with -- stack --.

Column 26, Line 48, (Claim 14, Line 21): After "first" and before "and" delete "directions," and replace with -- direction; --.

Signed and Sealed this
Fifteenth Day of May, 2018

Andrei Iancu
*Director of the United States Patent and Trademark Office*